United States Patent
Shiraishi

[11] Patent Number: 5,801,390
[45] Date of Patent: Sep. 1, 1998

[54] POSITION-DETECTION METHOD AND APPARATUS WITH A GRATING MARK

[75] Inventor: Naomasa Shiraishi, Urawa, Japan

[73] Assignee: Nikon Corporation, Tokyo, Japan

[21] Appl. No.: 797,632

[22] Filed: Feb. 7, 1997

[30] Foreign Application Priority Data

| Feb. 9, 1996 | [JP] | Japan | 8-048116 |
| Feb. 19, 1996 | [JP] | Japan | 8-055458 |
| Feb. 21, 1996 | [JP] | Japan | 8-058487 |
| Mar. 7, 1996 | [JP] | Japan | 8-079565 |

[51] Int. Cl.$^6$ ............................................. G01N 21/86
[52] U.S. Cl. ..................... 250/559.3; 250/237 G; 356/375
[58] Field of Search ................... 250/559.3, 559.29, 250/548, 237 G; 356/399–401, 375; 355/53, 55

[56] References Cited

U.S. PATENT DOCUMENTS

| 5,004,348 | 4/1991 | Magome | 250/548 |
| 5,488,230 | 1/1996 | Mizutani et al. | 250/548 |

*Primary Examiner*—Que Le
*Attorney, Agent, or Firm*—Klarquist Sparkman Campbell Leigh & Whinston, LLP

[57] ABSTRACT

Methods and apparatus are disclosed for performing detection of the position of a substrate, such as used in photolithography, with high precision by zero Nth-order detection. Alignment marks (grating marks) on the substrate are illuminated by coherent light beams comprising multiple wavelength components. Reflected light forms diffraction patterns that are detected by appropriate detectors. At least one level-difference detection circuit and at least one detected-position-correction circuit are provided, the former detecting grating-mark positions grating mark positions $\Delta X_n'$ at respective wavelengths from light-quantity signals produced from the detectors, and the latter calculating relative level differences $\delta_n$ for the respective wavelengths at each grating mark, based on changes in the light-quantity signals accompanying relative scanning and based on design data for the grating marks. The apparatus also comprises a third circuit that calculates "final" positions of the grating marks by applying a factor corresponding to a situation resulting in the least amount of positional error to the positional determination as would otherwise be affected by asymmetry or resist-thickness variations of the grating mark.

57 Claims, 16 Drawing Sheets

POSITION-DETECTION METHOD AND APPARATUS WITH A GRATING MARK

FIELD OF THE INVENTION

The present invention relates to methods and apparatus for performing relative positioning between a mask (reticle) pattern and a photosensitive substrate. Such methods and apparatus are typically applied in exposure apparatus used in a photolithography process for exposing the mask pattern onto the photosensitive substrate as used in manufacturing, e.g., semiconductor devices. More particularly, the invention relates to methods and apparatus for detecting a mark pattern on the photosensitive substrate.

BACKGROUND OF THE INVENTION

In photolithographic processes for manufacturing, e.g., semiconductor devices, liquid crystal display devices, or thin-film magnetic heads, an exposure apparatus is used to transfer an image of a photomask or reticle (referred to herein simply as a reticle), having a transfer pattern, onto a photoresist-coated wafer (or other photosensitive substrate such as a glass plate) in accordance with a projection-exposure method using a projection optical system or a proximity-exposure method.

In this exposure apparatus, positioning (alignment) between a reticle and a wafer must be performed with high precision prior to exposure. A position-detection mark (alignment mark) obtained by exposure, transfer, and etching in a previous process step is formed on the wafer. The accurate position of the wafer (i.e., of a circuit pattern or the like on the wafer) can be detected by detecting the position of this alignment mark.

In recent years, a method has been proposed of forming a one-dimensional or two-dimensional grating mark on a wafer (or a reticle), projecting two coherent light beams symmetrically inclined in the pitch direction on the grating mark, and causing two diffracted light components generated from the grating mark in the same direction to interfere with each other to detect the position and offset of the grating mark in the pitch direction, as disclosed in Japanese patent application laid-open nos. 61-208220 (corresponding to U.S. Pat. No. 4,828,392; referred to herein as "reference (A)"), 61-215905 (corresponding to U.S. Pat. No. 4,710,026; referred to herein as "reference (B)"), and the like. This method is referred to herein as an "interference-type alignment method." Reference (A) discloses a homodyne scheme in which two symmetrical coherent beams have the same frequency, while reference (B) discloses a heterodyne scheme in which a predetermined frequency difference is present between two symmetrical coherent beams.

Heterodyne schemes in which position-detection devices of these schemes are applied to a TTR (through-the-reticle) alignment system and a TTL (through-the-lens) alignment scheme are proposed in Japanese patent application laid-open nos. 2-227602 (corresponding to U.S. patent application Ser. No. 07/483,820 filed on Feb. 23, 1990; referred to herein as "reference (C)"), 3-2504 (corresponding to U.S. Pat. No. 5,118,953; referred to herein as "reference (D)") and the like. In the heterodyne schemes disclosed in references (C) and (D), an He—Ne laser beam is simultaneously incident on two acousto-optic modulators (AOMs), and the AOMs are driven by high-frequency drive signals (one drive signal at 80 MHz and the other drive signal at 79.975 MHz) having a frequency difference of, e.g., about 25 kHz, thereby imparting the frequency difference of 25 kHz to diffracted beams emerging from these AOMs. These two diffracted beams serve as a pair of incident beams for irradiating a grating mark on a wafer or reticle at a predetermined crossing angle.

In the heterodyne scheme, the frequency difference (25 kHz) between the two incident beams is given as a reference AC signal, a phase difference between the reference AC signal and a signal obtained by photoelectrically detecting an interference light beam (beat light beam) of two diffracted light components generated from the grating mark is measured, and this phase difference is detected as a position offset (positional deviation) amount from the reference point in the pitch direction of the grating mark.

There are three main types of optical systems that implement the interference alignment method. The types are broadly classified on the basis of the method by which the coherent beam (laser beam) is made incident upon the grating mark.

The first type detects the position of the grating mark by the incidence of two laser beams from symmetrical ±Nth-order directions in relation to the period (P) direction of the grating mark. The beams form an interference fringe pattern on the grating mark with an amplitude period of P/N. Diffracted light (combined ±Nth-order diffracted light beams from the two incident light beams, where N is a natural number) reflected vertically upward is received; detection of the grating-mark position is based on variations in light quantity. A method employing the first type is referred to herein as the "±Nth-order detection method."

The second type detects the position of the grating mark by symmetrical incidence of two beams from ±N/2-order directions in relation to the grating-mark period. The beams form an interference pattern on the grating mark with an amplitude period of 2P/N. A light beam representing a combination of the zero-order diffracted light (regular reflected light) from the first incident light beam and the Nth-order diffracted light from the second incident light beam is independently received, and a light beam representing a combination of the zero-order diffracted light from the second incident light beam and the Nth-order diffracted light from the first incident light beam is independently received. The average value of the two detected positions obtained from the respective phases of light-quantity variation of the two light beams is established as the grating mark position. A method employing the second type is referred to herein as the "zero-Nth-order detection method."

The third type detects the position of the grating mark by incidence of a single light beam onto the grating mark. The two resulting reflected and diffracted ±Nth-order diffracted light beams are imaged on the reference grating; the position of the grating mark is detected by variations in light quantity passing through the reference grating. A method employing the third type is referred to herein as the "reference-grating method."

In principle, the three methods summarized above result can detect a position of the grating mark with equal accuracy. The ±Nth-order detection method and the zero-Nth-order detection method, however, can be adapted for either the heterodyne or the homodyne method, while the reference-grating method relies on a single incident light beam, and thus inevitably is limited to the homodyne method.

The interference-type alignment methods described above generally employ lasers or other monochromatic light. However, the monochromaticity of the light, i.e., the degree to which the light has long coherence length, can cause substantial position-detection errors. Such errors depend upon asymmetries in the cross-sectional profile of the grating mark (i.e., the alignment-detection mark) in the thickness dimension of the wafer, and on variations in resist thickness on the wafer.

An interference-type alignment method enabling more accurate position detection by reducing these effects is disclosed in Japanese patent application laid-open no. 6-82215 (corresponding to U.S. patent application Ser. No. 08/091,501, filed on Jul. 14, 1993). In that reference, a method is disclosed employing multiple light beams of different wavelengths, or alternatively a light beam comprising multiple wavelengths, to irradiate a fixed diffraction grating and thereby yield two diffraction beams. The diffraction beams are incident upon a first AOM. The zero-order diffraction beam, the +1 order diffraction beam, and the −1 order diffraction beam are relayed so as to cross inside a second AOM. This creates, for example, a pair of transport light beams of the first wavelength and a pair of transport light beams of the second wavelength. Both pairs of light beams are simultaneously projected onto the grating mark on the wafer. The photoelectrically detected interference beat light generated from the grating mark includes a first wavelength component and a second wavelength component. These wavelength components are added as quantities of light on the light-receiving surface of a photoelectric cell and thus photoelectrically detected. The mutual phase differences in the interference beat light from the respective wavelength components due to the effects of thin-film interference in the resist layer and due to the effects of asymmetry in the cross-sectional profile of the grating mark are forcibly averaged out. This makes it reportedly possible to perform more accurate position detection.

Unfortunately, the diffraction light from the grating mark will be intensified in that wavelength component whenever (1) an illumination light beam used for position detection is constituted as a beam having multiple wavelengths or a prescribed wavelength band, (2) the interference light containing multiple wavelength components is received simultaneously on the same photoelectric cell, as in the prior art summarized above, and (3) the illumination light beam includes a particular wavelength component with unusually high intensity relative to other wavelength components. If (1) the diffraction light is received separately for each wavelength, (2) a separate position is detected for each wavelength, and (3) an "average" detected position is calculated from the multiple separate positions, ascertaining definite differences among the detected positions corresponding to individual wavelengths is impossible. Thus, because certain wavelengths can yield sizable detection errors, determining an "average" position in such a way can result in a degraded precision of position-detection.

In general, each alignment mark formed on the surface of a wafer has slight differences in elevational profile along the length of the mark. Also, because of imperfections in etching, sputtering, and other wafer-processing stages of semiconductor processing, and because of unevenness in application of the photoresist layer, alignment marks normally have a certain amount of asymmetry. This asymmetry reduces the precision of mark-position detection.

Particularly in the case of the interference-type alignment method, which photoelectrically detects the interference light generated from two diffraction light beams generated by the grating mark and uses that photoelectric signal for position detection, asymmetry in the grating mark leads to asymmetry in the amplitude-reflection ratio for the mark itself. This causes a degradation in the precision of position detection. In other words, differences in depth profile of the linear grooves constituting a grating mark in the grating-period direction, as well as differences in the thickness of the resist layer from one area of the mark to another, cause asymmetry in the absolute value and phase of the amplitude-reflection ratio of the mark itself in proportion to the variation in groove depth and resist thickness. This results in differences in intensity and phase of the diffraction light generated from the grating mark as well, between the positive-order beams, generated to the right of, e.g., zero-order light, and the negative-order beams generated to the left. Differences in intensity do not reduce position-detection precision, but phase variations have a significant effect on the precision of position detection.

Moreover, the amplitude-reflectance and the diffraction efficiency for a grating mark can vary greatly depending on depth-profile variances of the mark and the thickness of the resist. This is because phase difference varies between the light reflected on the upper and lower surfaces of the mark in relation to depth-profile variances of the mark, and because a multiplexed interference effect created by the resist fluctuates in relation to variations in resist thickness. What is especially problematic is that, when the wavelength of the detected light changes, these effects fluctuate dramatically. In other words, when the wavelength is different, the effects of level differences (depth-profile variances) in the mark provide different position-detection errors, even when determining the position of the same mark.

With respect to a method in which interference light beams including multiple wavelength components are received simultaneously by a single photoelectric cell, or a method in which diffraction light beams are received and detected separately for each wavelength followed by establishing the detected position as a simple average position, neither method takes into account the extent to which the proper detection wavelength is being used. As a result, with either method, being able to correctly determine position is sometimes elusive.

As suggested above, with many conventional exposure apparatus, alignment marks for each die on the wafer are produced in a previous exposure during which the pattern for the previous layer was exposed at each shot. Thus, at the time for exposing the subsequent pattern-layer, alignment marks are already in place at each die for making proper alignment of the reticle with the die before making the next shot. Unfortunately, the time required for detecting such marks before each shot on the wafer is considerable and can substantially reduce the throughput of the exposure apparatus.

To increase throughput, certain modern steppers employ an alignment scheme termed "Enhanced Global Alignment" (EGA), as disclosed, e.g., in Japanese patent application laid-open no. 61-44429 (corresponding to U.S. Pat. No. 4,780,617). In EGA, an array coordinate system of many (e.g., about ten) separate alignment marks is established on the wafer for all the shots of a particular pattern-layer. All the alignment marks are used to establish the position of each shot, and proper shot alignment is determined by statistically processing data from all the alignment marks. I.e., the stepper performs all the shots based on the statistically processed data from the array coordinate system.

The EGA method represents an attempt to average and thus reduce position-detection errors arising from differences in intensity and phase of diffraction light caused by variances in the depth profile and symmetry of alignment marks and differences in resist thickness, as discussed above. Nevertheless, the averaging employed in the conventional EGA method was not intended to address the magnitude of errors that can arise in detected positions of individual alignment marks. Conventional position-detection sensors lack the capacity to infer the magnitude of detection error. Consequently, the averaging effect under the EGA method has inherent limitations.

SUMMARY OF THE INVENTION

According to one aspect of this invention, a position-detection method is provided for detecting the position of the period direction of a grating mark in the form of a fine pattern of convexities and concavities on a substrate and with a period P in a particular direction. Multiple coherent light beams in multiple groups with different wavelengths are incident upon the grating mark such that interference patterns having an amplitude-distribution period of 2P/N (where N is a natural number) are formed in the same period direction as the grating mark. The interference patterns are scanned, as well as the grating mark, relative to the period direction. Among reflection and diffraction light from the incident light beam produced by the grating mark, a first combined light beam is produced comprising a combination of the first light beam's positive reflection light and the second light beam's Nth-order diffraction light, and a second combined light beam is produced comprising a combination of the said second light beam's positive reflection light and said first light beam's Nth-order diffraction light. The first and second combined light beams are received separately for each of the multiple wavelengths. The position of the grating mark is detected for each wavelength based on changes accompanying a relative scanning of light-quantity signals for the first and second combined light beams at the respective wavelengths. Relative level differences on the grating mark are calculated for each respective wavelength as the result of dividing the grating-mark level difference by half of the respective wavelengths in the incident light beam in a medium (e.g., resist) proximate to the surface of the grating mark, based on changes accompanying the relative scanning of the light-quantity signals of the first and second combined light beams for each respective wavelength, and based on design data for the grating mark (e.g., width of concavities and convexities). The grating-mark positions as detected for each wavelength are weighted greater as the relative level differences calculated for each wavelength approach the equivalent of ¼ of each wavelength of the incident light beam proximal to the surface of the grating mark. The positions are thus weight-averaged, and the weighted-average values represent the final detected position of the grating marks.

The method summarized above employs a detection scheme having some similarities to an interference-type alignment method according to the "zero-Nth-order detection method". The method also includes the step of calculating the relative level differences for the grating mark for each wavelength as the result of dividing the level difference in the grating mark by half of each wavelength in the incident light beam in a medium proximate to the surface of the grating mark. Such a step detects as the relative level difference for each wavelength the result of dividing the level difference by half the mid-resist wavelength which dramatically affects detection precision. It is acceptable to detect the relative level difference in the form of either a level difference or a corresponding light phase magnitude. Consequently, it is possible to readily determine whether the level difference of the grating mark subject to position detection conforms to the condition of the detected light for each respective wavelength being $(2m+1)/4$ times the mid-resist wavelength, or, to the condition of the mid-resist wavelength being $4/(2m+1)$ times the level difference of the grating mark subject to position detection.

The grating-mark positions detected for each respective wavelength are weighted greater as the relative level differences calculated for each respective wavelength approach the equivalent of one-fourth of each wavelength of the incident light beam proximal to the surface of the grating mark. Thus, the positions are weight-averaged, and the weighted average value is the final detected position of the grating mark. Hence, detected positions at wavelengths with calculated level differences close to one-fourth of the (mid-resist) wavelength are weighted more, and detected positions "distant" from one-fourth of the wavelength are weighted less. The weight-averaged position of these detected positions is the final detected position of the grating mark. Here, one-fourth of each wavelength refers to the factor $(2m+1)/4$ when $m=0$. Since the relative level difference is the remainder of the half wavelength, there is no need to consider cases for $m>0$.

The relative level difference close to the one-fourth equivalent of respective wavelengths proximal to the grating-mark surface for the incident light beam means that the relative level difference is close to a multiple of $(2m+1)/4$ times the respective wavelength proximal to the grating-mark surface for the incident light beam. Consequently, the final detection position of the grating mark is the weighted average value of the detection results with detection light having wavelengths closest to $4/(2m+1)$ times the level difference. Compared to a simple average of detected positions of the mark for each wavelength, considerable high-precision position detection is possible even for asymmetrical position detection marks, and the averaging effect can be maximized.

Multiple pairs of coherent light beams with different wavelengths can be incident in time-division sequence upon the grating mark, forming for each wavelength an interference pattern in which the period direction at an amplitude distribution of 2P/N (where N is a natural number) is equal to the grating mark's period direction. When multiple pairs of coherent light beams with different wavelengths are incident in time-division sequence in this manner, the light-receiving detector or the like for reflected and diffracted light, and the signal-processing-system configuration are simplified relative to the prior art.

It is desirable to perform position detection of the grating mark at each wavelength by averaging the detected positions obtained for each, based on the various phases of light-quantity signal fluctuation in the first and second combined light beams accompanying the relative scanning.

The calculation of relative level difference can be performed based on the ratio of the respective widths between the concavities and convexities on the grating mark, and on the phase differences and contrast variations in the respective light-quantity signals for the first and second combined light beams accompanying relative scanning. If the light quantity ratio of the zero-order diffraction light and Nth-order diffraction light reflected and diffracted from the grating mark is measured for each wavelength of the incident light beam, the calculation of relative level difference can be performed, based on the ratio of the respective widths between the concavities and convexities on the grating mark, on the phase differences of variations in the respective light quantity signals for the first and second combined light beams accompanying relative scanning, and on the calculated light quantity ratio. Since the light-quantity ratio of the zero-order diffraction light and the Nth-order diffraction light is measured directly, it is possible to calculate the relative level difference with even greater precision than when the light quantity ratio is calculated based on the contrast.

According to another aspect of the invention, a position-detection apparatus is provided for detecting the position of said period direction of a grating mark on which occurs a repeating pattern of concavities and convexities with period P in a specific direction forming a fine pattern on a substrate. The apparatus comprises a transport-light optical system for causing pairs of coherent light beams in multiple groups to form an interference pattern on the grating mark in which the period direction (with an amplitude distribution period of 2P/N, where N is a natural number) is equal to the period direction on the grating mark. The apparatus also comprises a light-receiving system for separately photoelectrically converting, for each of the multiple wavelengths and among reflection and diffraction light from the incident light beam of the grating mark, a first combined light beam comprising a combination of the first light beam's positive reflection light and the second light beam's Nth-order diffraction light, and a second combined light beam comprising a combination of said second light beam's positive reflection light and said first light beam's Nth-order diffraction light. The apparatus also comprises a relative-scanning system for performing relative scanning, in the period direction, of the grating mark and the interference pattern. The apparatus also comprises a position-detection system for detecting the position of the grating mark for each respective wavelength based on changes accompanying the relative scanning of the light-quantity signals from the first and second combined light beams of each respective wavelength obtained from the light-receiving system. The apparatus also comprises a level-difference-detection system for calculating level differences on the grating mark for each respective wavelength as the result of dividing the grating-mark level difference by half of the respective wavelengths in the incident-light beam in a medium proximal to the surface of the grating mark. The calculation is based on changes accompanying the relative scanning of the light-quantity signals of the first and second combined light beams at each respective wavelength obtained from the light-receiving system. The calculation is also based on design data for the grating mark. The apparatus also comprises a calculation system for arithmetically weighting the grating-mark positions detected for each said wavelength greater as the relative level differences calculated for each wavelength approach the equivalent of one-fourth of each wavelength of the incident light beam proximal to the surface of the grating mark and are thus weight-averaged. The weight-average value is the final detected position of the grating mark.

Consequently, with the foregoing embodiment, the final detected position of the grating mark is the weighted-average value, which is the weighted detection results of detection light with wavelengths closest to 4/(2m+1) times the level difference. Compared to a simple average of detected positions of the mark for each wavelength, considerable high-precision position detection is possible even for asymmetrical grating marks, and the averaging effect can be maximized.

Since the light-quantity ratio of the zero-order diffraction light to the Nth-order diffraction light is calculated directly, it is possible to calculate the relative level difference with even greater precision than when the light quantity ratio is calculated based on contrast.

The relative-scanning system may comprise a stage in which the substrate can be scanned in the period direction of the grating mark. The relative-scanning system can alternatively comprise a pair of multiple coherent light beams with different wavelengths, wherein the frequency of the first light beam and the frequency of the second light beam are varied slightly. The interference patterns formed by such light sources are moved across the grating mark at the same velocity in the period direction.

According to another aspect of the invention, methods and apparatus are provided that share many similarities with the combinations of features described above, except that the grating mark position is determined by a virtual detection wavelength in which the relative level difference is represented by $(2m+1)/4$ (where m is an integer of 0 or greater) of the respective wavelengths from the incident light beam in a medium proximal to the surface of the grating mark, based on the relationship between the position of the grating mark detected for each respective wavelength and the relative level difference calculated for each respective wavelength. The grating-mark position is treated as the final detection position of said grating mark. Thus, this method employ zero-Nth-order detection.

In the foregoing process, the relative level differences for the grating mark are calculated for each wavelength as the result of dividing the level difference in the grating mark by half of each wavelength in the incident light beam in a medium proximal to the surface of the grating mark. Consequently, it is possible to detect whether the mark subject to position detection conforms to the condition that the detected light beam have a wavelength $(2m+1)/4$ times the mid-resist wavelength. It is also possible to determine how far the mark deviates from this value, including the sign.

The detected position of grating mark is found at a virtual detection wavelength, based on a relationship between the grating-mark positions detected for each wavelength and the calculated relative level differences for each wavelength. This detection position is construed as the final detection position for the grating mark. Accordingly, it is possible to obtain the virtual detection position for a grating mark with any level difference by detecting via the mid-resist detection wavelength, which is $4/(2m+1)$ times that level difference. This makes it possible to perform very high-precision position detection even for asymmetrical position detection marks.

Again, multiple pairs of coherent light beams with different wavelengths may be incident in time-division sequence upon the grating mark, forming for each wavelength an interference pattern in which the period direction at an amplitude distribution of 2P/N (where N is a natural number) is equal to the grating mark's period direction. Scanning is performed relative to the period direction of the interference pattern for each wavelength and the grating mark. When multiple pairs of coherent light beams with different wavelengths are incident in time-division sequence in this manner, the light-receiving system for reflected and diffracted light and the signal processing system configuration are simplified.

It is desirable to perform position detection of the grating mark at each wavelength by averaging the detected positions obtained for each, based on the various phases of light-quantity signal fluctuation in the first and second combined light beams accompanying the relative scanning.

The determination of the final detected position of the grating mark at the virtual detection wavelength preferably includes as parameters the position of the grating mark detected for each wavelength and the relative level difference calculated for each wavelength. The method makes use of an approximation equation that contains two unknowns, a parameter determined by the degree of asymmetry of the grating mark and the final detection position.

If the grating-mark position detection and relative level difference calculation are performed with detection light beams having at least two wavelengths, these values can be substituted in the approximation equations corresponding to each wavelength. By treating these approximation equations as simultaneous equations, the final detection position can be readily calculated.

The foregoing method can be manifest as an apparatus for detecting the position in the period direction of a grating mark on which occurs a repeating pattern of concavities and convexities with period P in a specific direction forming a fine pattern on a substrate. The apparatus comprises a transport-light optical system, a light-receiving system, a relative-scanning system, a position-detection system, and a level-difference detection system as summarized above. The apparatus also comprises a calculation system for calculating a virtual detection position at virtual wavelengths where the relative level difference is represented by (2m+1)/4 (where m is an integer of 0 or greater) of the relative wavelength, from the relationship between the position of the grating mark detected for each of the respective wavelengths and the relative level difference calculated for each respective wavelength.

The relative-scanning system can comprise a stage in which the substrate can be scanned in the period direction of the grating mark. Alternatively, the relative-scanning system can comprise a system in which, of each pair of multiple coherent light beams with the different wavelengths, the frequency of the first light beam and the frequency of the second light beam are varied slightly, and in which the interference patterns formed thereby are moved across the grating mark at the same velocity in the period direction. In the latter instance, detection is possible even when the substrate is stopped during detection.

According to another aspect of the invention, a method is provided for detecting the position of a substrate in the period direction of a grating mark forming a fine pattern on the substrate, wherein the grating mark comprises repeated concavities and convexities having period P in a particular direction. In a first step, a pair of coherent light beams in multiple groups with different wavelengths is incident upon the grating mark such that interference patterns with an amplitude distribution period of 2P/N (where N is a natural number) are formed in the same period direction as the grating mark. The interference pattern and the grating mark are scanned relative to the period direction. In a second step, among reflected and diffraction light from the grating mark, a first combined light beam comprising a combination of the first light beam's positive reflection light and the second light beam's Nth-order diffraction light, and a second combined light beam comprising a combination of the second light beam's positive reflection light and said first light beam's Nth-order diffraction light, are received separately for each of the multiple wavelengths. In a third step, relative level differences on the grating mark are calculated for each respective wavelength; the calculation is performed by dividing the grating-mark level difference by half the respective wavelengths in the incident light beam in a medium proximate to the surface of said grating mark, based on changes accompanying the relative scanning of the light quantity signals of the first and second combined light beams for each respective wavelength, and based on design data for the grating mark (e.g., widths of concavities and convexities). In a fourth step, a calculated relative level difference is obtained, including the selection of the wavelength closest to one-fourth of each wavelength proximal to the surface of the grating mark of the incident light beam. In a fifth step, the position of the grating mark is determined, based on the light-quantity signal changes in the first and second combined light beams accompanying the relative scanning for at least the wavelengths selected in the fourth process. Thus, the method embodies certain aspects of a zero-Nth-order detection method.

In the fourth step, the selection of the wavelength closest to ¼ of each wavelength proximal to the surface of the grating mark of the incident light beam refers to a factor of ¼ for the (2m+1)/4 when m=0. Since the relative level difference is the remainder of the half wavelength, there is no need to consider cases for m>0. Consequently, the final detection position of the grating mark, as determined in the fifth step, is a detection result with detection light having a wavelength closest to the level difference multiplied by a factor of 4/(2m+1). Since considerable high-precision position detection is possible for asymmetrical position detection marks, the benefit of multiple wavelengths can be maximized.

The fifth step can precede the fourth step by being performed on the basis of position-detection results of the grating mark detected for each respective wavelength, and based on the light-quantity signal changes in the first and second combined light beams accompanying the relative scanning.

In the first step, multiple pairs of coherent light beams with different wavelengths may be incident in time-division sequence upon the grating mark, forming for each wavelength an interference pattern in which the period direction at an amplitude distribution of 2P/N (where N is a natural number) is equal to the grating mark's period direction, the pattern scanning relative to the period direction of the interference pattern for each wavelength and the grating mark. When multiple pairs of coherent light beams with different wavelengths are incident in time-division sequence in this manner, the light-receiving system for reflected and diffracted light and the signal processing system configuration are simplified.

It is desirable to perform position detection of the grating mark by averaging the detected positions obtained for each, based on the various phases of light-quantity signal fluctuation in the first and second combined light beams accompanying the relative scanning.

In the fourth step, the calculation of relative level difference can be performed, based on the ratio of the respective widths between the concavities and convexities on the grating mark, and on the phase differences and contrast of variations in the respective light quantity signals for the first and second combined light beams accompanying relative scanning. Alternatively, if the light-quantity ratio of the zero-order diffraction light and Nth-order diffraction light reflected and diffracted from the grating mark is measured for each wavelength of the incident light beam, the calculation of relative level difference can be performed, based on the ratio of the respective widths between the concavities and convexities on the grating mark, on the phase differences of variations in the respective light quantity signals for the first and second combined light beams accompanying relative scanning, and on the calculated light-quantity ratio. In such an instance, since the light-quantity ratio of the zero-order diffraction light and the Nth-order diffraction light are measured directly, it is possible to calculate the relative level difference with even greater precision than when the light quantity ratio is calculated based on the contrast.

The foregoing method can be manifest in an apparatus according to the invention for detecting the position of the period direction of a grating mark on which occurs a repeating pattern of concavities and convexities having periodicity P in a specific direction forming a fine pattern on a substrate. The apparatus comprises a transport-light optical system, a relative-scanning system, a light-receiving system, and a level-difference detection system as summarized above. The apparatus also comprises a position-detection system.

The position-detection system is operable to detect the position of the grating mark, based on the light-quantity signal changes in the first and second combined light beams accompanying the relative scanning at the detection wavelengths closest to relative ¼ wavelengths proximal to the surface of the grating mark of the incident light beam for each wavelength.

Thus, a grating mark position is detected by the detection light beam having a wavelength closest to 4/(2m+1) times the mark level difference of the (mid-resist) wavelength. Therefore, it is possible to perform very high-precision position detection even with asymmetrical position detection marks.

The position-detection system may be arranged to detect the grating mark position as the average value of the respective detected positions found for respective phases of changes in the respective light quantity signals from the first and second combined light beams accompanying relative scanning.

The level-difference detection system may be arranged to calculate the relative level difference based on the ratio of the respective widths of the concavities and convexities on the grating mark and on the phase differences and contrast of changes in the respective light quantity signals for the first and second combined light beams accompanying relative scanning. If a further light-quantity-ratio calculation system is present for calculating the light quantity ratio of the zero- and Nth-order diffraction light reflected and diffracted from the grating mark for each wavelength of the incident light beam, the level-difference detection system may be arranged to calculate the relative level difference based on the ratio of the respective widths of the concavities and convexities on the grating mark, on the phase differences of changes in the respective light quantity signals for the first and second combined light beams accompanying relative scanning, and on the light quantity ratio obtained from the light-quantity-ratio calculation system. In the latter instance, since the light-quantity ratio of the zero-order diffraction light to the Nth-order diffraction light is calculated directly, it is possible to calculate the relative level difference with even greater precision than when the light quantity ratio is calculated based on contrast.

According to yet another aspect of the invention, a method is provided for detecting the position of a substrate formed with fine patterns and grating marks used for position detection. Each grating mark comprises repeated concavities and convexities with period P in a particular direction at multiple locations (M locations or more) on the substrate. The positions of the grating marks in the period direction are detected and these detected positions are subjected to statistical processing in order to detect the position of the fine patterns over the entire surface of the substrate. In a first step, a pair of coherent light beams are variously incident upon the grating marks such that interference patterns with an amplitude-distribution period of 2P/N (where N is a natural number) are variously formed in the same period direction as the grating marks. The interference patterns and the grating marks are scanned relative to the period direction. In a second step, among reflected diffraction light from the grating marks, a first combined light beam comprising a combination of the first light beam's positive reflection light and the second light beam's Nth-order diffraction light, and a second combined light beam comprising a combination of the second light beam's positive reflection light and said first light beam's Nth-order diffraction light, are received successively and sequentially and photoelectrically converted. In a third step, the positions of the multiple-location grating marks are sequentially detected, based on changes accompanying the relative scanning of the light-quantity signals of the first and second combined light beams. In a fourth step, relative level differences on the grating marks are successively calculated as the result of dividing grating-mark level differences by half of the respective wavelengths in the incident light beams in the medium proximal to the surface of the grating marks, based on changes accompanying the relative scanning of the light-quantity signals of the first and second combined light beams obtained sequentially at the second step and based on design data for the grating marks. In a fifth step, a large weight is assigned to the detected position of the j'th grating mark ($1 \leq j \leq M$) whenever the relative level difference is close to ¼ of the wavelength of the incident light beam proximal to the surface of the j'th grating mark, and a small weight is assigned to the detected position of the j'th grating mark whenever the relative level difference is distant from ¼ of the wavelength. The detected positions of the grating marks are subjected to statistical processing in order to calculate the positions of the fine patterns over the entire surface of the substrate. Thus, this method (especially the first through third steps as applied at each grating mark) shares certain similarities with the zero-Nth-order detection method.

In the fourth step, the relative level differences of the multiple grating marks are sequentially calculated as the result of dividing a respective grating-mark level difference by half of the wavelength of the incident light beam in the medium proximal to the surface of the grating mark, based on changes accompanying relative scanning of the light-quantity signals from the first and second combined light beams obtained sequentially in the second step. It is also acceptable to detect the relative level difference as a corresponding light-phase magnitude. Consequently, it is possible to readily determine whether the level difference of the grating mark subject to position detection conforms to the condition that the detected light for each respective wavelength be (2m+1)/4 times the mid-resist wavelength, or to the condition that the mid-resist wavelength be 4/(2m+1) times the level difference of the grating mark subject to position detection.

In the fifth step, ¼ of each wavelength refers to the aforesaid (2m+1)/4 when m=0. The relative level difference close to the ¼ equivalent of respective wavelengths proximal to the grating-mark surface for the incident light beam means that the relative level difference is close to a multiple of (2m+1)/4 times the respective wavelength proximal to the grating-mark surface for the incident light beam. Consequently, the fifth step employs a new method of statistical processing in which a small weight is assigned to detection values for marks having large detection errors, as inferred from the relative level differences, while a large weight is assigned to detection values for marks having small detection errors. Such an analysis allows the positions of the fine patterns over the entire substrate surface to be calculated with greater precision than before.

The foregoing method can be used to sequentially position prescribed shot regions, on which are formed fine patterns on a photosensitive substrate, at the exposure position while performing multiple-burn exposures to transfer a pattern formed by a mask onto the shot regions. Prior to beginning exposure, the array coordinates of the shot regions on the photosensitive substrate are calculated according to the foregoing method, followed by the shot regions being sequentially positioned at the exposure position in accordance with the calculated array coordinates to perform multiple-burn exposures.

Since the array coordinates of the shot regions on the photosensitive substrate can be calculated with greater precision than before, and since these calculated array coordinates are used to sequentially position the shot regions at the exposure locations for multiple burn exposure, more precise registration can be achieved.

The foregoing method can be manifest in an apparatus according to the invention for determining the position of a substrate comprising fine patterns with grating marks comprising repeated concavities and convexities with period in a particular direction at multiple (M) locations on the surface of the substrate. The positions of the multiple grating marks in the period direction are detected and the detected positions are subjected to statistical processing in order to detect the position of the fine patterns over the entire surface of the substrate. The apparatus comprises a transport-light optical system for generating pairs of coherent light beams that are respectively placed to be incident upon the multiple-location grating marks so as to form respective interference patterns in the same period direction as the period direction of the grating marks with an amplitude-distribution period of $2P/N$ (where N is a natural number). The apparatus also comprises a light-receiving system for separately receiving a first combined light beam comprising a combination of the first light beam's positive reflection light and the second light beam's Nth-order diffraction light, and a second combined light beam comprising a combination of the second light beam's positive reflection light and said first light beam's Nth-order diffraction light, and for converting the received light into respective electrical light-quantity signals. The apparatus also comprises a relative-scanning system for performing relative scanning in the period direction of the grating marks and the interference patterns. The apparatus also comprises a position-detection system for detecting the positions of the grating marks, based on changes accompanying the relative scanning of the light-quantity signals of the first and second combined light beams. The apparatus also comprises a level-difference detection system wherein relative level differences on the grating marks are respectively calculated by dividing the grating-mark level differences by half of the respective wavelengths in the incident light beams in the medium proximal to the surface of the grating marks, based on changes accompanying the relative scanning of the light-quantity signals of the first and second combined light beams obtained at the light-receiving system, and based on design data for the grating marks. The apparatus also comprises a calculation system, wherein a large weight is assigned to the detected position of the j'th grating mark ($1 \leq j \leq M$) whenever the relative level difference is close to ¼ of the wavelength of the incident light beam proximal to the surface of the j'th grating mark, and wherein a small weight is assigned to the detected position of the j'th grating mark whenever the relative level difference is distant from ¼ of the wavelength. The detected positions of the grating marks are subjected to statistical processing in order to calculate the positions of the fine patterns over the entire surface of the substrate.

Thus, it is possible to calculate the positions (array coordinates) of the fine patterns on the entire substrate surface with greater precision than before.

The position-detection system is preferably configured so as to detect grating-mark positions as average values of the detected positions based on the phases of respective light-quantity signal changes from the first and second combined light beams accompanying relative scanning.

The level-difference-detection system may be configured to calculate the relative level difference based on the ratio of the respective widths between the concavities and convexities on the grating marks, the phase differences of respective light-quantity signal changes for the first and second combined light beams accompanying relative scanning, and contrast. Alternatively, if a further light-quantity-ratio calculation system is provided for calculating the light-quantity ratio of zero-order to Nth-order diffraction light reflected and diffracted from the grating marks, the level-difference-detection system may be configured to calculate the relative level differences of respective grating marks based on the ratio of the respective widths between the concavities and convexities on the grating marks, the phase differences of respective light quantity signal changes for the first and second combined light beams accompanying relative scanning, and the light quantity ratio obtained from the light-quantity-ratio calculation system. In the latter instance, since the light quantity ratio of zero-order diffraction light to Nth-order diffraction light is calculated directly, it is possible to calculate the relative level difference with even greater precision than when the light quantity ratio is calculated based on contrast.

The transport-light optical system can be operable to place multiple pairs of coherent light beams incident upon the multiple-location grating marks in time-division sequence for each wavelength. Such an arrangement simplifies the construction of the light-receiving optical system and circuitry for signal processing. Such time-division sequencing can also include the alternating incidence of pairs of light beams of different wavelengths onto the grating marks.

The foregoing apparatus can be included in an exposure apparatus according to the invention. The exposure apparatus is operable to sequentially position prescribed shot regions, on which are formed fine patterns on a photosensitive substrate, at the exposure position while performing multiple-burn exposures, so as to transfer a pattern formed by a mask onto the shot regions. The array coordinates of the shot regions on the photosensitive substrate can be calculated with higher precision than before. Also, since the shot regions are sequentially positioned at the exposure location based on those calculated array coordinates, it is possible ultimately to achieve higher precision in registration.

The foregoing and additional features and advantages of the present invention will be more readily apparent from the following detailed description, which proceeds with reference to the accompanying drawings.

DETAILED DESCRIPTION

With respect to an exposure apparatus, the precision by which position detection can be performed, fluctuations in amplitude reflectance, and fluctuations in diffraction efficiency of the grating mark caused by variations in the depth profile of the mark (i.e., "level difference") and/or variations in the thickness of resist on the mark can be simulated under a variety of conditions by hypothesizing an amplitude reflectance for the mark itself.

Figure 12:
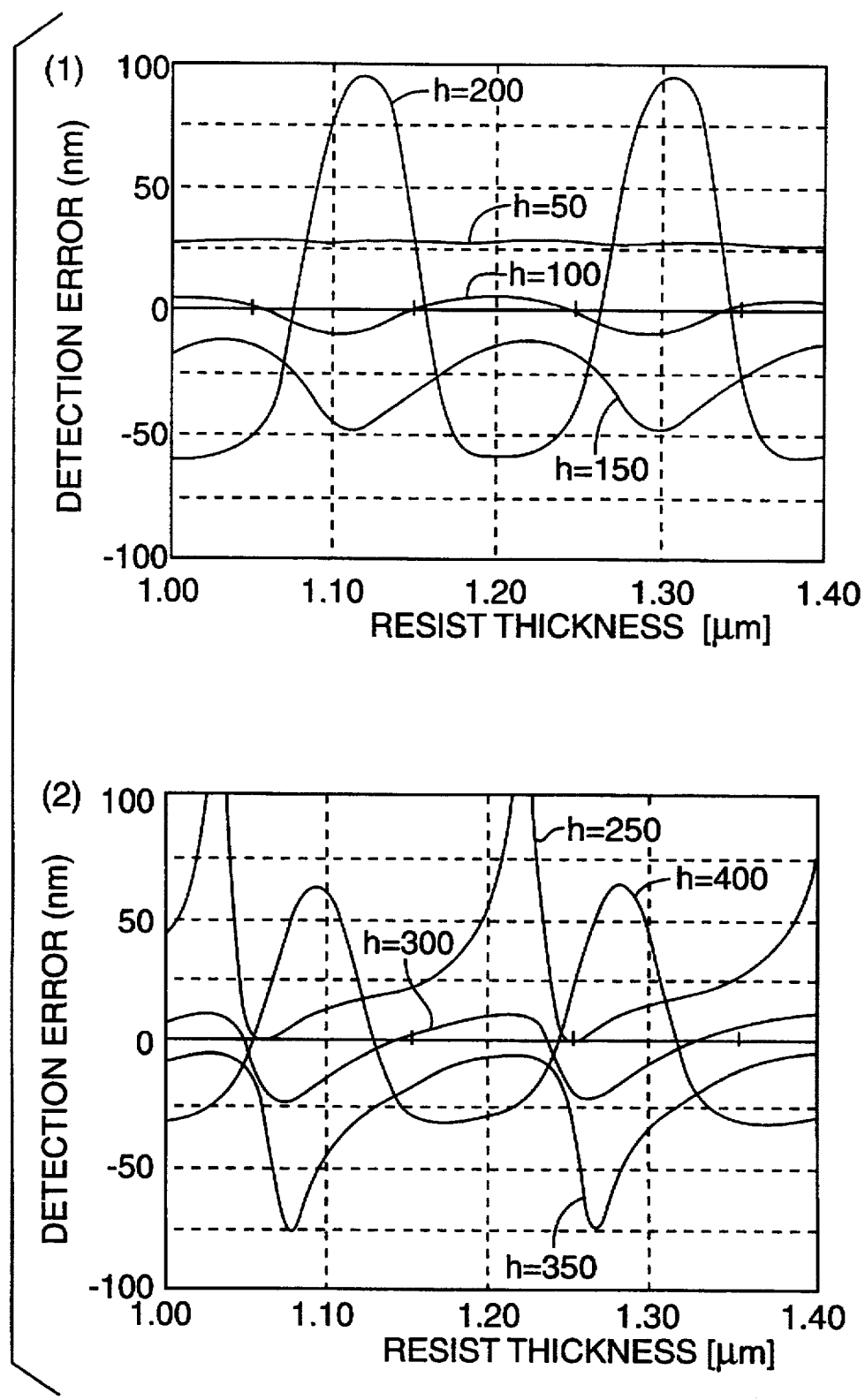
FIG. 12 provides two plots pertaining to a simulation that led to the conception of the present invention, in which plots the vertical axis is position-detection error (nm) with respect to a grating mark, and the horizontal axis is resist thickness (d, in µm) over the grating mark. The first (top) plot presents level-difference values for h=50, 100, 150, and 200 nm; and the second (bottom) plot presents level-difference values for h=250, 300, 350, and 400 nm.

An example of this sort of simulation result is illustrated in FIG. 12. The illustrated simulation result reflects an hypothesis that a grating mark on a wafer coated with a resist layer is illuminated by coherent transport light beams with a constant frequency difference from two symmetrical directions. The result is obtained through observation (measurement) of conditions of the mutual interference light, generated vertically by the grating mark from ±1 order diffraction light; i.e., conditions of the interference beat light (amplitude, phase, etc.).

Figure 13A:
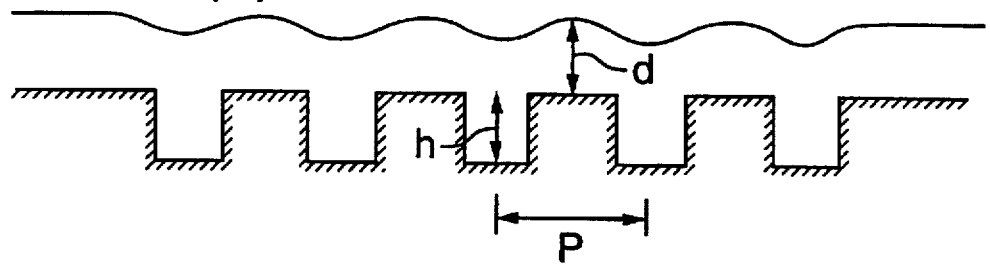
FIG. 13(a) shows a cross-sectional profile of the grating mark used in the simulation that produced the results shown in FIG. 12.
Figure 13B:
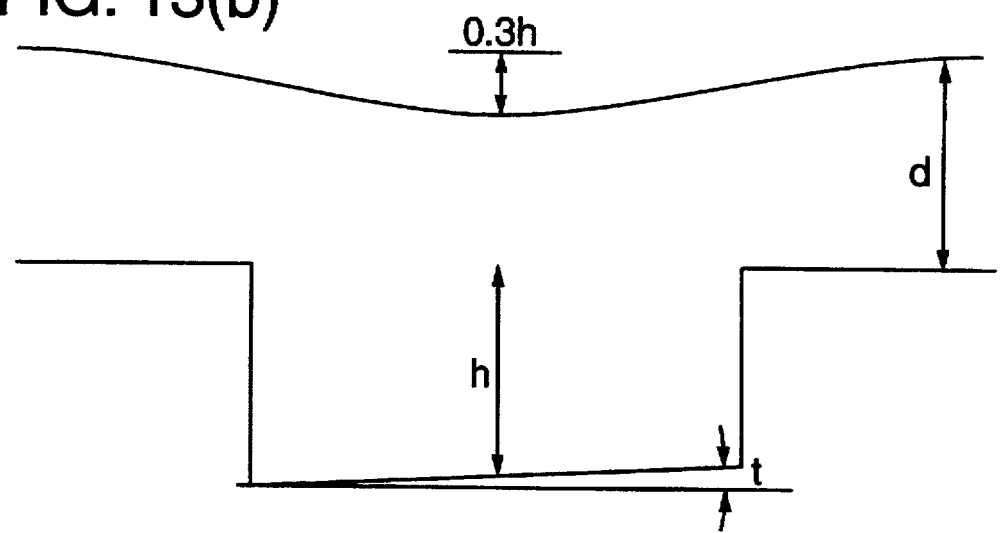
FIG. 13(b) shows an enlarged view of one of the concavities shown in FIG. 13(a).

The profile of the grating mark on the wafer as hypothesized in this simulation is a row of convexities and concavities having widths of 4 µm and a period P=8 µm in the direction of measurement. FIG. 13(a) shows a depth profile (cross section) of the grating mark, and FIG. 13(b) is an enlarged view of a single period of the grating mark. Other illustrated parameters are the mark level difference h and the resist thickness d. The simulation assumes that the floor of each concavity has a slight tilt (about 0.1% from the horizontal). The surface of the resist is assumed to intrude 0.3·h into the mark concavities (FIG. 13(b)). The resist surface profile is a sine function (with period P), and the refractive indices for the wafer and the resist are 3.5 and 1.66, respectively. Due to space considerations, FIG. 13(a) shows five pairs of concavities and convexities, but an actual number would be much greater.

In addition, a hypothetical detection optical system would comprise a detection laser beam having a wavelength $\lambda$=633 nm (e.g., a He—Ne laser), with two incident beams directed symmetrically from ±1 order directions in relation to the mark period P. The light beam reflected and diffracted in an upward vertical direction (the combined light beam from the ±1 order diffraction light of the two incident light beams) by the mark is subsequently received for detection of the position (as in the previously described "±1-order detection method" [±Nth-order detection method with N=1]). However, similar results are obtained as described above, either with the "zero-primary (0,1) order detection method," in which two beams are symmetrically incident in relation to the period P at a direction of ±0.5 order, or by the "reference grating method," which uses ±1 order diffraction light.

In the first and second plots of FIG. 12, the horizontal axis represents the resist thickness d [μm], while the vertical axis represents the position-detection error (nm). The first plot depicts simulation results assuming mark-level-difference h values of 50, 100, 150, and 200 nm. The second plot shows simulation results assuming mark-level-difference h values of 250, 300, 350, and 400 nm. These plots indicate that, although detection error varies with changes in resist thickness, there is little variation when the mark-level-difference h is either 100 or 300 nm, indicating good absolute precision in such instances.

Since the detection light beam has a wavelength of 633 nm in the foregoing, and since the refractive index of the resist is 1.66, the detection-light wavelength in the vicinity of the mark surface (in the resist) is 381 nm. Consequently, the mark-level-differences of 100 and 300 nm are virtually equal to one-fourth and three-fourths of that wavelength. In addition, although omitted from FIG. 12, the simulation results indicate that the detection error is also extremely small for marks having a level difference of 5/4 and 7/4 of the mid-resist wavelength of the detection light beam, i.e., marks having a level difference of (2m+1)/4 times the mid-resist wavelength value (where m is an integer of 0 or greater).

These simulation results also suggest that it is possible to dramatically reduce detection error by using a detection light beam having a wavelength (mid-resist wavelength) expressed by the mark-level-difference multiplied by a factor of 4/(2m+1).

Nevertheless, no conventional method or apparatus exists for accurately and easily measuring the level difference in grating marks such as for the interference-type alignment method. Consequently, there is currently no way in which to readily assess whether the level difference of a grating mark subject to position detection conforms to the condition of the detection-light wavelength multiplied by a factor of (2m+1)/4.

In investigating these simulation results further, it was noted that detection precision appeared to be dramatically affected not by the level difference itself, but by how far the level difference deviates from the value of the mid-resist wavelength multiplied by (2m+1)/4, i.e., by how closely the result of dividing the level difference by half the mid-resist wavelength is to one-fourth the wavelength, rather than the level difference itself.

These simulation results also show that detection error arising in interference-type alignment is very small whenever level differences for a position-detection mark are a multiple of the mid-resist wavelength multiplied by (2m+1)/4. The simultaneous detection of mark-level difference with the detection of mark position appears to enable accurate prediction of the magnitude of detection error in the detected position, based on the level difference.

This invention was formulated on the basis of the simulation results described above, which show that, in the interference-type alignment method, which makes use of illumination light having a single wavelength, whenever the mark-level-difference is (2m+1)/4 (where m is an integer of 0 or greater) times the illumination-light wavelength (more precisely, the mid-resist wavelength of the illumination light), virtually no position-detection error occurs.

First Embodiment

Figure 1:
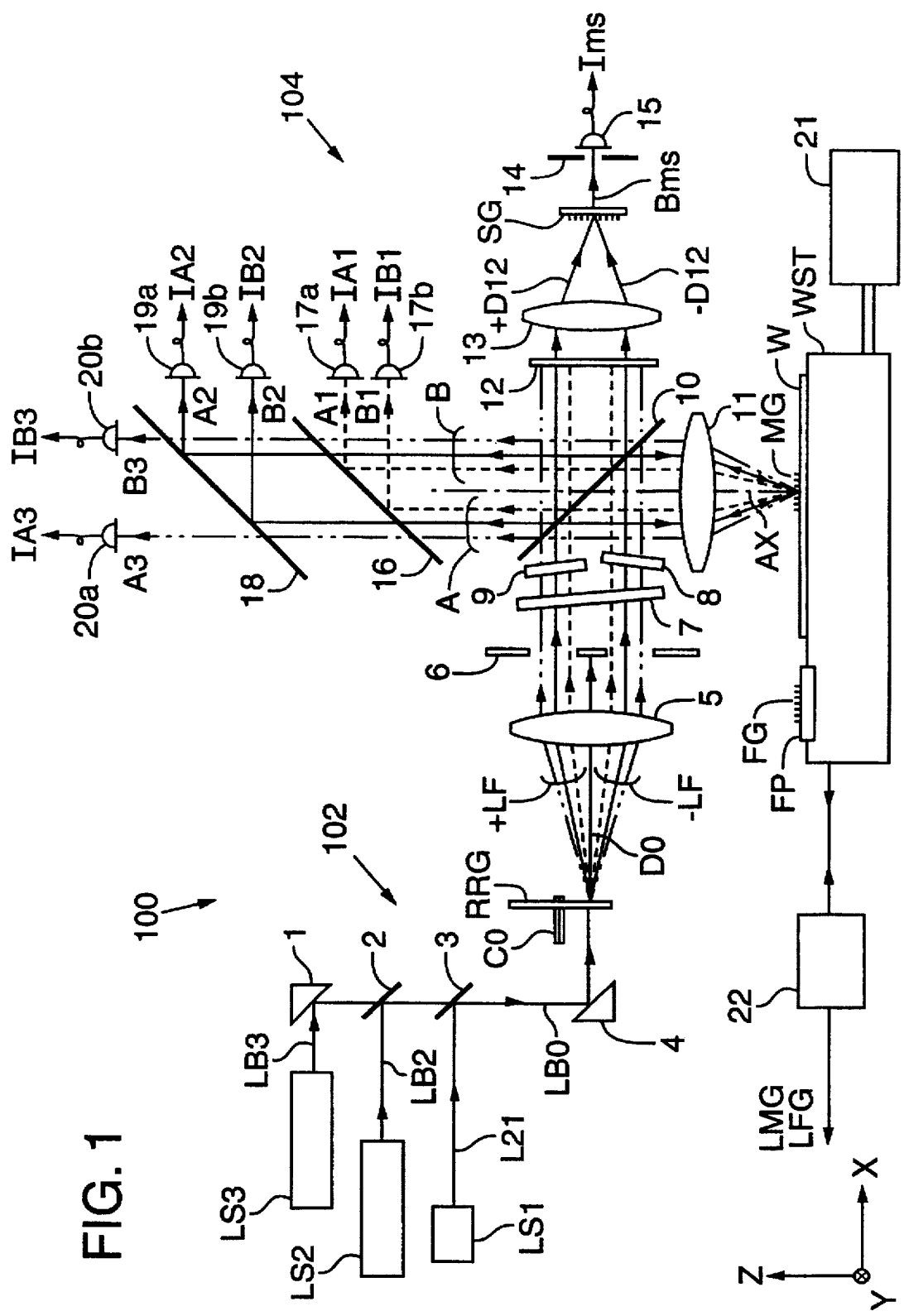
FIG. 1 is a schematic elevational diagram showing relevant components and light paths of the first embodiment of an apparatus according to the invention.

FIG. 1 depicts feature of a first embodiment of a position-detection apparatus 100 according to the invention. The position-detection apparatus 100 comprises a wafer stage WST to which a wafer W is mounted for processing. A drive system 21 is provided for controllably moving the wafer stage WST in two dimensional directions. The apparatus also comprises a transport-light optical system 102, and a light-receiving optical system 104.

The transport-light optical system 102 comprises three laser light sources LS1, LS2, and LS3 operable to produce light beams $LB_1$, $LB_2$, and $LB_3$, respectively. The transport-light optical system 102 further comprises a mirror 1, dichroic mirrors 2, 3, a mirror 4, a rotating radial grating RRG, a collimator lens 5, a light-beam selector 6, adjustment optical systems 7, 8, and 9 each comprising a flat glass plate with parallel sides, a half-mirror beam splitter 10, and an objective lens 11.

The three laser light sources LS1, LS2, and LS3 emit laser beams $LB_1$, $LB_2$, and $LB_3$ each having a different wavelength $\lambda_1$, $\lambda_2$, and $\lambda_3$, respectively. For example, the laser light source LS1 employs a He—Ne laser wherein $\lambda_1$=633 nm, the laser light source LS2 employs a semiconductor laser wherein $\lambda_2$=690 nm, and the laser light source LS3 employs a semiconductor laser wherein $\lambda_3$=780 nm. Consequently, $\lambda_1<\lambda_2<\lambda_3$.

The three beams $LB_1$, $LB_2$, and $LB_3$ are combined by the mirror 1 and dichroic mirrors 2 and 3 into a coaxial beam $LB_0$ that is reflected by the mirror 4 and is incident upon the rotating radial grating RRG. The grating RRG rotates at high speed at an angular velocity in one rotational direction around a rotation axis $C_0$. The grating RRG operates to increase or decrease the frequency of the diffraction light of respective orders diffracted by the grating RRG by just the portion corresponding to the angular velocity.

Figure 2:
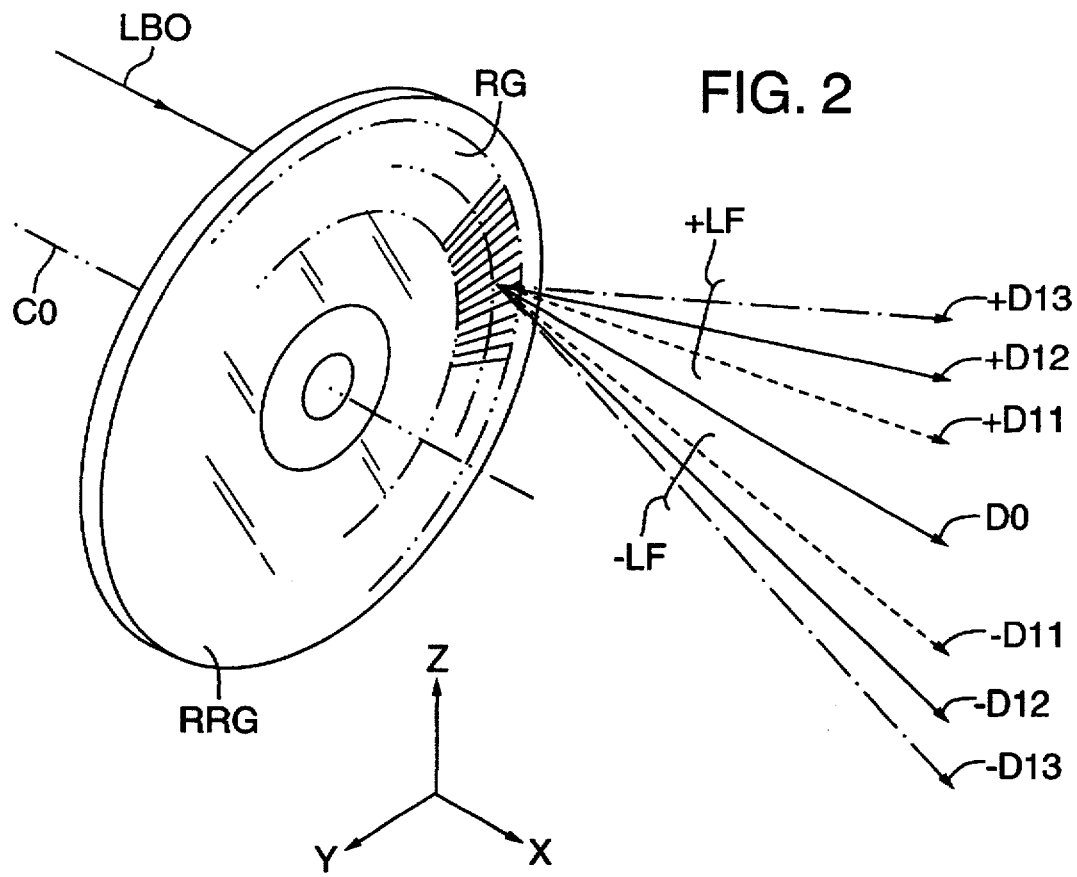
FIG. 2 details a rotating radial grating as used in several embodiments of an apparatus according to the invention.

FIG. 2 depicts an enlarged oblique view of the rotating radial grating RRG. The rotating radial grating RRG is preferably made of a rigid circular sheet and defines, over a 360-degree circumferential span, a transmission-type phase-diffraction grating RG having specific pitch intervals along the circumference direction. In the figure, the rotation axis $C_0$ of the grating RRG is parallel to the X-axis of an X-Y-Z coordinate system. The beam $LB_0$ is incident vertically upon the grating RG and generates various orders of diffraction light other than zero-order light $D_0$. This embodiment is a heterodyne system that employs the ±1 order diffraction light from the rotating radial grating RRG.

Further with respect to FIG. 2, when the beam $LB_0$ is incident vertically on the grating RG, the beam $LB_0$ generates primary diffraction beams $+D_{11}$ and $-D_{11}$ from the beam LB1 (having a wavelength $\lambda1$), generates primary diffraction beams $+D_{12}$ and $-D_{12}$ from the beam $LB_2$ (having a wavelength of $\lambda_2$), and primary diffraction beams $+D_{13}$ and $-D_{13}$ from the beam $LB_3$ (having a wavelength of $\lambda_3$). The diffraction angle $\theta_n$ of the primary diffraction beams is expressed as follows for each wavelength:

$$\sin \theta_n = \lambda_n / P_{rg} \tag{1}$$

wherein n is a respective frequency (n=1, 2, or 3), and $P_{rg}$ represents the period of the grating RG.

The primary diffraction beams generated from the rotating radial grating RRG receive a constant frequency bias Δf regardless of wavelength. In other words, if V represents the velocity at which the beam $LB_0$ traverses the grating RG, then $\Delta f = V/P_{rg}$, and the frequency of the positive primary diffraction beam is just $\Delta f$ higher than the frequency of the zero-order light $D_0$, and the frequency of the negative primary diffraction beam is just $\Delta f$ lower than the frequency of zero-order light $D_0$. In this manner, the rotating radial grating RRG functions as a type of frequency shifter.

As shown in FIG. 1, the three wavelength components that have undergone a frequency shift as described above, namely, the transport light beam +LF which is composed of the positive primary diffraction beams $+D_{1n}$ (n=1, 2, 3), the transport light beam −LF which is composed of the negative primary diffraction beams $-D_{1n}$ (n=1, 2, 3), and the zero-order light $D_0$, are refracted by the collimator lens 5 to propagate their principal rays in parallel to the light-beam selector 6. The light-beam selector 6 functions as a spatial filter placed on a so-called Fourier transform plane. Here, the zero-order light $D_0$ is intercepted, while the transport light beams +LF, −LF pass through.

The transport light beams +LF, −LF pass through the adjustment optical systems 7, 8, 9 (each having a variable tilt) before reaching the half-mirror beam splitter 10.

The adjustment optical system 7 performs a decentering function in relation to the optical axis of the lens 5 without altering the intervals in the Fourier space between the transport light beam +LF and the transport light beam −LF. The adjustment optical systems 8 and 9 perform an adjustment function to adjust the position in relation to the respective optical axis of the transport light beam −LF and the transport light beam +LF, respectively. In other words, the adjustment optical system 7 is operable to adjust the incidence angle of the transport light beams (+LF, −LF) onto the wafer W relative to the propagation direction of these beams centered on the optical axis of the objective lens 11, and the optical systems 8 and 9 are operable to adjust the aperture angle of the transport light beams +LF and −LF onto the wafer W in relation to the optical axis of the objective lens 11.

The transport light beams +LF, −LF are each split into two beams by the half-mirror beam splitter 10. The reflected light passes through the objective lens 11, and is incident on the wafer W. The angle of incidence on the wafer W is dependent on the wavelength.

Figure 3:
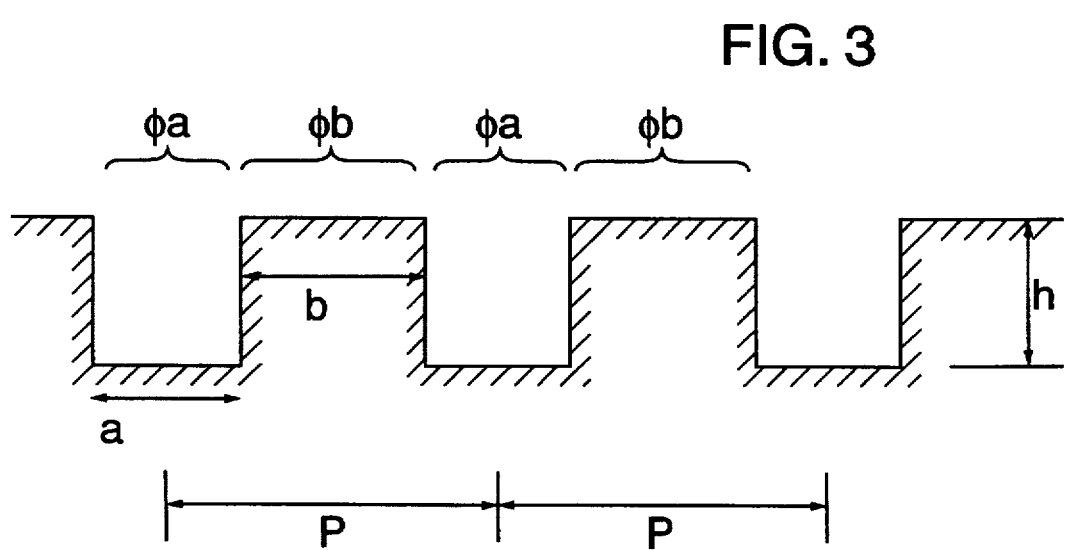
FIG. 3 shows a representative vertical profile of an align mark (grating mark) that would be provided on a wafer.

Previously formed on the wafer W is a grating mark (i.e., a position-detection or alignment mark) MG. The grating mark MG has a cross-sectional profile (i.e., sectional depth profile) as shown in FIG. 3. In FIG. 1, the grating mark MG is positioned exactly at the incident location of the transport light beams +LF, −LF.

Three interference patterns are formed by interference of the transport light beams $\pm D_{11}$, $\pm D_{12}$, and $\pm D_{13}$ (respectively having wavelengths $\lambda_1$, $\lambda_2$, and $\lambda_3$) overlap with the same period and same phase on the grating mark MG. Furthermore, due to the frequency difference 2·$\Delta f$ between the transport light beams +LF and −LF, these interference patterns are observed to move across the grating mark MG at the same velocity in one direction (i.e., in the period direction of the grating mark MG). The traversing velocity is proportional to the rotational velocity V of the transmission-type phase-diffraction grating RG on the rotating radial grating RRG. Thus, the rotating radial grating RRG comprises a relative-scanning system.

As is clear from FIG. 1, the surface of the wafer W (including the grating mark MG) and the rotating radial grating RRG are both arranged to have a conjugate imaging relationship relative to a combining system comprising the collimator lens 5 and the objective lens 11. Accordingly, diffraction images formed by ±1 order diffraction light from the transmission-type phase-diffraction grating RG are formed on the grating mark MG, while zero-order light $D_0$ is intercepted. Thus, light and dark images (comprising an interference-pattern intensity distribution) are formed at ½ the period of the grating RG.

In this embodiment, the amplitude period $P_{if}$ (equal to twice the intensity-distribution period) of these interference patterns on the wafer W is set to 2/N (where N is a natural number) times the period $P_{mg}$ of the grating mark MG. At this time, the zero-order diffraction light of the grating mark MG from one (i.e., the first) incident beam (e.g., +LF) combines with the Nth-order diffraction light of the grating mark MG from another (i.e., the second) incident beam (e.g., −LF), either of which can be any of the three wavelengths above, to form a first combined light beam generated in a single direction with mutual interference. Also, a second combined light beam generated in a single direction with mutual interference is formed from zero-order diffraction light of the grating mark MG from the second incident beam and the Nth-order diffraction light of the grating mark MG from the first incident beam. These first and second combined light beams represent beat light that has undergone intensity modulation with a frequency of 2·$\Delta f$ corresponding to the frequency differential between the light source incident beams +LF, −LF.

In order for respective zero- and Nth-order diffraction light to be generated in the same direction, the interval $D_{Ln}$ on the Fourier transform plane (adjacent to the beam splitter) between the transport light beams +LF, −LF at each frequency, with the focal length of the objective lens 11 represented as $F_0$, should be established with respect to the detection direction of the grating mark MG as follows:

$$D_{Ln} = \pm N \cdot F_0 \cdot \lambda_n / P_{mg} \qquad (2)$$

The setting of the interval $D_{Ln}$ for each wavelength can be adjusted by appropriately setting the period of the phase-diffraction grating RG and the focal length of the collimator lens S.

It is preferable for the transport light beams +LF, −LF to be incident at the same angle on the grating mark MG so that no error is produced in detected positions of the wafer, or to pass at a distance away from the optical axis AX by just $D_{Ln}/2$, respectively, in the detection direction of the grating mark MG on the Fourier transform plane, even when the grating mark MG is in a somewhat defocused state (i.e., misaligned in relation to the direction of optical axis AX).

If there is a slight chromatic aberration between the collimator lens 5 and the objective lens 11, the aberration can produce a mutual position offsetting (phase deviation) for each color as well as period deviations in the interference patterns formed on the wafer W. The adjustment optical systems 7, 8, and 9 in FIG. 1 are used to correct such deviations. As discussed above, each of the adjustment optical systems 7, 8, 9 is a parallel flat glass plate. Preferably, each adjustment optical system 7, 8, 9 is made from a material having a high color-dispersion property in order to enable minute changes to be made in the mutual position offset and phase deviation of the interference patterns formed on the wafer W for each wavelength. Alternatively, if the adjustment optical systems 7, 8, and 9 are made from materials having high and low color-dispersion properties, the mutual relationship between interference patterns for each wavelength can be corrected by adjusting the tilt of the plate(s) having high color-dispersion properties, while errors in overall tilt of the transport light beams +LF, −LF on the wafer W can be corrected by adjusting the tilt of the plate(s) having low color-dispersion properties.

The light-receiving optical system 104 comprises the objective lens 11, dichroic mirrors 16 and 18, a wavelength-selection filter 12, a focusing lens (Fourier transform lens) 13, a reference grating SG, a spatial filter 14, photoelectric converters (detectors) 17a, 17b, 19a, 19b, 20a, 20b that serve as light receivers, and a detector 15 which serves as a reference-signal generator.

The first and second combined light beams generated from the grating mark MG, illuminated by interference patterns as previously described, pass through the objective lens 11 and the half-mirror beam splitter 10 and reach the dichroic mirror 16. Of these first and second combined light beams, the component beams A1 and B1, each having a frequency $\lambda_1$, are reflected by the dichroic mirror 16 and are incident on the photoelectric detectors 17a and 17b, where light-quantity signals are converted into electrical signals $I_{A1}$ and $I_{B1}$.

The component beams having wavelengths of $\lambda_2$ and $\lambda_3$ pass through the dichroic mirror 16 and travel to the dichroic mirror 18. In addition, of the first and second combined light beams A and B, component beams A2 and B2, each having a wavelength of $\lambda_2$, are reflected by the dichroic mirror 18, and are incident on photoelectric detectors 19a and 19b where they undergo photoelectric conversion. The component beams A3 and B3, each of which having a wavelength of $\lambda_3$, pass through the dichroic mirror 18 and are incident on the photoelectric detectors 20a and 20b where they undergo photoelectric conversion. Depending on the differences in the wavelengths $\lambda_1$, $\lambda_2$, and $\lambda_3$ that are employed, the wavelength splittings performed by the dichroic mirrors 16 and 18 are sometimes insufficient. Thus, an interference filter (narrow-band bandpass filter; not shown) may be placed immediately before each detector.

Each of the photoelectric signals $I_{A1}$, $I_{B1}$, $I_{A2}$, $I_{B2}$, $I_{A3}$, and $I_{B3}$ produced by the respective detector 17a, 17b, 18a, 18b, 19a, and 19b is a sine wave with the same frequency as the beat frequency $2 \cdot \Delta f$ whenever the interference patterns irradiate sections of the grating mark MG.

The light beams that pass from the collimator lens 5 to the beam splitter 10 (i.e., the transport light beams +LF, −LF) are incident upon the wavelength-selection filter 12, where only the primary beams, among the transport light beams +LF, −LF, having a specific wavelength (i.e., the primary beams $+D_{12}$, $-D_{12}$) are selected for passage through the focusing lens 13. In addition, the beams are irradiated on the transmission-type reference grating SG in an overlapping manner. The reference grating SG is arranged in a conjugate position with the rotating radial grating RRG relative to a "combining system" comprising the collimator lens 5 and the focusing lens 13. Consequently, a one-dimensional interference pattern of the primary beams $+D_{12}$, $-D_{12}$ is also formed on the reference grating SG from the two-beam interference; this pattern moves at a speed corresponding to the beat frequency $2 \cdot \Delta f$.

Whenever the period of the reference grating SG and the period of its interference pattern are set appropriately, the ±1 order diffraction light generated from the reference grating SG proceeds in the same direction as the interference beam $B_{ms}$. The diffraction light passes through the spatial filter 14, and is received at the detector 15. The photoelectric signal $I_{ms}$ from detector 15 is also a sine wave with the same frequency as the beat frequency $2 \cdot \Delta f$, and the signal $I_{ms}$ serves as a reference signal for the heterodyne method.

In this first embodiment, one wavelength among the three wavelengths is designated as belonging to the light beam that irradiates the reference grating SG. This is because the reference grating SG is fabricated by vapor deposition of a chromium layer on a glass substrate; an alternating pattern of transparent lines and opaque lines is formed on the chromium layer by etching. The reference grating SG is fabricated as a nearly ideal grating (with symmetrical amplitude-transmittance) with no asymmetry or resist-layer problems such as found on the grating mark MG on the wafer W. Thus, a single beam corresponding to any one of the three wavelengths $\lambda_1$, $\lambda_2$, or $\lambda_3$, for the pair of transport light beams irradiating the reference grating SG suffices to yield adequate precision.

It is also acceptable to irradiate the reference grating SG simultaneously with all the primary beams $\pm D_{11}$, $\pm D_{12}$, and $\pm D_{13}$ included in the transport light beams ±LF, and to form multicolor interference patterns in the same manner as on the grating mark MG on the wafer W. In this alternative instance, however, either of the following is preferred: (a) inclusion of an adjustment mechanism for unifying the position and period of the interference patterns formed by the three wavelengths, or (b) separately handling the interference beam $B_{ms}$ for each wavelength in the same manner as mark detection on the wafer W.

The wafer stage WST is operable to be moved in two dimensions within a plane (the X-Y plane) perpendicular to the optical axis AX of the objective lens 11. Movement of the wafer stage WST is effected by a wafer-stage driver 21 containing a drive motor. The drive mechanism can be, e.g., a rotary motor coupled to a feed screw, or a linear motor that directly drives the stage itself. The wafer W is preferably retained on the stage WST by suction via a wafer holder (not shown). The coordinate position of the wafer stage WST is calculated "on the fly" by a laser interferometer 22. The positional measurement obtained by the laser interferometer 22 is exploited for feedback control of the wafer-stage driver 21.

The wafer stage WST includes a fiducial-mark (reference-mark) plate FP. A reference mark FG is formed on the fiducial-mark plate FP, the reference mark FG having the same period as the grating mark MG on the wafer W. The reference mark FG is preferably made, of a chromium layer on a quartz glass surface. As discussed below, in actual position detection and in order to control hardware-dependent errors, the position of the reference mark FG is detected before detecting the position of the grating mark MG on the wafer W.

This first embodiment employs semiconductor lasers as the light sources LS2, LS3. A beam-shaping optical system (not shown, but comprising multiple tilted plates of parallel glass, etc.) is preferably used with each such laser to remove astigmatism arising between the respective semiconductor laser LS2, LS3, the mirror 1 and the dichroic mirror 2. This ensures that the various light-beam components in the single combined coaxial beam LB0 have the same diameters. Even when a light source other than a semiconductor laser is used for the light sources LS2, LS3, it is desirable and preferable that the apparatus include a beam-shaping optical system so the diameters of the various wavelength components of the combined coaxial beam LB0 are uniform.

Figure 4:
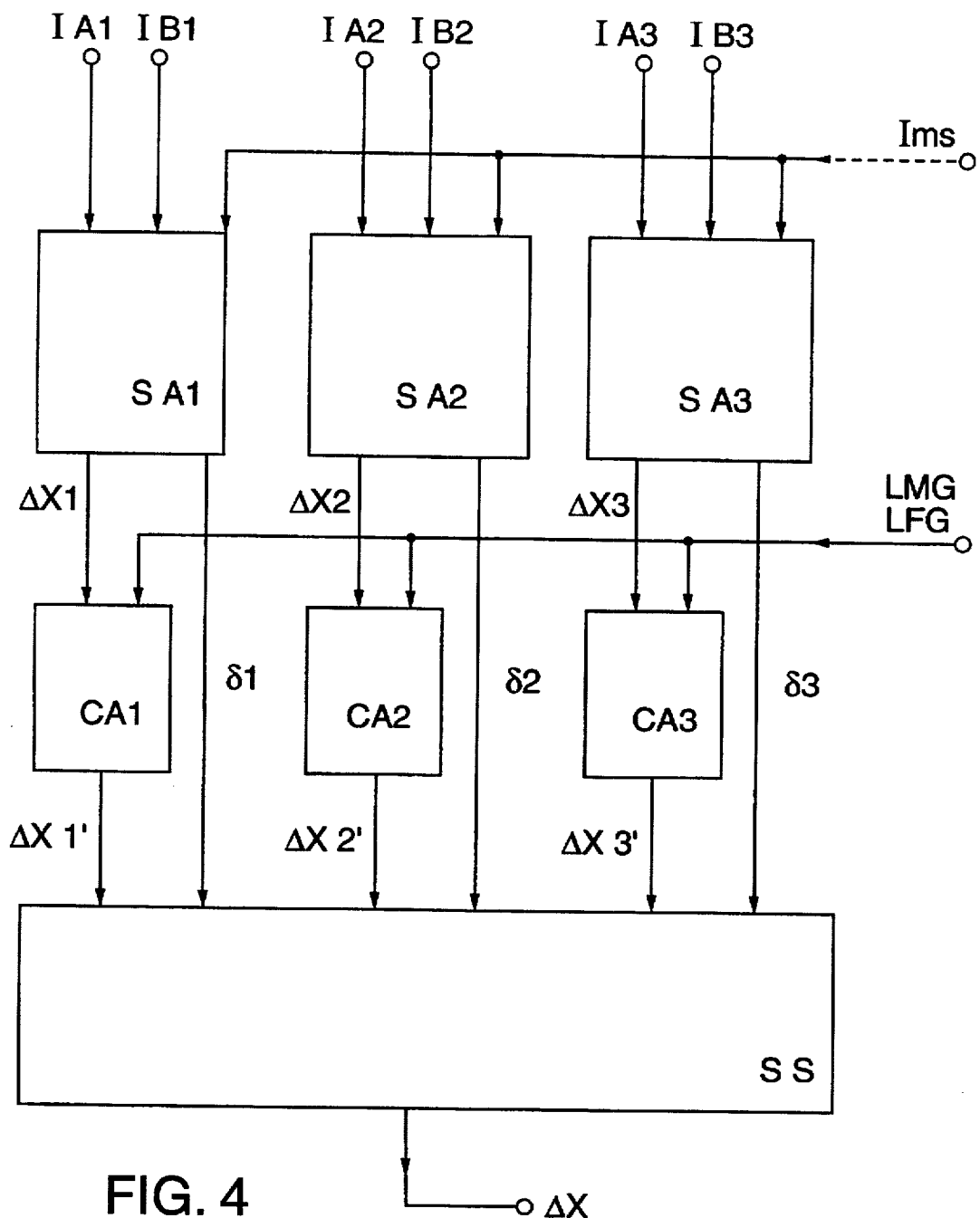
FIG. 4 is a block diagram showing certain features of an exemplary position-detection circuit (comprising an averaging circuit SS) included in the position-detection apparatus of the first embodiment.

FIG. 4 illustrates certain features of an exemplary position-detection circuit included in the position-detection apparatus 100. The position-detection circuit comprises three phase-difference detection circuits $SA_n$ (n=1, 2, 3) corresponding to the three respective wavelengths $\lambda_n$ (n=1, 2, 3), three detected-position correction circuits $CA_n$ (n=1, 2, 3) corresponding to the three phase-difference detection circuits, and an averaging circuit (also termed a signal-selection circuit) SS.

Figure 5:
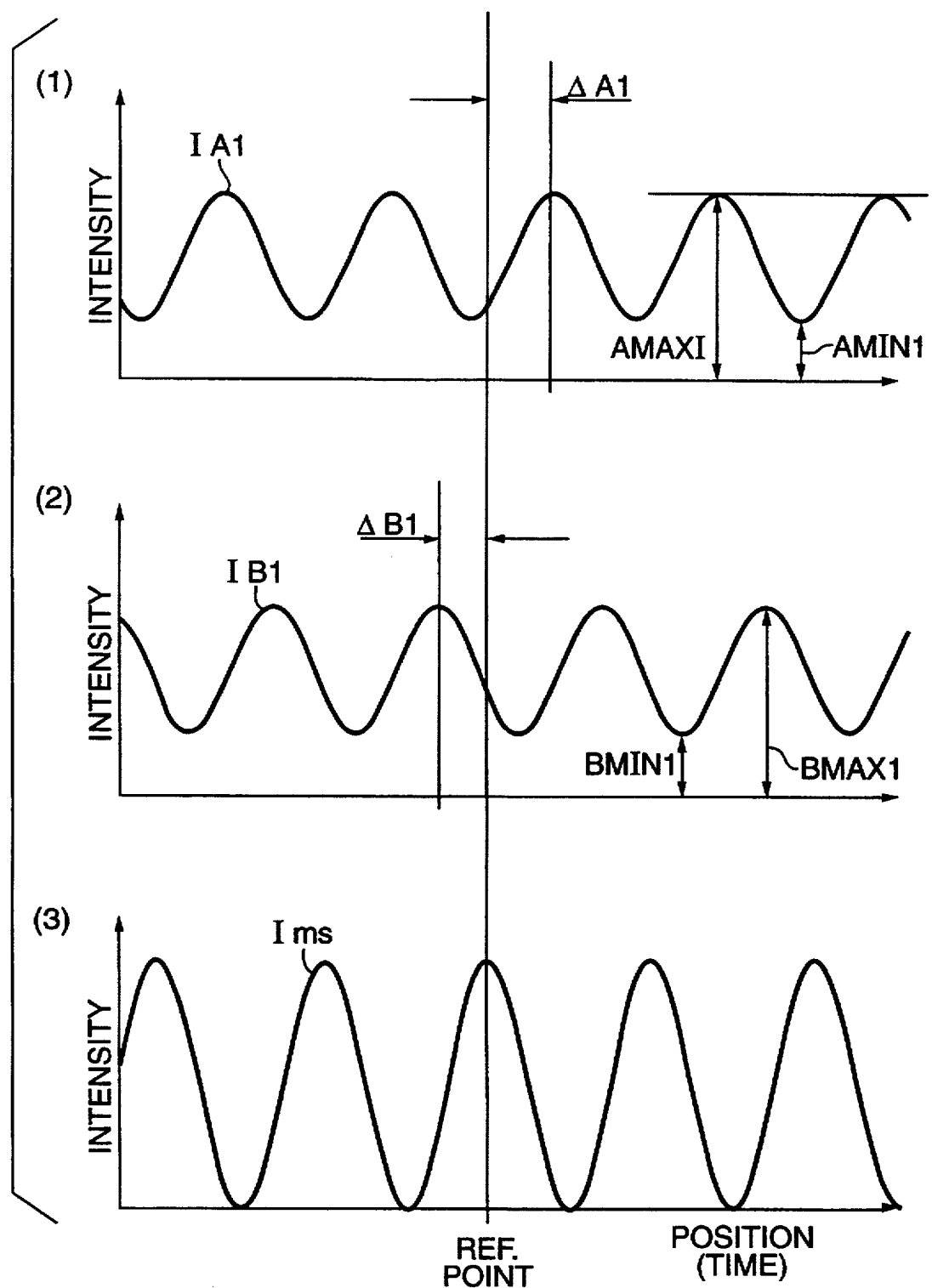
FIG. 5 provides three plots pertaining to the first embodiment and photoelectric signals produced thereby. The first (top) plot is of the light-quantity signal $I_{A1}$ output from the detector 17a of FIG. 1; the second (middle) plot is of the light-quantity signal $I_{B1}$ output from the detector 17b of FIG. 1; and the third (bottom) plot is of the light-quantity signal $I_{ms}$ output from the detector 15 of FIG. 1.
Figure 6:
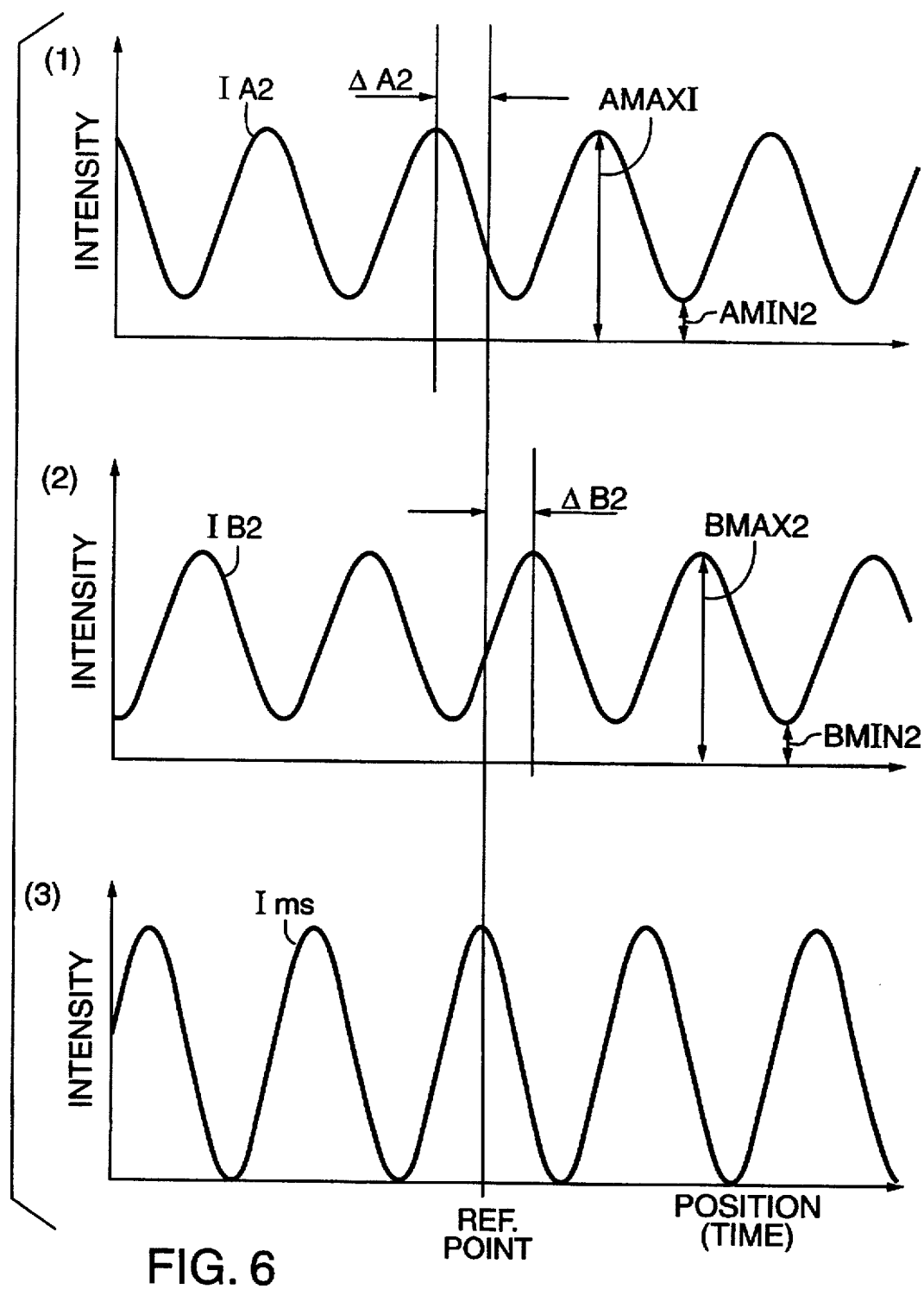
FIG. 6 provides three plots pertaining to the first embodiment and photoelectric signals produced thereby. The first (top) plot is of the light-quantity signal $I_{A2}$ output from the detector 19a of FIG. 1; the second (middle) plot is of the light-quantity signal $I_{B2}$ output from the detector 19b of FIG. 1; and the third (bottom) plot is of the light-quantity signal $I_{ms}$ output from the detector 15 of FIG. 1.
Figure 7:
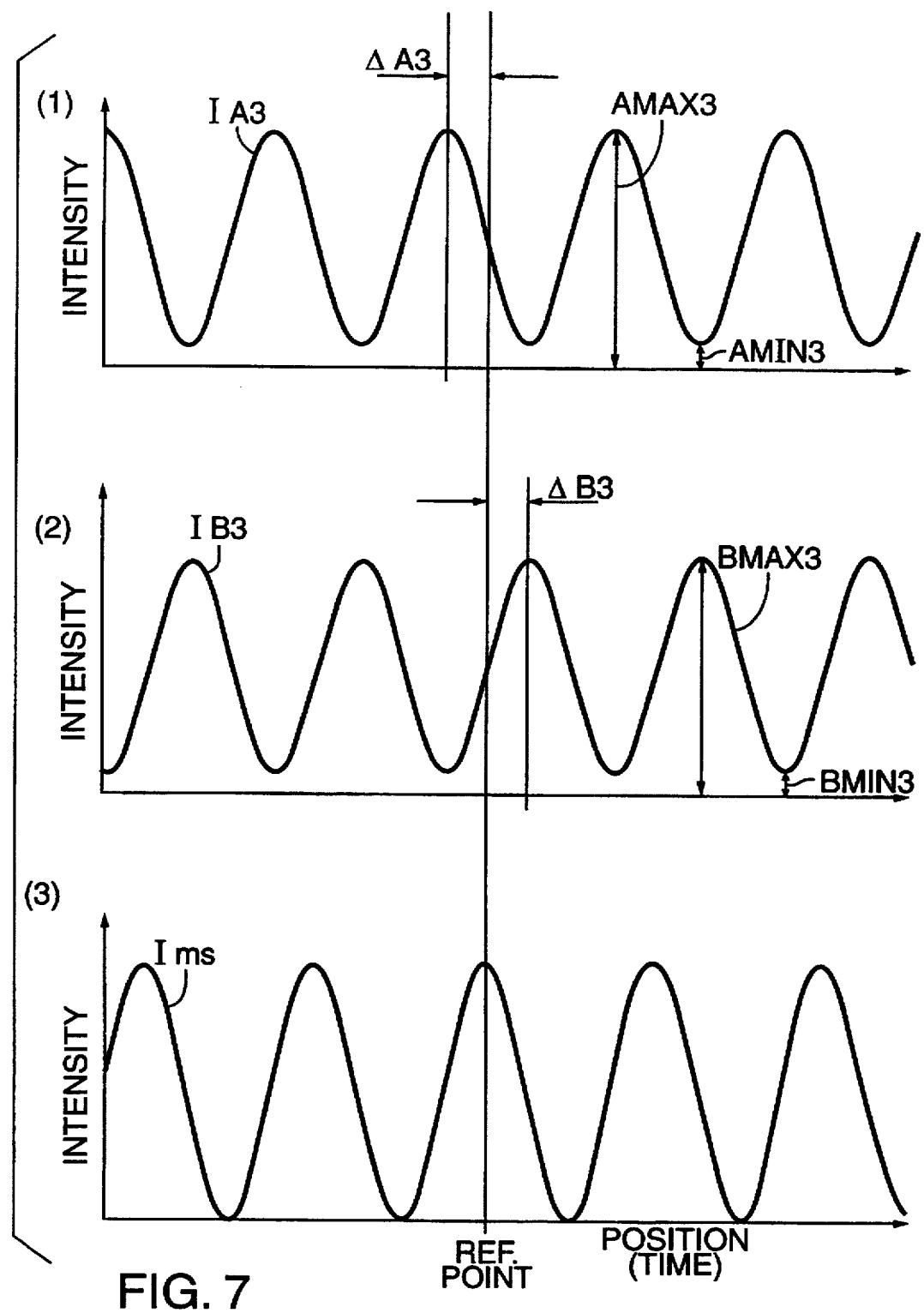
FIG. 7 provides three plots pertaining to the first embodiment and photoelectric signals produced thereby. The first (top) plot is of the light-quantity signal $I_{A3}$ output from the detector 20a of FIG. 1; the second (middle) plot is of the light-quantity signal $I_{B3}$ output from the detector 20b of FIG. 1; and the third (bottom) plot is of the light-quantity signal $I_{ms}$ output from the detector 15 of FIG. 1.

A summary description of the roles of the various circuits of the position-detection circuit of FIG. 4 is as follows (assuming the heterodyne method is used). When the interference patterns irradiate the grating mark MG or the reference mark FG, as described above, the respective photoelectric signal $I_{A1}$, $I_{B1}$, $I_{A2}$, $I_{B2}$, $I_{A3}$, $I_{B3}$, and $I_{mr}$ all comprise sine waves with the same frequency as the beat frequency 2·Δf. FIG. 5, FIG. 6, and FIG. 7 show examples of these signals.

Plot (1) of FIG. 5 depicts the light-quantity signal $I_{A1}$ (the output of the photoelectric detector 17a) from the component beam A1 having a wavelength $\lambda_1$. Plot (2) of FIG. 5 depicts the light-quantity signal $I_{B1}$ (the output of the photoelectric detector 17b). Plot (3) of FIG. 5 depicts the reference signal $I_{mr}$ which is the output of the detector 15. Phase differences of $\Delta A_1$ and $\Delta B_1$ exist between these signals in reference to the reference signal $I_{mr}$. The amount of phase difference corresponds to the location and the sectional-profile non-uniformities on the grating mark MG.

Similarly, plots (1), (2), and (3) of FIG. 6 depict the light-quantity signals $I_{A2}$, $I_{B2}$, and the reference signal $I_{mr}$, respectively, each of which having the wavelength $\lambda_2$; and plots (1), (2), and (3) of FIG. 7 depict the light-quantity signals $I_{A3}$, $I_{B3}$, and the reference signal $I_{mr}$, respectively, each of which having the wavelength $\lambda_3$. The phase differences between the signals in FIG. 5, FIG. 6, and FIG. 7 also correspond to the position and level differences found on the grating mark MG.

In the position-detection circuit of FIG. 4, the phase-difference-detection circuits $SA_1$, $SA_2$, and $SA_3$ initially detect these phase differences. In other words, the phase-difference-detection circuits $SA_n$ (n=1, 2, 3) are operable to detect the phase differences ($\Delta A_n$, $\Delta B_n$ [rad]) for input signals $I_{An}$ and $I_{Bn}$ with respect to the reference signal $I_{mr}$. These phase differences may be multiplied by $N \cdot P_{mg}/(2\pi)$ (where N is a multiple of the ratio of the grating-mark period $P_{mg}$ to the amplitude period of the interference patterns formed on the grating mark MG) in order to convert the phase differences into positions on the grating mark MG. However, as discussed in the Background of the Invention above, the average value of the detected positions obtained from these two phase differences in the zero-Nth-order method represents the detected position of the grating mark MG for each wavelength. Thus, the phase-difference detection circuits $SA_n$ output an average value $\Delta X_n$ according to the following expression:

$$\Delta X_n = [\Delta A_n \cdot N \cdot P_{mg}/(2\pi) + \Delta B_n \cdot N \cdot P_{mg}/(2\pi)]/2 \quad (3)$$

The phase-difference detection circuits $SA_n$ calculate relative level (i.e., depth) differences $\delta_n$ for the grating mark MG. This calculation is based on data concerning the respective widths a and b (FIG. 3) of concavities and convexities, respectively, of the grating mark MG. This data is encoded in the input signals $IA_n$, $IB_n$ in the form of light-phase magnitude, wherein the light-phase magnitude represents the result (remainder) of the true level difference divided by $\lambda_m/2$ ($\lambda_m$ is the wavelength of the detected light beam proximate to the surface of the grating mark MG). The wavelength $\lambda_m$ proximate to the surface of the grating mark MG refers to the wavelength within a transparent medium when, for example, the grating mark MG is covered with a resist, glass (PSG), or other transparent substance. If the surface of the grating mark MG lacks any such transparent covering, $\lambda_m$ refers to the ambient wavelength, i.e., $\lambda_n$. The algorithm for calculating the relative level difference $\delta_n$ is an aspect of this invention that is described later.

Incidentally, the detected position $\Delta X_n$ reflects the amount of position offset (phase deviation) in relation to the reference signal $I_{mr}$, not the position of the grating mark MG on the wafer W itself. Consequently, a position reference is required on the wafer W or on the wafer stage WST in order to relate the position offset obtained from the reference signal $I_{mr}$ to positions on the wafer W.

The reference mark FG serves as this position reference. Before position detection is performed for the grating mark MG on the wafer W, the position of the reference mark FG is initially detected, thus yielding the relationship between the position offset obtained from the reference signal $I_{mr}$ and the position on the wafer stage WST (serving as a baseline check). Specifically, the wafer stage WST is initially moved by the wafer-stage driver 21 while an output LFG from the laser interferometer 22 is monitored, so that the reference mark FG is situated at the irradiation position for the transport light beams ±LF. Then, position detection is performed as described above in relation to the reference mark FG, yielding a position $\Delta FX_n$ of the reference mark FG in relation to the reference signal $I_{mr}$. The detected position-correction circuits $CA_n$ store in a memory (not shown) the detected position $\Delta FX_n$ for each wavelength along with the output LFG from the laser interferometer 22. If the optical system is adjusted so that positions of the interference pattern for each wavelength coincide completely on the wafer W (and the reference mark FG), $\Delta FX_n$ is identical to the respective wavelengths $\lambda_n$.

Next, the wafer stage WST is moved and the position of the grating mark MG on the wafer W is detected. The detected-position-correction circuits $CA_n$ take the difference of an output LMG of the laser interferometer 22 at the stage position and the output LFG representing the detected position of the reference mark FG previously stored in memory. The circuits add to this difference the value $\Delta X_n$, representing the detected position results for each wavelength $\lambda_n$, and subtract $\Delta FX_n$ to yield a value $\Delta X_n'$ which represents the detected position at each wavelength $\lambda_n$.

Based on the detected positions $\Delta X_n'$ and the relative level (depth) differences $\delta_n$ obtained in the manner described above, the averaging circuit SS calculates the final detected position of the grating mark MG, represented as $\Delta X$. Specifically, based on the principle that (a) level differences of the grating mark MG at (2m+1)/4 times the mid-resist wavelength of the detection light beam have very little detection error, (b) detected positions $\Delta X_n'$ at wavelengths $\lambda_n$ at which level differences $\delta_n$ in the mark are close to $\pi/2$ [rad] (equivalent to ¼ of the wavelength $\lambda_n$ of the detection light beam [m=0: the relative level difference $\delta_n$ is the result (remainder) of the true level difference divided by the half wavelength; there is no need to consider cases for m>0]) are weighted more, and (c) detected positions $\Delta X_n'$ at wavelengths $\lambda_n$ at which level differences $\delta_n$ in the mark are not close to $\pi/2$ [rad] are weighted less. The weighted average is obtained. The final detected position $\Delta X$ of the grating mark MG is influenced by the large weight of data obtained from detected light of wavelengths close to the level (depth) differences of the grating mark at multiples of (2m+1)/4, while an averaging effect is obtained for the multiple wavelengths. Thus, the method has a higher precision than conventional methods.

The following are examples of the weight $W_n$:

$$W_n = \cos[(\delta_n - \pi/2)] \quad (4)$$

or $$W_n = [1 + \cos[2(\delta_n - \pi/2)]]/2 \quad (5)$$

The weighted average is obtained from the following:

$$\Delta S = (\Sigma W_n \cdot \Delta X_n')/\Sigma W_n \quad (6)$$

The weight $W_n$ may be any quantity that is large for $\delta_n$ proximate to $\pi/2$, and that becomes smaller as $\delta n$ departs from $\pi/2$.

Next the principles of detecting level (depth) differences on the grating mark MG are discussed. FIG. 3 depicts an enlarged depth profile (i.e., level profile) of an exemplary grating mark MG. The width of concavities is denoted a, the width of convexities is denoted b, and the "level difference" between the concavities and convexities is denoted h. In FIG. 3 and the discussion to follow, and for the sake of simplicity, it is assumed that no resist is applied to the grating mark MG, i.e., that $\lambda_m = \lambda_n$. The amplitude reflectance in relation to detected light of wavelength $\lambda$ (where $\lambda$ is any one of the previously described $\lambda_n$ (n=1, 2, 3)) for the concavities and convexities is denoted as $\phi_a$ and $\phi_b$. The amplitude reflectances $\phi_a$ and $\phi_b$ express the amplitude of reflected light within a plane at the same position in the depth direction (i.e., up or down in FIG. 3). If the reference plane is considered to be the convexity surface of the grating mark MG, $\phi_a$, for example, becomes a factor corresponding to the round-trip optical path differential (phase difference) for the level difference h in addition to the amplitude reflectance for the concavity surface; i.e., the product of $\exp(4\pi i h/\lambda)$. The same is also true for $\phi_b$, but since the convexity surface of the grating mark MG is regarded here as the reference plane, the optical path differential (=0) factor is $\exp(4\pi i 0/\lambda)=1$. Therefore, if the phase difference between $\phi_a$ and $\phi_b$ is derived, the level difference h can be derived.

In general, the amplitude distribution in the diffraction direction for diffracted light generated from the concavities and convexities in FIG. 3 is expressed as a sine function. For example, the amplitude distribution of diffracted light generated from concavities having width a is expressed as follows for the period direction in the level difference pattern in FIG. 3:

$$\psi A(u) = \phi_a \cdot \sin(\pi a u)/(\pi u) \tag{7}$$

Here, u is expressed as follows with respect to the diffraction angle $\theta$:

$$u = \sin \theta / \lambda_n \tag{8}$$

Similarly, the amplitude distribution for diffracted light generated from convexities having width b is expressed as follows:

$$\psi B(u) = \phi_b \cdot \sin(\pi b u)/(\pi u) \tag{9}$$

In the foregoing equations, a value of u=0 (zero-order diffraction light) yields, respectively, $a \cdot \phi_a$ and $b \cdot \phi_b$.

In addition, the amplitude distribution for diffraction light from a pattern consisting of a periodic array of concavities and convexities with pitch P as in FIG. 3 is expressed as follows:

$$\psi(u) = [\psi A(u) + \psi B(u)] \cdot \exp(\pi i P u) \cdot P_{l,r}(u) \tag{10}$$

$$P_{l,r}(u) = \sin(l\pi P u)/\sin(\pi P u) \tag{11}$$

wherein l is the repetition count (integer) of the periodic grating mark MG.

In deriving Equation (10) the center of the concavities was taken as the diffraction-light phase reference, but, of course, it is also possible to use the center of the convexities as well for such purpose.

In the above, $P_{l,r}(u)$ represents what is referred to as a diffraction grating "period term." If the repetition count l on the grating mark MG is greater, $P_{l,r}(u)$ has a non-zero value of 1 only when u=j/P (where j is an integer corresponding to the j-order diffraction light). In virtually all other cases the value of $P_{l,r}(u)$ is 0. This invention employs only zero-order diffraction light and Nth-order diffraction light from the grating mark MG, so it is acceptable to assign a constant value of 1 to $P_{l,r}(u)$. In addition, the expression $\exp(\pi i P u)$ in Equation (10) has a value of 1 for zero-order diffraction light (u=0) and a value of $(-1)^N$ for $\pm$Nth-order diffraction light (u=$\pm$N/P). Thus, the following equations express zero- and Nth-order diffraction light, $\psi 0$ and $\psi N$, generated from the grating mark MG as shown in FIG. 3, as follows:

$$\psi 0 = a \cdot \phi_a + b \cdot \phi_b \tag{12}$$

$$\psi N = a' \cdot \phi_a + (-1)^N \cdot b' \cdot \phi_b \tag{13}$$

$$a' = P \cdot \sin(N\pi a/P)/\pi \tag{14}$$

$$b' = P \cdot \sin(N\pi b/P)/\pi \tag{15}$$

Figure 8:
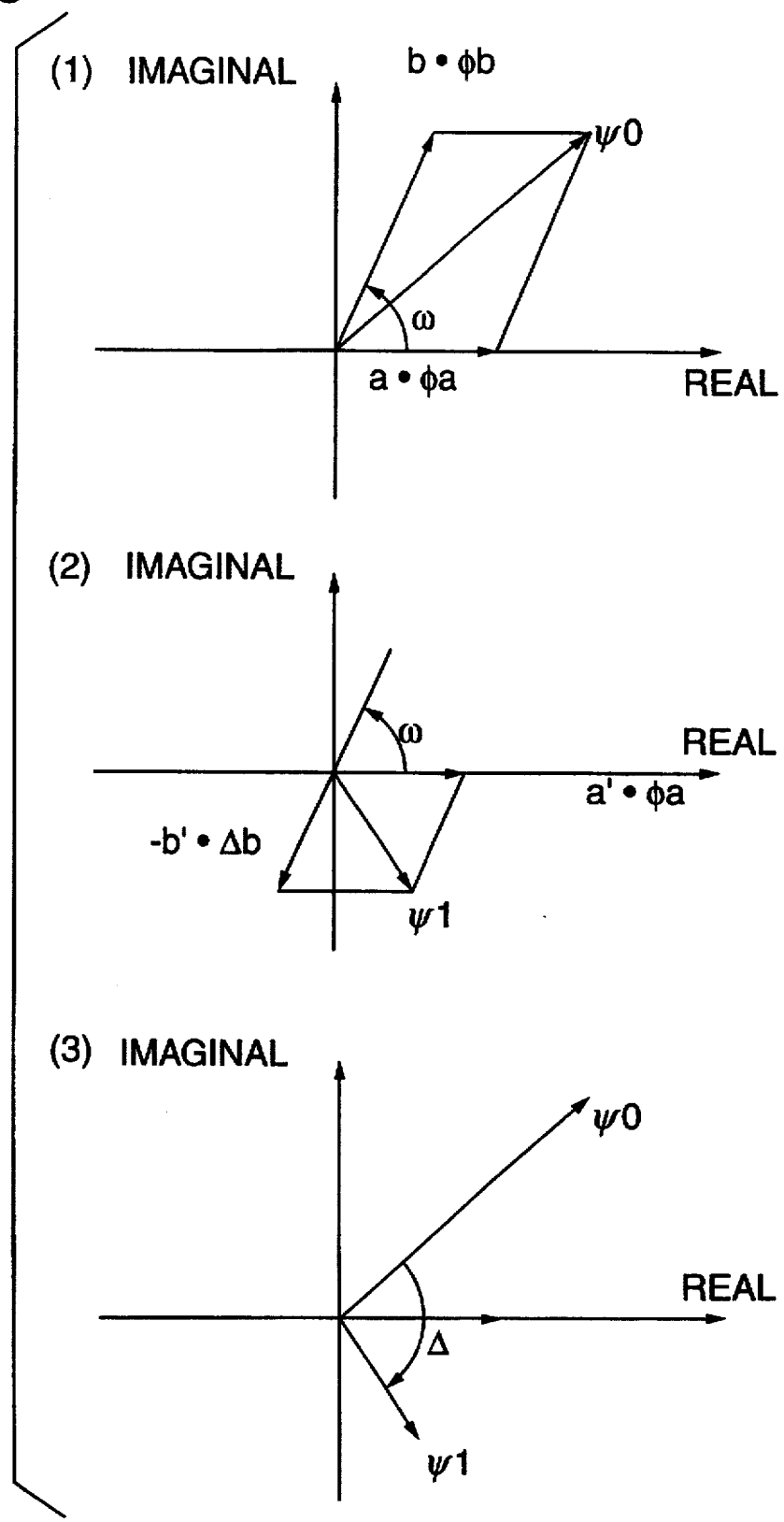
FIG. 8 provides three plots showing the process by which diffraction light amplitudes $\psi 0$ and $\psi N$ are derived from amplitude reflectances $\phi_a$ and $\phi_b$ using a complex-number polar coordinate system. The first (top) plot shows the determination of zero-order diffraction light amplitude $\psi 0$; the second (middle) plot shows the determination of primary diffraction light amplitude $\psi 1$; and the third (bottom) plot depicts $\psi 0$ and $\psi 1$ from the first and second plots on the same coordinate system.

FIG. 8 shows how diffraction-light amplitudes $\psi 0$ and $\psi N$ and amplitude reflectances $\phi_a$ and $\phi_b$ are derived on a complex-number polar coordinate system. In FIG. 8, for the sake of simplicity, $\phi_a$ is construed as a real number (on the Real axis). But, if the phase difference between $\phi_a$ and $\phi_b$ (assuming $4\pi h/\lambda = \omega$) is unchanging, the result in which $\phi_a$ is derived as a complex number is unchanged. In FIG. 8, for the sake of simplicity, only the condition of N=1 is illustrated, but the following argument also applies to values of N$\geq$2.

Plot (1) of FIG. 8 illustrates the determination of a zero-order diffraction-light amplitude $\psi 0$ from amplitude reflectances $\phi_a$ and $\phi_b$. Plot (2) of FIG. 8 illustrates the determination of a primary diffraction-light amplitude $\psi 1$ from amplitude reflectances $\phi_a$ and $\phi_b$. As stated previously, the phase difference between the amplitude reflectances $\phi_a$ and $\phi_b$ is expressed by $\omega$. Plot (3) of FIG. 8 expresses $\psi 0$ and $\psi 1$ from plots (1) and (2) of the same figure on the same polar coordinate system. The phase difference $\Delta$ between $\psi 0$ and $\psi 1$ in the figure (i.e., the phase difference between zero-order diffraction light and primary diffraction light) is equal to half of the phase difference between the light quantity signals $I_{An}$ and $I_{Bn}$ (in other words, $\Delta_{Bn}$ minus $\Delta_{An}$) from the combined light beams An and Bn shown in FIG. 5, FIG. 6, and FIG. 7. In other words, the quantity can be measured from light-quantity signals $I_{An}$ and $I^{Bn}$. Of course, this is true not only for N=1 but for any value of N ($\psi N$).

The magnitude ratio of $\psi N$ to $\psi 0$ ($|\psi N|$:$|\psi 0|$) can be measured from the light-quantity signals $I_{An}$ and $I_{Bn}$ of the combined light beams. The maximum values $AMAX_n$ and $BMAX_n$ of the two signals $I_{An}$ and $I_{Bn}$ represent the intensity when $\psi 0$ and $\psi N$ have amplitudes added in the same phase, while the minimum values $AMIN_n$ and $BMIN_n$ represent the intensity when $\psi 0$ and $\psi N$ have amplitudes added in inverse phase. Therefore, the following equations apply:

$$AMAX_n = BMAX_n = (|\psi 0| + |\psi N|)^2 \tag{16}$$

$$AMIN_n = BMIN_n = (|\psi 0| - |\psi N|)^2 \tag{17}$$

In addition, the contrast $\gamma$ of the two signals is expressed as follows:

$$\gamma = (AMAX_n - AMIN_n)/(AMAX_n + AMIN_n) \tag{18}$$

$$= 2 \cdot |\psi 0| \cdot |\psi N|/(|\psi 0|^2 + |\psi N|^2)$$

Therefore, if the contrast $\gamma$ is measured, the ratio $\beta$ can be found from Equation (18) as follows:

$$|\psi N| = \beta \cdot |\psi 0| \tag{19}$$

$$\beta = [1 \pm (1-\gamma^2)^{1/2}]/\gamma \qquad (20)$$

The ± in Equation (20) cannot be determined unconditionally. But, since the intensity of Nth-order diffraction light is generally less than the intensity of zero-order diffraction light, the minus sign is used. As a result, it is possible to express ψN as follows:

$$\psi N = \beta \cdot \psi 0 \cdot \exp(i\Delta) \qquad (21)$$

When $\Delta$ and $\beta$ are determined for the equations above, amplitude reflectances $\phi_a$ and $\phi_b$ of the periodic level-difference patterns can be derived from diffraction-light amplitudes ψ0 and ψN by following backwards the process used to derive diffraction-light amplitude from amplitude reflectance. Specifically, the simultaneous equation of Equations (12) and (13) needs to be solved, based on the known parameters.

In the processing of semiconductor integrated circuits, pattern linewidth control is generally excellent. Consequently, widths a and b of concavities and convexities, respectively, in the grating mark MG are nearly always at design value, or, in essence, are already known. Moreover, a' and b' calculated from the widths a and b of the concavities and convexities are also known. Thus, the only unknown variables (uncalculated variables) in the simultaneous equation consisting of Equations (12) and (13) are $\phi_a$ and $\phi_b$. Consequently, the simultaneous equation can be solved for $\phi_a$ and $\phi_b$. We obtain the following (with Equation (21) substituted in ψN):

$$\phi_a = [b' \cdot \psi 0 - (-1)^N \cdot b \cdot \psi N]/C \qquad (22)$$

$$\phi_b = (a' \cdot \psi 0 - a \cdot \psi N)/C \qquad (23)$$

wherein $C = a \cdot b' - (-1)^N \cdot a' \cdot b$.

In Equations (22) and (23) the phase of ψ0 is not known. But, since it is enough to know as the final result the phase difference (=ω) between $\phi_a$ and $\phi_b$, the phase of ψ0 (the angle with the Real axis) can be set to any value.

Accordingly, one can determine the values (as complex numbers) of $\phi_a$ and $\phi_b$ from Equations (22) and (23). In addition, the phases ($\omega_a$ and $\omega_b$) for both the real components and the imaginary components of $\phi_a$ and $\phi_b$ can also be found. The phases can be found as follows:

$$\omega_a = \tan^{-1}[Im(\phi_a)/Re(\phi_a)] \qquad (24)$$

$$\omega_b = \tan^{-1}[Im(\phi_b)/Re(\phi_b)] \qquad (25)$$

In addition, the phase difference ω between $\phi_a$ and $\phi_b$ can be found as the difference $\omega_b - \omega_a = \omega$. The phase difference ω can have a maximum value as high as 4π[rad], but given the periodicity of the trigonometric function ($\tan^{-1}$), if the value of ω exceeds 2π, ω−2π should be taken as ω. When the value of ω is negative, ω+2π should be taken as ω.

This phase difference ω corresponds to the round-trip optical-path difference (phase difference) of the level difference h as discussed above, with the following relationship:

$$\omega = 4\pi h/\lambda; \quad h = \omega \cdot \lambda/(4\pi) \qquad (26)$$

With the above, the final level difference h is determined. However, because of the foregoing method of determining ω, the level difference h here falls between the range of 0 and λ/2. In other words, the value h (hereinafter h') in relation to the true level difference should be taken as the result (remainder) of dividing the true level difference by the half wavelength of the detected light beam.

The foregoing explanation refers to a mark that is not coated with resist, as in FIG. 3. However, the same reasoning applies essentially unchanged to marks that are coated with a resist, glass (PSG), or other transparent film. The foregoing reasoning presumes a multiplexed interference between the transparent film and the mark surface for the amplitude reflectances expressed as $\phi_a$ and $\phi_b$. The wavelength λ in Equation (26) may be construed as the wavelength in the transparent film (the value of the ambient wavelength divided by the refractive index of the transparent film). Owing to the form of the resist surface and the effects of multiplexed interference, the measured level difference invariably differs from the real mark level difference. However, what affects the position-detection value of zero-order light and Nth-order light is the level difference obtained from the phase difference between zero-order light and Nth-order light, a value that includes the effects of resist-surface profile and multiplexed interference. Thus, there is no problem in using the level-difference measurement value in position estimations.

In this embodiment, the level difference on the grating mark MG is measured, based on the principles discussed above. In other words, the phase-difference-detection circuits $SA_1$, $SA_2$, and $SA_3$ in FIG. 4 first calculate $\Delta$, half of the difference between phase differences $\Delta A_n$ and $\Delta B_n$ of light-quantity signals $I_{An}$, $I_{Bn}$ with respect to the reference signal $I_{ms}$, the values of which are obtained at the position-detection time. Next, the phase-difference-detection circuits $SA_1$, $SA_2$, and $SA_3$ employ peak-hold circuits and bottom-hold circuits (not shown) to detect the maximum values $AMAX_n$ and $BMAX_n$ and the minimum values $AMIN_n$ and $BMIN_n$ for both signals in order to calculate the contrast γ for each signal. The contrast γ is equal for both signals unless there is significant asymmetry in the level-difference pattern. But, if the values differ, the average value is used.

The phase-difference-detection circuits $SA_n$ then calculate the ratio β of the magnitude ψN to ψ0 from the contrast γ and Equation (20), and calculate the correct relationship (as a complex number) between ψN and ψ0 from β, the phase difference Δ, and Equation (21).

In addition, the phase-difference-detection circuits $SA_n$ are provided with concavity and convexity widths a and b of the grating mark MG, which are supplied by operator input using a data-entry appliance (not shown). The period P is used to calculate the values a' and b' by using Equations (14) and (15). These values are substituted into Equations (22) and (23), and the (complex) values of $\phi_a$ and $\phi_b$ are calculated. Then the circuits calculate the phases $\omega_a$ and $\omega_b$ for $\phi_a$ and $\phi_b$ using Equations (24) and (25), with the difference ω calculated as described previously.

It is also possible, as stated earlier, to calculate the level difference h' from the phase difference ω by using Equation (26). Actually, the averaging circuit SS determines the weights for the weighted average of the detected positions $\Delta X_n'$ of each respective wavelength according to the detected-position-correction circuits $CA_n$, based not on the level difference itself, but on the phase magnitude of the level difference with respect to each detected wavelength. Accordingly, it is preferable to treat the output values from the phase-difference-detection circuits SAn as representing that phase magnitude rather than the level difference h'. This phase magnitude δ is half of the round-trip phase magnitude ω for the level difference h' (δ=ω/2). This phase magnitude δ is also the result of dividing the true phase magnitude by the phase difference (π), which corresponds to half of the wavelength of the detected light.

The averaging circuit SS may determine the weights of the weighted average using the level difference itself. In this instance, the output values from the phase-difference-detection circuits $SA_n$ may be construed as the level difference h'. However, the level difference h' calculated according to Equation (26) is affected by the refractive index of the resist and other factors (the refractive index proximate to the surface of the grating mark), when the grating mark MG is coated with resist or the like. But, since the relationship $\delta=\omega/2$ is unaffected by the refractive index of the resist, it is best to use the phase magnitude $\delta$ for weighting the weighted average.

However, when the level difference h' is calculated according to Equation (26), if the vacuum wavelength is used as wavelength $\lambda$, the value of h' does not accurately represent the level difference, although it does eliminate the effects of the refractive index of the resist, as well as the phase magnitude $\delta$. The averaging circuit SS at this time selects the detected position for the wavelength $\lambda_n$ having a detected level-difference h' closest to $\lambda_n/4$.

In the level-difference detection described above, an example of the grating mark MG as provided in FIG. 3 is depicted as a mark having vertical sidewalls of the concavities and convexities. In fact, high-precision position detection (level-difference detection) is also possible with marks comprising tapered sidewalls. In such instances, the various widths a, b for the input concavities and convexities, respectively, no longer abide by a+b=P; nevertheless, the level differences of the mark can be calculated in the same manner as described above, based on these values a and b.

As is clear from the discussion above, this first embodiment comprises a level-difference detection system based on phase-difference-detection circuits $SA_n$, a position-detection system based on detected-position-correction circuits $CA_n$ that correspond to each of the phase-difference-detection circuits $SA_n$, respectively, and a calculation system based on the averaging circuit SS.

As discussed in detail above, the position-detection method and apparatus associated with this first embodiment employ the "zero-Nth-order detection method" as an interference-type alignment method. The method and apparatus are able to detect the position of the grating mark MG in the same manner as done conventionally based on two light-quantity signals (light-quantity signals An and Bn of the first and second combined light beams). The method and apparatus according to this embodiment are also able to calculate the level difference (depth profile) of an alignment mark, or, more accurately, the relative level difference (which has a great impact on detection precision), as the remainder in relation to half of the incident-beam wavelength (mid-resist wavelength). Consequently, it is possible to readily determine whether the level difference of the alignment mark subject to position detection conforms to the condition of the detected light for each respective wavelength being (2m+1)/4 times the mid-resist wavelength, or, to the condition of the mid-resist wavelength being 4/(2m+1) times the level difference of the alignment mark subject to position detection.

Accordingly, detection light beams with multiple wavelengths can be used, in which instance the position-detection and relative level-difference calculations are performed for each wavelength. By carrying out position detection for the calculated level differences close to ¼ of the (mid-resist) wavelengths according to the interference-type alignment method, it is possible to perform very high-precision position detection even with asymmetrical position-detection marks. This embodiment as described above included an example in which, prior to the selection of one wavelength by the signal-selection (averaging) circuit SS, the respective phase-difference detection circuits $SA_n$ determine the detection positions $\Delta X_n$ of the grating mark MG at respective wavelengths. Then, the selection circuit SS selects the final detected position $\Delta X$ as the particular detected position $\Delta X_n$ having a mid-resist wavelength that is closest to being a multiple of 4/(2m+1) of the grating mark subject to position detection, based on the relative level difference $\delta_n$ calculated by the respective phase-difference detection circuits $SA_n$. This invention is not limited to such an example. Alternatively, the respective phase-difference detection circuits $SA_n$ may calculate only relative level differences $\delta$, and output phases $\Delta A_n$ and $\Delta B_n$ between $\delta$ and respective input signals to the signal-selection circuit SS; the signal-selection circuit SS, in turn, calculates the detected position of the grating mark MG based on the $\Delta A_n$ and $\Delta B_n$ after selection of the wavelength $\lambda_n$.

This first embodiment described above also included an example in which position detection was performed by irradiating the alignment mark (grating mark MG) simultaneously with light beams of multiple wavelengths. However, the present invention is not so limited. For example, the grating mark MG can be irradiated at different times with light beams of different wavelengths, resulting in component beams An and Bn for each wavelength being received at different times. In this instance, there is no need for separate detectors for each wavelength to receive the first and second combined light beams, and dichroic mirrors 16 and 18 in the light-receiving section can be eliminated. This configuration would have only a single phase-difference-detection circuit SA, which would be operable to process multiple wavelength signals, since the light-quantity signals for each wavelength are input in time-division fashion. Such a configuration would simplify the light-receiving optical system and the signal-processing system and would advantageously substantially simplify the overall configuration of the exposure apparatus.

However, in the simplified configuration described above, the wavelength-selection filter 12 would need to be removed from the light-receiving section of the reference signal Ims, resulting in light beams of all wavelengths being incident upon the reference grating SG. The reason is that, with the incidence of only light beams with a single particular wavelength, when a wavelength is not irradiated (at the time of detection for another wavelength), it becomes impossible to obtain a reference signal $I_{ms}$. Moreover, in this instance, there is no need for the interference pattern positions of various wavelengths to strictly coincide on the reference grating SG. The correction amount $\Delta FX_n$ for each wavelength $\lambda_n$ needs to be determined in order to conduct correction, as described previously. In order to irradiate the light beams in time-division sequence, it is desirable to employ as a light source a semiconductor laser that can readily be turned on and off in brief intervals.

The method of the first embodiment in which light beams with multiple wavelengths are simultaneously irradiated and separated by wavelength during the light-receiving process offers the advantage of reducing the measurement time, since detection is performed simultaneously for each wavelength.

In the first embodiment for level-difference detection as described above, the ratio of the magnitude of $\psi N$ to $\psi 0$ is calculated from the contrast in the light-quantity signals $I_{An}$ and $I_{Bn}$. However, this invention is not so limited. For example, it is also acceptable to calculate the light-quantity ratio of Nth-order diffraction light to zero-order diffraction light and determine the square root of such a ratio.

As a method for detecting the light-quantity ratio of Nth-order diffraction light to zero-order diffraction light, it would be acceptable, for example, to place a shutter in the vicinity of the light-beam selector 6 in FIG. 1 that is capable of shutting off light from at least one of the transport light beams ±LF. After the actual position detection ends or before it begins, the shutter shuts off either the +LF or −LF beam, at which time the intensity ratios of the light-quantity signals $I_{An}$ and $I_{Bn}$ obtained from the detectors 17a, 17b, 19a, 19b, 20a, 20b can be calculated. When so done, the beams incident on the grating mark MG have no beat in respective light-quantity signals $I_{An}$ and $I_{Bn}$, since there is only one beam for each wavelength, and thus comprise DC signals. If the shutter shuts off light from, e.g., the transport light beam −LF, only zero-order diffraction light from the transport light beam +LF derived from the grating mark MG is incident on the detectors 17a, 19a, and 20a. Also, the light-quantity signals IAn indicate the light quantity for zero-order diffraction light at each wavelength, while only primary diffraction light from the transport light beam +LF derived from the grating mark MG is incident on the detectors 17b, 19b, and 20b, with the light-quantity signals IBn indicating the light quantity for primary diffraction light at each wavelength.

Thus, when the light quantities of zero-order diffraction light and Nth-order diffraction light are measured directly in this manner, it is possible to measure the magnitude ratio of $\psi N$ to $\psi 0$ more accurately than the previously described calculation method based on contrast, which retains uncertainty with regard to the sign determination in Equation (20).

With this embodiment, in order to simplify description, a rotating radial grating RRG was used as a frequency shifter. The invention is not limited to this configuration. It is also acceptable to use as a frequency shifter two audio-optical modulators (AOMs), and to use as a light source a first Zeeman laser light source oscillating at a central frequency of $\lambda_1$ and a second Zeeman laser light source oscillating at a central frequency of $\lambda_2$. In addition, the various dichroic mirrors may be exchanged for prisms or other dispersion elements.

In addition, in this embodiment, the detection light had three wavelengths. However, it is acceptable to use detection light with an arbitrary multiple of wavelengths; there is no need to be limited to three wavelengths. The configuration can be readily adapted to a larger number of wavelengths by increasing the number of dichroic mirrors 2, 3 and 16, 18 in FIG. 1, and by increasing the number of detectors.

The embodiment described above utilizes the heterodyne method whereby frequencies are varied in the incident beam ±LF for position detection. The relative-scanning system carried out relative scanning of the grating mark MG and the interference patterns in the period direction. The embodiment also utilized a system (i.e., a rotating radial grating) for taking multiple pairs of coherent light beams with different frequencies and varying the frequencies of the first and second light beams slightly, then passing the interference patterns formed thereby across the grating mark in the period direction at the same speed. The invention is not limited to this configuration. For example, it is acceptable to use the same frequencies for the incident beam ±LF (using the homodyne method), and to adopt a relative-scanning system for performing relative scanning of the grating mark and the interference patterns in the period direction utilizing a method in which the wafer stage WST is scanned at a position-detection time in the detection direction instead. In such an instance, the various signals form sine waves with equal beat frequencies proportional to the scanning speed of the wafer stage WST. This makes it possible to carry out the same detection as delineated previously. The homodyne method eliminates the frequency shifter (rotating radial grating RRG or the like), thereby beneficially simplifying the transport-light optical system.

On the other hand, the heterodyne method allows the wafer stage WST to stop during detection. In addition to the heterodyne-based high signal-to-noise (S/N) effect, the heterodyne method beneficially eliminates a control mechanism for scanning the wafer stage WST at the same speed. In addition, the heterodyne method can beneficially average any flutter (mainly air flutter) in the output of the laser interference system 22 that monitors the position of the wafer stage WST during detection.

This embodiment enables not only grating mark positions but also their relative level differences to be detected in "interference type alignment" at multiple frequencies. Relative level differences are weighted accordingly for a weighted average for detected positions at respective wavelengths, which enables a weighted average to be produced. Detected positions, to the degree that they are optimum or possess little detection error, are weighted more. Consequently, position detection of grating marks is provided at higher precision than in the case of a simple average, a superior benefit not available previously.

Second Embodiment

Figure 9:
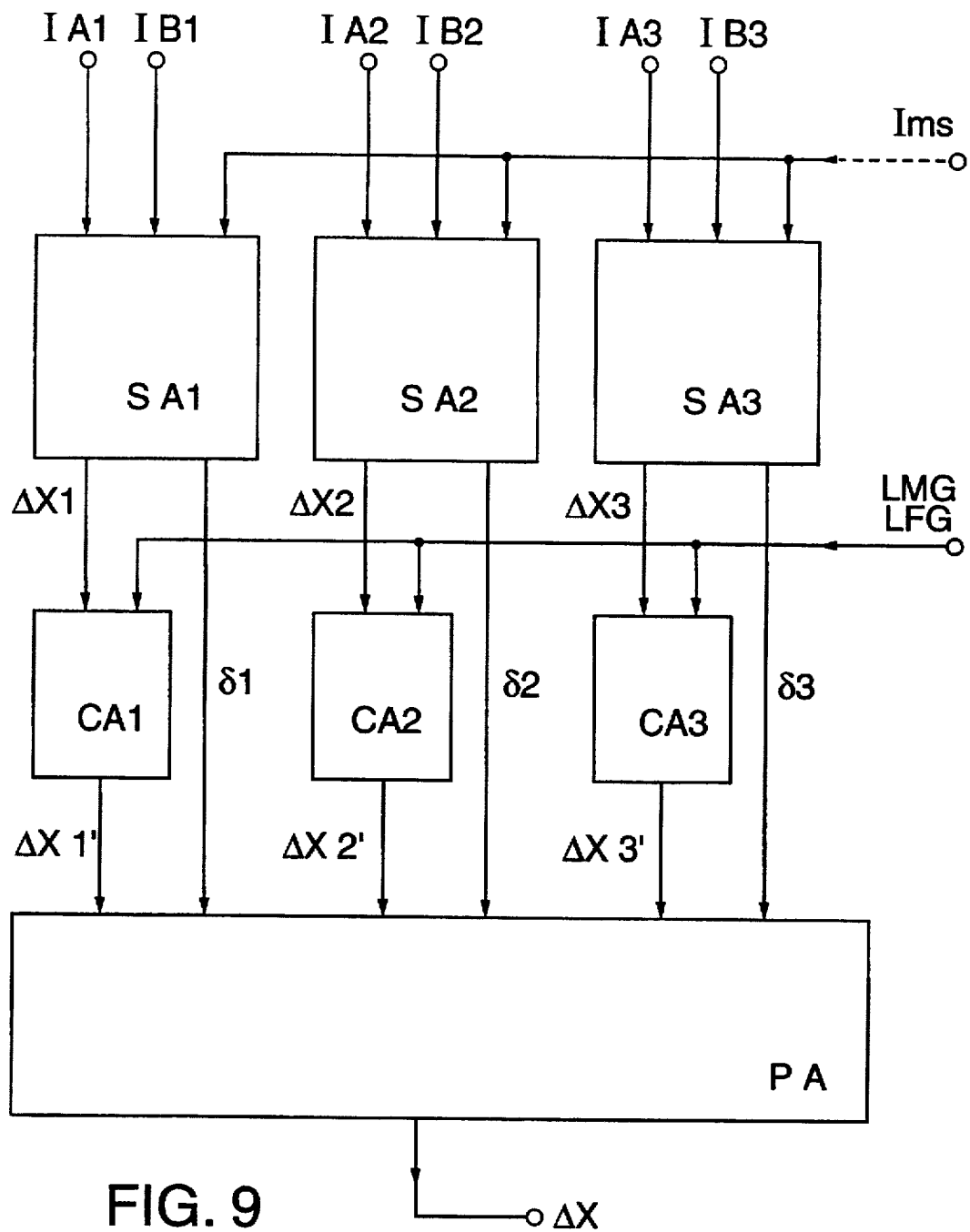
FIG. 9 is a block diagram showing certain features of an exemplary position-detection circuit (comprising a detected-position-estimation circuit PA) included in the position-detection apparatus of the second embodiment.

This embodiment is similar to the first embodiment except that the averaging circuit SS in the first embodiment (FIG. 4) is replaced with a detected-position-estimation circuit PA (FIG. 9) which performs calculations as described below. The scheme shown in FIG. 9 is otherwise similar to that shown in FIG. 4.

The detected-position-estimation circuit PA calculates the final detected position of the grating mark MG, represented as $\Delta X$.

Also, in contrast to the function of the averaging circuit SS in the first embodiment, the detected-position-estimation circuit PA in the second embodiment uses the relative level difference for each wavelength calculated by the phase-difference detection circuits $SA_n$ not as a level difference itself, but rather as the phase magnitude of the level difference with respect to each detected wavelength. Accordingly, it is referable to treat the output values from the phase-difference detection circuits $SA_n$ as representing that phase magnitude rather than the level difference h'. As described in the first embodiment, this phase magnitude δ is half of the round-trip phase magnitude ω for the level difference h' (δ=ω/2). This phase magnitude δ is also the result of dividing the true phase magnitude by the phase difference (π), which corresponds to half of the wavelength of the detected light.

The detected position-estimation circuit PA may also make use of the level difference itself as the relative level difference. In this instance, the output values from the phase-difference detection circuits $SA_n$ may be construed as the level difference h'. However, the level difference h' calculated according to Equation (26) is affected by the refractive index of the resist, etc., when the grating mark MG is coated with resist or the like. But, since the relationship δ=ω/2 is unaffected by the refractive index of the resist, it is best to use the phase magnitude δ as the relative level difference.

This second embodiment is operable to estimate the final detected position $\Delta X$ using the detected-position estimation circuit PA. The determination is based on the detected positions $\Delta X_n'$ from the detected-position correction circuits $CA_n$ and the detected relative level differences $\delta_n$ from the phase-difference detection circuits $SA_n$ (FIG. 10).

Figure 10:
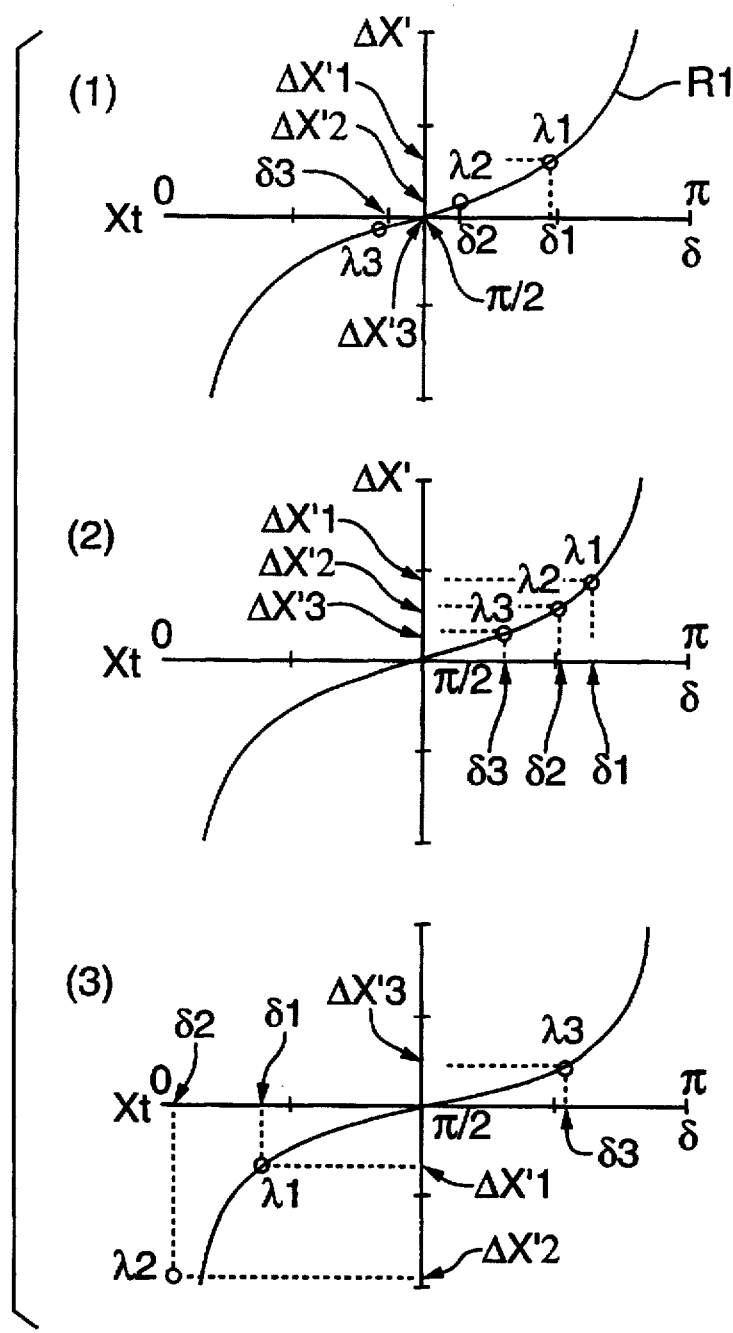
FIG. 10 provides three plots pertaining to the second embodiment, showing the relationship between detected positions $\Delta X_n'$ (vertical axis) at various wavelengths $\lambda_n$ and detected relative level differences $\delta_n$ (horizontal axis). The first (top) plot illustrates the relationship for an asymmetrical grating mark coated with resist having a reflectivity of 1.65 and with a level difference of 330 nm; the second (middle) plot illustrates the relationship for an asymmetrical (resist-coated) grating mark with a level difference of 160 nm; and the third (bottom) plot illustrates the relationship for an asymmetrical (resist-coated) grating mark with a level difference of 420 nm.

The three plots depicted in FIG. 10 illustrate the relationship between the detected position $\Delta X_n'$ (vertical axes) and the detected relative level difference $\delta_n$ (horizontal axis) for each wavelength $\lambda_n$. The detected position $\Delta X_n'$ coincides with a true mark position $X_t$ when the detected relative level difference $\delta_n$ is $\pi/2$ [rad] (i.e., $\lambda/4$). As the value of the detected relative level difference $\delta_n$ departs from $\pi/2$ [rad], the value of the detected position $\Delta X_n'$ grows in proportion to the difference ($\delta_n - \pi/2$).

The foregoing relationship may be expressed essentially as follows, as revealed by simulation results:

$$\Delta X_n' = \alpha \cdot \tan(\delta_n - \pi/2) + X_t \quad (27)$$

Here $\alpha$ is a parameter determined by the degree of asymmetry of the grating mark MG. If there is a high degree of asymmetry of the grating mark MG, the value of $|\alpha|$ increases; if there is a relatively degree of asymmetry, the value of $|\alpha|$ decreases. In actual grating alignment, the detection error with respect to the period P of the grating mark MG never exceeds $\pm P/N$. Nevertheless, the tangent function does diverge when the value of the detected relative level difference $\delta_n$ approaches 0 or $\pi$, and renders Equation (27) invalid within such ranges. However, for the approximate range ($0.1\pi < \delta_n < 0.9\pi$), the approximation in Equation (27) yields satisfactorily precise results.

The estimation of the final detected position $\Delta X$ in this second embodiment is based on Equation (27). In actual position detection, the true mark position $X_t$ is unknown; as a result, Equation (27) contains two unknowns: $\alpha$ and $X_t$. Accordingly, if there are two detected wavelengths or more, it is possible to detect two or more pairs of $\Delta X_n'$ and $\delta_n$; this makes it possible to determine the values of $\alpha$ and $X_t$. In other words, $X_t$ may be calculated by setting up Equation (27) for only the number of detected wavelengths and solving the simultaneous equation. Ultimately, however, Equation (27) is an approximation equation that contains a certain amount of error in the detection values $\Delta X_n'$ and $\delta_n$. Therefore, the calculated value of $X_t$ also contains a certain amount of error and does not represent the "true" mark position. Thus, for the sake of convenience, the calculated value of $X_t$ will be referred to as an estimated detection position $\Delta X$.

Of course, the estimated detection position $\Delta X$ is much closer to the true mark position, and has a smaller error, than the detected positions in conventional grating-alignment methods. When there are three or more detected wavelengths, the least-squares method may be applied to the simultaneous equation to yield even greater precision in calculating $\Delta X$.

The first plot in FIG. 10 illustrates the relationship between the detected position $\Delta X_n'$ on an asymmetrical grating mark with a level (depth) difference of 330 nm. The grating mark is coated with a resist having a refractive index of 1.65, and a detected relative level difference $\delta_n$. The preferred wavelengths $\lambda_1$=633 nm, $\lambda_2$=690 nm, and $\lambda_3$=780 nm result in midresist values of 384 nm, 418 nm, and 473 nm, respectively. The optimum (mid-resist) wavelength for a level difference of 330 nm as in the first plot of FIG. 10 (i.e., the wavelength at which the detected relative level difference $\delta_n = \pi/2$) is a multiple of the mark level difference multiplied by $4/(2m+1)$, or 440 nm for a value of $m=1$. This wavelength is between the wavelengths $\lambda_2$ and $\lambda_3$. In contrast, the detected position $\Delta X_1'$ for the shorter wavelength $\lambda_1$ contains a larger element of detection error (signifying the difference from the true mark position $X_t$) than the detected positions for $\lambda_2$ and $\lambda_3$ ($\Delta X_2'$ and $\Delta X_3'$).

In this embodiment, $\alpha$ and $X_t$ in Equation (27) are calculated from $\Delta X_n'$ and $\delta_n$, with the calculated $X_t$ (more accurately, $\Delta X$) treated as the mark's final detected position.

In the first plot of FIG. 10, $\Delta X$ is the value of $\Delta X'$ for the curve (tangent function) R1, in which $\delta = \pi/2$.

Thus, it is desirable to apply the final detected-position estimation method in this embodiment under level-difference conditions where the optimum wavelength falls between $\lambda_1$ and $\lambda_3$. However, the final detected-position estimation method in this embodiment can also be applied to marks (mark level differences) where the optimum wavelength does not fall between $\lambda_1$ and $\lambda_3$, as shown in the second plot of FIG. 10.

The second plot of FIG. 10 shows the same relationship as in the first plot of FIG. 10 for an asymmetrical grating mark (coated with resist) exhibiting a level difference of 160 nm. In addition, the optimum (ambient) wavelength in this instance, with m=0, is 1.65×160×4=1,056 nm, which is longer than $\lambda_3$ (for a value of m=1, the optimum wavelength is 1.65×160×4/3=352 nm, which is shorter than $\lambda_1$). Thus, the detected relative level difference $\delta_n$ is greater than $\pi/2$ for each wavelength, which implies that the detected positions $\Delta X_n'$ are offset to the positive (+) side from the true mark position $X_t$ (the sign differs according to the orientation of the asymmetry). Thus, this embodiment can determine a detected position $\Delta X$ that is close to a true mark position $X_t$ even under level-difference conditions.

The third plot of FIG. 10 shows the same relationship as in the first plot for an asymmetrical grating mark (coated with resist) with a level difference of 420 nm. In addition, the optimum (ambient) wavelength in this instance, with m=2, is 1.65×420×4/3=924 nm, which is longer than $\lambda_3$. With m=3, the optimum wavelength is 1.65×420×4/5=554 nm, which is shorter than $\lambda_1$. The wavelength $\lambda_2$ is close to the value 1.65×420×4/(2m)=693 nm (m=2), which represents the worst-case wavelength (with detected relative level difference $\delta$ near zero) for this mark level difference. This indicates a large element of error for the detected position $\Delta X_2'$. The detected relative level difference $\delta_2$ is the result (0.0087) of multiplying the level difference (420 nm) by the refractive index (1.65)=693 nm for half the wavelength (690/2)=345 nm, multiplied by $\pi$ (yielding $0.0087\pi$). The value of $0.0087\pi$ is smaller than the previously noted $0.1\pi$. Moreover, it is not advantageous to use this $\delta_2$ in determining $\alpha$ and $X_t$ in Equation (27). Therefore, in this instance, $\alpha$ and $X_t$ are found from the detected results $\Delta X_1'$, $\delta_1$, $\Delta X_3'$, and $\delta_3$ for the two wavelengths $\lambda_1$ and $\lambda_3$. Despite these conditions, it is still possible, even in this instance, to calculate a final detected position $\Delta X$ that is close to the true mark position $X_t$.

The estimation of the final detected position $\Delta X$ in this embodiment can make use of light beams having two or more wavelengths for the detection light as described above. As shown in the third plot of FIG. 10, there is a risk that one wavelength may be a "worst-case wavelength." Thus, whenever possible, it is preferable to use light beams of at least three wavelengths.

As is clear from the foregoing description, this second embodiment comprises a level-difference detection system based on the phase-difference detection circuits $SA_n$, a position-detection system based on the detected-position correction circuits $CA_n$, corresponding to each of the phase-difference detection circuits $SA_n$, respectively, and a calculation system based on the detected-position-estimation circuit PA.

As discussed in detail in the first embodiment, the position-detection method and apparatus associated with this second embodiment also employ the "zero-Nth-order detection method" as an interference-type alignment method. With this embodiment, it is possible to detect whether the grating mark subject to position detection conforms to the ideal condition (including the sign) of $(2m+1)/4$ multiplied by the mid-resist wavelength for the detection light. It is also possible to detect how much the detected position is offset from the ideal condition.

In this embodiment, detection light beams with multiple wavelengths are used, as described at length in the first embodiment. The position detection and relative level difference calculations are performed for each wavelength. Based on the relationship between the detected position and the detected relative level difference, a detected wavelength (virtual wavelength) is estimated for which the detected level difference is expressed by the mid-resist wavelength multiplied by $(2m+1)/4$. In addition, a virtual position is estimated from this virtual wavelength, making it possible to obtain a virtual detected position for a grating mark of any level difference as though detected at the detected (mid-resist) wavelength represented by this level difference multiplied by $4/(2m+1)$.

This embodiment also offers the benefit of being able to carry out extremely high-precision position detection even for asymmetrical position detection marks.

This embodiment enables not only grating mark positions but also their relative level differences to be detected in "interference type alignment" at multiple frequencies. Thus, this embodiment is able to obtain position-detection values with high precision and very small detection error, as though aligned with the "optimum wavelength" in relation to that relative level difference. Consequently, position detection with extremely high precision is possible even with asymmetrical marks, a superior benefit not available previously.

Third Embodiment

Figure 11:
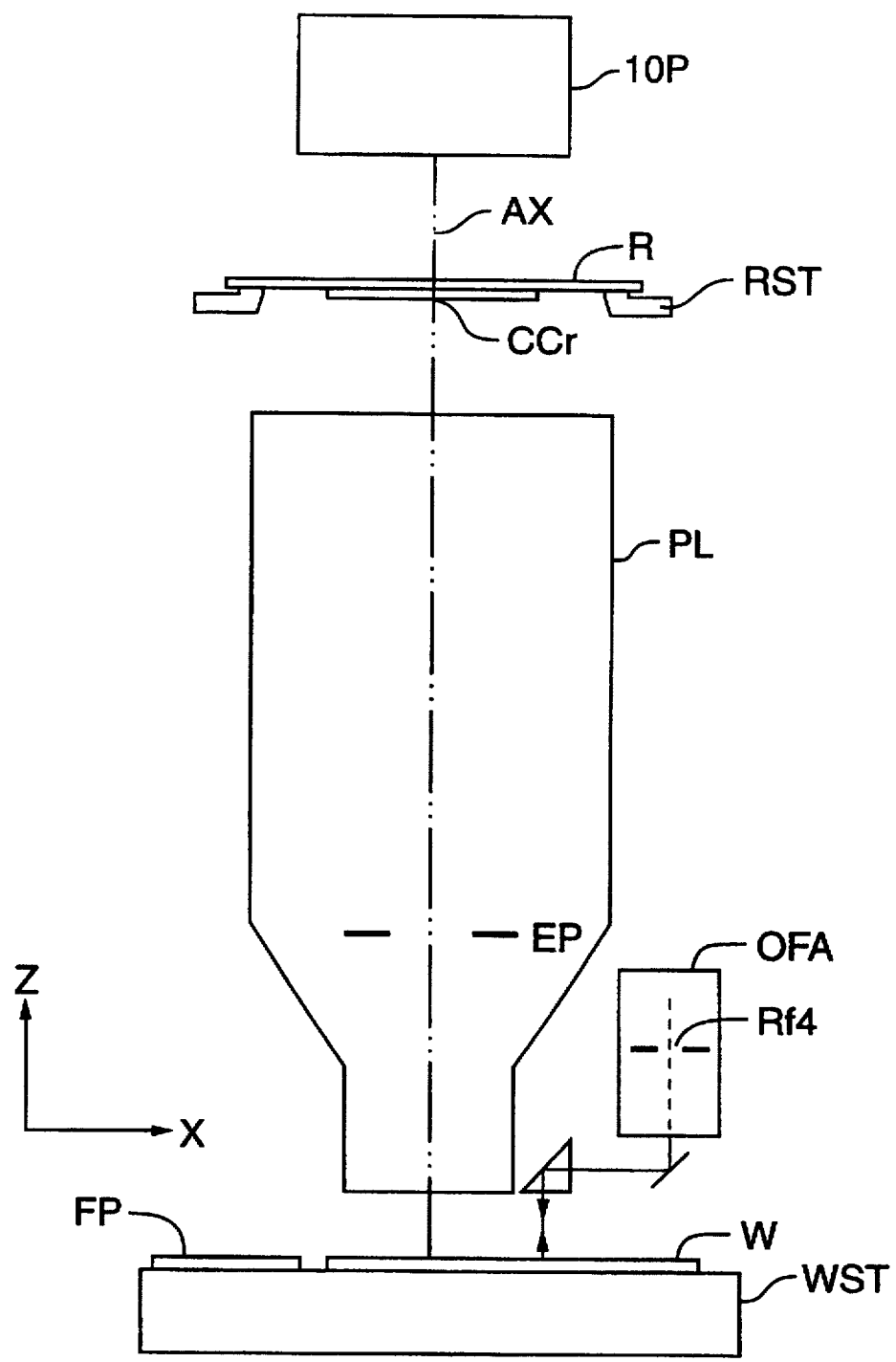
FIG. 11 is a vertical schematic depiction of certain relevant components of an exposure apparatus according to the third embodiment.

In describing this embodiment, reference is first made to FIG. 11. This embodiment exemplifies an exposure apparatus comprising a position-detection apparatus as described in the first embodiment. The position-detection apparatus is employed as a so-called off-axis alignment detection system (OFA).

The exposure apparatus shown in FIG. 11 comprises a reticle stage RST operable to hold the reticle R in a horizontal plane essentially orthogonal to the optical axis AX of the projection optical system PL. The exposure apparatus also comprises a wafer stage WST operable to hold the wafer W on a surface that is conjugate to the reticle R with respect to the projection optical system PL. The reticle R is illuminated by illumination light from an illumination system IOP (comprising a light source that is not shown). When the reticle R is aligned with a desired shot region on the wafer W and the reticle is illuminated, the circuit patterns defined on the reticle R are transferred to the respective shot region on the wafer W at a specified reduction factor (e.g., ¼) via the projection optical system PL.

The exposure apparatus of FIG. 11 includes an off-axis alignment detector OFA comprising a position-detection apparatus 100 as discussed above in the first embodiment. The off-axis alignment detector OFA irradiates a detection beam onto the wafer W in a plane located a specified distance from and parallel to the optical axis AX.

The reticle stage RST is configured for very fine movement in two dimensional directions X and Y by a reticle-stage driver (not shown). The reticle stage RST is also configured for very fine rotation around the optical axis AX.

The wafer stage WST is operable to move in two dimensions, as described in the first embodiment. The position coordinates for the wafer stage WST are measured by the laser interferometer 22 (see FIG. 1).

The wafer W is mounted to the wafer stage WST by an unillustrated θ stage and a wafer holder.

With this exposure apparatus, so-called baseline measurement is indispensable. After baseline measurement is performed, alignment marks consisting of grating marks made at a particular number of shot regions (e.g., ten locations) on the wafer W are detected. The so-called least-squares method is applied to the data on these detected positions and to data concerning the design of the marks so as to calculate the positional offset of the mark position in two dimensional directions X and Y, along with wafer rotation and wafer expansion or contraction. These calculation results are used along with design data for the various shot regions to calculate the shot-region array coordinates, which are then stored in a memory.

Actual exposure of the wafer W comprises a regimen of repeated stepping and exposure according to the "step-and-repeat" method. As stepping occurs, each shot is positioned at the exposure location (within the exposure field of the projection optical system PL). The wafer stage WST is moved in two dimensions based on the shot-array coordinates stored in a memory, and each exposure shot is aligned with reticle R.

Here, the baseline magnitude comprises the positional relationship in the X and Y directions between a projection point on the wafer side for a center CCr of the reticle R (the center CCr essentially coinciding with the optical axis AX) and a projection point on the wafer side for a detection center Rf4 of an off-axis-alignment detection system OFA. The positional relationship can be used to detect the amount of positional offset between a mark corresponding to a fiducial reference mark FG and the projection point of the detection center Rf4 via the off-axis-alignment detection system OFA itself. In addition, the positional relationship can be used to determine the coordinate position of the wafer stage WST at that time by detection via the laser interferometer 22. Thus, this third embodiment performs baseline measurement in the same manner as the first embodiment, and thereafter uses the position-detection method associated with the invention as described in the first embodiment to detect alignment-mark positions for particular shots on the wafer W.

In view of the foregoing, this third embodiment can also perform position detection with extremely high precision, even when the position-detection marks on the shot areas of the wafer W are asymmetrical. By statistical processing of such detection results based on the so-called least-squares method (see, e.g., U.S. Pat. No. 4,780,617, incorporated herein by reference), shot-region-array coordinates on the wafer W are calculated. Based on these coordinates, the reticle R and the respective shot regions on the wafer W are aligned. This results in improved alignment precision.

This third embodiment is described above as applying the position-detection apparatus used in the first embodiment to an off-axis-alignment detection system. Alternatively, it is possible to apply the position-detection method and apparatus of this invention in through-the-lens (TTL) alignment-detection systems as well as through-the-reticle (TTR) alignment-detection systems.

This embodiment enables not only grating-mark positions but also their relative level differences to be detected in "interference type alignment" at multiple frequencies. Consequently, since position detection takes places for detected light beams at the optimum wavelengths among multiple detection wavelengths, position detection with extremely high precision is possible, and the benefit of multiple wavelengths is maximized, a superior benefit not available previously.

Fourth Embodiment

Figure 14:
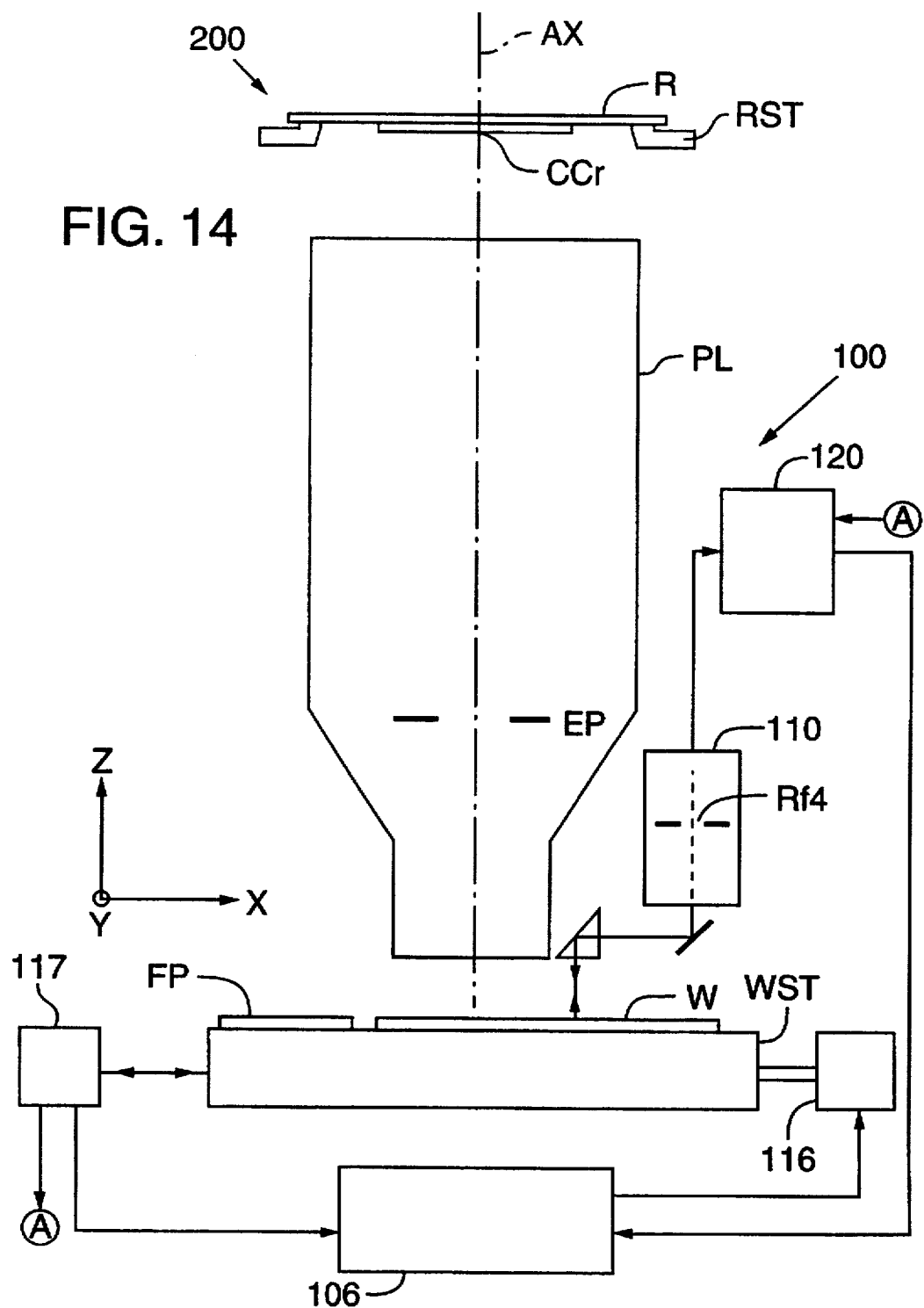
FIG. 14 is a vertical schematic depiction of certain relevant components of an exposure apparatus according to the fourth embodiment.

FIG. 14 shows certain principal components of an exposure apparatus 200 according to this embodiment. The exposure apparatus comprises a position-detection apparatus 100 as described above. The exposure apparatus 200 is a compact projection-type exposure apparatus (termed a "stepper") that operates according to the so-called step-and-repeat method.

The exposure apparatus 200 also comprises a projection optical system PL arranged on an optical axis AX in a vertical orientation (Z-axis orientation). A reticle stage RST holds a reticle R, which serves as a mask, on a horizontal plane located above the projection optical system PL and substantially orthogonal to the optical axis AX. A wafer stage WST holds a wafer W, which serves as a sensitive substrate, below the projection optical system PL. The position-detection apparatus 100 is connected to a main controller 106.

The projection optical system PL is telecentric on both sides and has a prescribed reduction ratio of, e.g., ¼.

The reticle stage RST is finely movable in two dimensional directions (X, Y) as well as very finely rotatable around an optical axis AX. These motions are effected by a reticle-stage driver (not shown).

The wafer stage WST is movable in two dimensions within a plane (the X-Y plane) orthogonal to the optical axis AX by a wafer-stage driver system 116 comprising a drive motor. The wafer W is retained by suction to the wafer stage WST. The coordinate position of the wafer stage WST is determined "on the fly" by a laser interferometer 117. The measurement results obtained by the laser interferometer 117 are input to the main controller 106 and used for feedback control of the wafer-stage driver 21. Measurement results obtained by the laser interferometer 117 are also input to a position-detection circuit 120.

The wafer stage WST includes a fiducial-mark (reference mark) plate FP. The fiducial-mark plate FP includes a reference mark FG (having the same period as a grating mark $MG_j$ on the wafer described later), with a line and space pattern defined in a chromium layer on a quartz glass surface (see FIG. 15). During actual position detection, the position of the reference mark FG is detected before the position of grating marks on the wafer W are detected in order to correct a variety of hardware-dependent errors, the details of which will be described later.

The wafer surface is assumed to be situated in a conjugate plane of the reticle R with respect to the projection optical system PL. As a result, whenever the reticle R is in alignment with a shot region on the wafer W and is illuminated by an exposure light, the circuit pattern defined by the reticle R is projected onto the wafer W. The projection is usually at a reduction ratio (e.g., ¼).

The main controller 106 is preferably a minicomputer (or microcomputer) that includes a central processing unit, ROM, and RAM, and provides control for the exposure apparatus 200 as a whole.

The position-detection apparatus 100 comprises a position-detection mechanism 110 and position-detection circuit 120, both of which being cooperatively operable to provide so-called off-axis alignment measurements.

Figure 15:
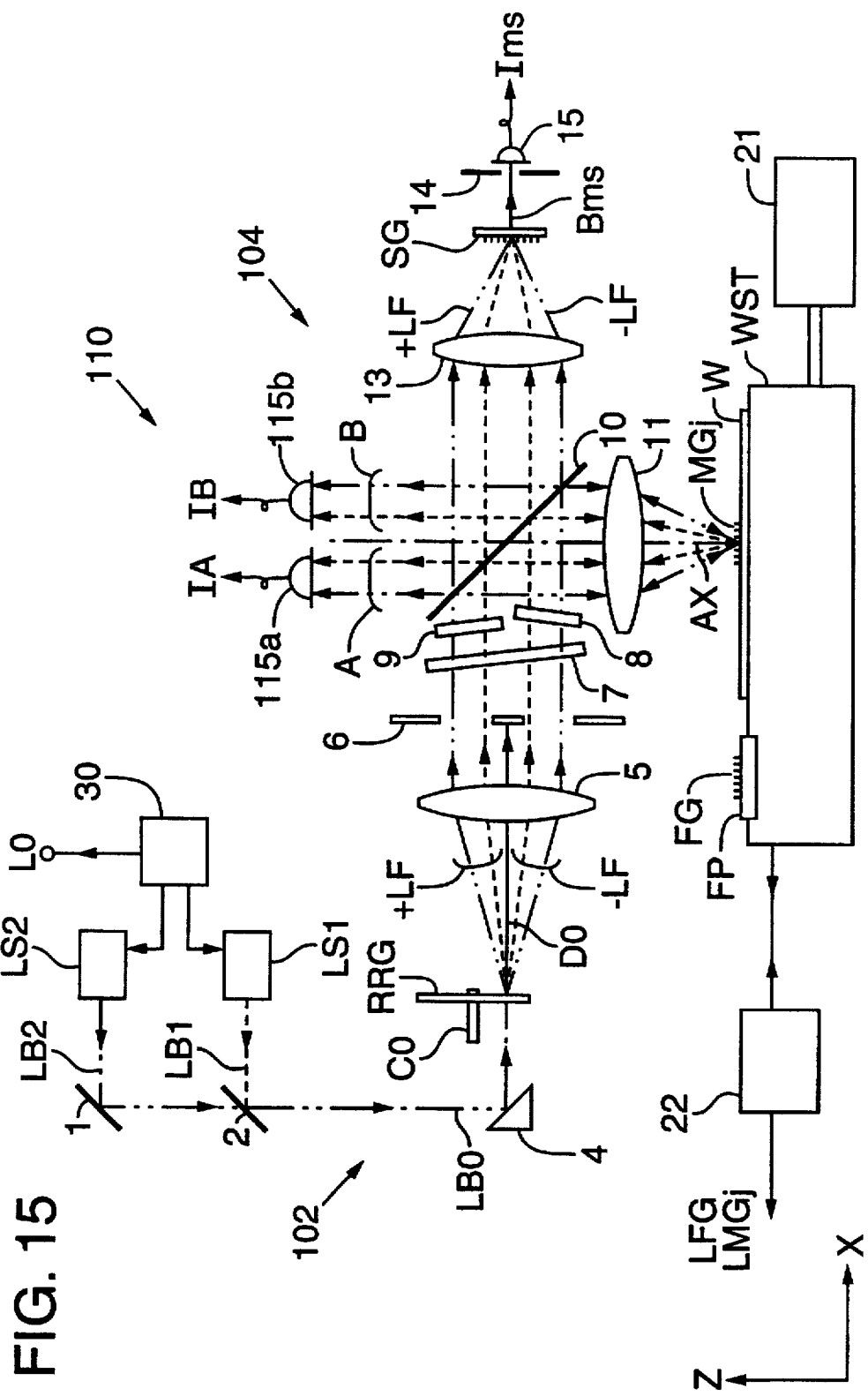
FIG. 15 is a schematic elevational diagram showing relevant components and light paths of the fourth embodiment of an apparatus according to the invention.

FIG. 15 provides an enlarged view of certain features of the position-detection mechanism 110, as well as the wafer stage WST and the wafer W. The position-detection mechanism 110 comprises a transport-light optical system 102 and a light-receiving optical system 104.

The transport-light optical system 102 comprises two laser light sources ("lasers") LS1 and LS2, a mirror 1, a dichroic mirror 2, a mirror 4, a rotating radial grating RRG, a collimator lens 5, a light-beam selector 6, adjustment optical systems 7, 8, and 9, a beam splitter 10, and an objective lens 11. These components are all as described above in the first embodiment.

The two lasers LS1 and LS2 emit laser beams $LB_1$ and $LB_2$, each with a different wavelength $\lambda_1$ and $\lambda_2$, respectively. For example, $\lambda_1=670$ nm and $\lambda_2=780$ nm. A laser power source 30 drives the lasers alternately, causing the lasers to alternately illuminate at a constant on-off frequency. The laser power source 30 also generates a laser-activation signal Lo indicating which laser is powered at any given instant. The on-off frequency of this alternating laser activation is no greater than 1/100 of the beat frequency 2·Δf, described herein.

The laser beams $LB_1$ and $LB_2$ are combined via the mirror 1 and the dichroic mirror 2 into a coaxial beam $LB_0$ that is incident upon and reflected by the mirror 4. The coaxial beam $LB_0$ is incident upon the rotating radial grating RRG, as described in the first embodiment.

As shown in FIG. 2, when the beam $LB_0$ is incident vertically on the grating RG, the beam generates primary diffraction beams $+D_{11}$ and $-D_{11}$ (broken lines) from the beam $LB_1$, and primary diffraction beams $+D_{12}$ and $-D_{12}$ (solid lines) from the beam $LB_2$, as described in the first embodiment. The diffraction angle $\theta_n$ is expressed as in Equation (1), above.

The primary diffraction beams generated from the rotating radial grating RRG receive a constant frequency bias Δf regardless of wavelength, as described in the first embodiment.

As shown in FIG. 15, the two wavelength components that have undergone frequency shift as described above (namely, the transport light beam +LF, comprising the positive primary diffraction beams $+D_{1n}$ (n=1, 2), the transport light beam −LF comprising the negative primary diffraction beams $-D_{1n}$ (n=1, 2), and zero-order light $D_0$) are refracted by the collimator lens 5 to propagate their principal rays in parallel to the light beam selector member 6, as described in the first embodiment.

The transport light beams ±LF pass through the adjustment optical systems 7, 8, and 9 before reaching the beam splitter 10. The adjustment optical systems 7, 8, 9 are structured and function as described above in the first embodiment. The beam splitter 10 functions as described in the first embodiment.

The wafer comprises plural grating (position-detection) marks $MG_i$ (i=1, 2, . . . ). Each of the grating marks $MG_i$ has a cross-sectional profile as shown in FIG. 3. In FIG. 15, one of such grating marks $MG_j$ is shown positioned at the incident location of the transport light beams ±LF.

Interference patterns formed by interference of the transport light beams $±D_{11}$ of wavelength $\lambda_1$ and interference patterns formed by interference of the transport light beams $±D_{12}$ of wavelength $\lambda_2$ are synchronized with activation of the lasers LS1 and LS2, and appear alternately with the same period and phase on the grating mark $MG_j$. Due to the frequency difference 2·Δf between the transport light beams +LF and −LF, these interference patterns are observed to move across the grating mark $MG_j$ at the same velocity in one direction (the period direction of the grating mark $MG_j$). This traversing velocity is proportional to the velocity V of the grating RG on the rotating radial grating RRG. Thus, the rotating radial grating RRG comprises a relative-scanning system.

The surface of the wafer W (including the grating mark $MG_j$) and the rotating radial grating RRG are both arranged in a conjugate relationship relative to a combining system including the collimator lens 5 and the objective lens 11. Accordingly, diffraction images formed by ±1 order diffraction light from the grating RG are formed on the grating mark $MG_j$ on the wafer W, while zero-order light $D_0$ is intercepted. Thus, light and dark images (comprising an interference-pattern intensity distribution) are formed at half the period of the grating RG.

The amplitude period $P_{if}$ (equal to twice the intensity-distribution period) of the interference patterns on the wafer W is 2/N multiplied by the period $P_{mg}$ of the grating mark $MG_j$, as described generally in the first embodiment. Also, first and second combined light beams are formed as described in the first embodiment. Further as described in the first embodiment, the first and second combined light beams represent beat light that has undergone intensity modulation with a frequency of 2·Δf corresponding to the frequency differential between the transport light beams ±LF.

In order for respective zero- and Nth-order diffraction light to be generated in the same direction, the interval $D_{L_n}$ on the Fourier transform plane (adjacent to the beam splitter) between the transport light beams ±LF at each frequency, with the focal length of the objective lens 11 represented as $F_0$, should be established with respect to the detection direction of grating mark $MG_j$ as set forth in Equation (2).

It is preferable for the transport light beams +LF, −LF to be incident at the same angle on the grating mark $MG_j$ as described in the first embodiment.

Hence, the position-detection apparatus 100 in this embodiment, like that in the first embodiment, employs a "zero-Nth-order method" of detection.

Correction of chromatic aberrations between the collimator lens 5 and objective lens 11 optical are corrected using the adjustment optical systems 7, 8, 9 as described in the first embodiment.

The light-receiving optical system 104 comprises the objective lens 11, a focusing lens (Fourier transform lens) 13, a reference grating SG, a spatial filter 14, photoelectric converters (detectors) 115a, 115b that serve as light receivers, and a detector 15 serving as a reference-signal generator.

The first and second combined light beams A, B generated from the grating mark $MG_j$, illuminated by interference patterns as previously described, pass through the objective lens 11 and the beam splitter 10 and reach the detectors 115a, 115b, which convert the incident light to corresponding electrical signals $I_A$, $I_B$. The electrical signals $I_A$, $I_B$ appear alternately as the light-beam signal of wavelength $\lambda_1$ and the light-beam signal of wavelength $\lambda_2$ in accordance with the alternating illumination of the lasers LS1 and LS2. While the interference patterns irradiate the grating mark $MG_j$, the signals at the respective wavelengths represent sine waves that vary with the same frequency as the beat frequency 2·Δf.

The light beams that pass from the collimator lens 5 to the beam splitter 10 (i.e., the transport light beams ±LF) pass through the focusing lens 13. In addition, the beams are irradiated on the reference grating SG in an overlapping manner. The reference grating SG is arranged in a conjugate position with rotating radial grating RRG relative to a "combining system" comprising the collimator lens 5 and the focusing lens 13. Consequently, a one-dimensional interference pattern of the primary beams $\pm D_{12}$ is also formed on the reference grating SG from the two-beam interference; this pattern moves at a speed corresponding to the beat frequency 2·Δf.

The ±1 order diffraction light generated from the reference grating SG proceeds in the same direction as the interference beam $B_{ms}$ as described in the first embodiment. The ±1 order diffraction light passes through the spatial filter 14, and is received at the detector 15. The photoelectric signal $I_{ms}$ from the detector 15 is also a sine wave with the same frequency as the beat frequency 2·Δf.

The signal $I_{ms}$ serves as the reference signal for the heterodyne method. The reference signal $I_{ms}$ is also alternately transformed by the alternating illumination of the lasers LS1 and LS2 into signals from the beam of wavelength $\lambda_1$ and from the beam of wavelength $\lambda_2$.

The position-detection mechanism 110 in this embodiment preferably comprises semiconductor lasers, which is preferably used with a shaping optical system as described in the first embodiment. The shaping optical system removes astigmatism arising between the lasers LS1, LS2 and the mirrors 1, 2 and provides each of the light-beam components of the combined beam $LB_0$ with substantially identical diameters.

Figure 16:
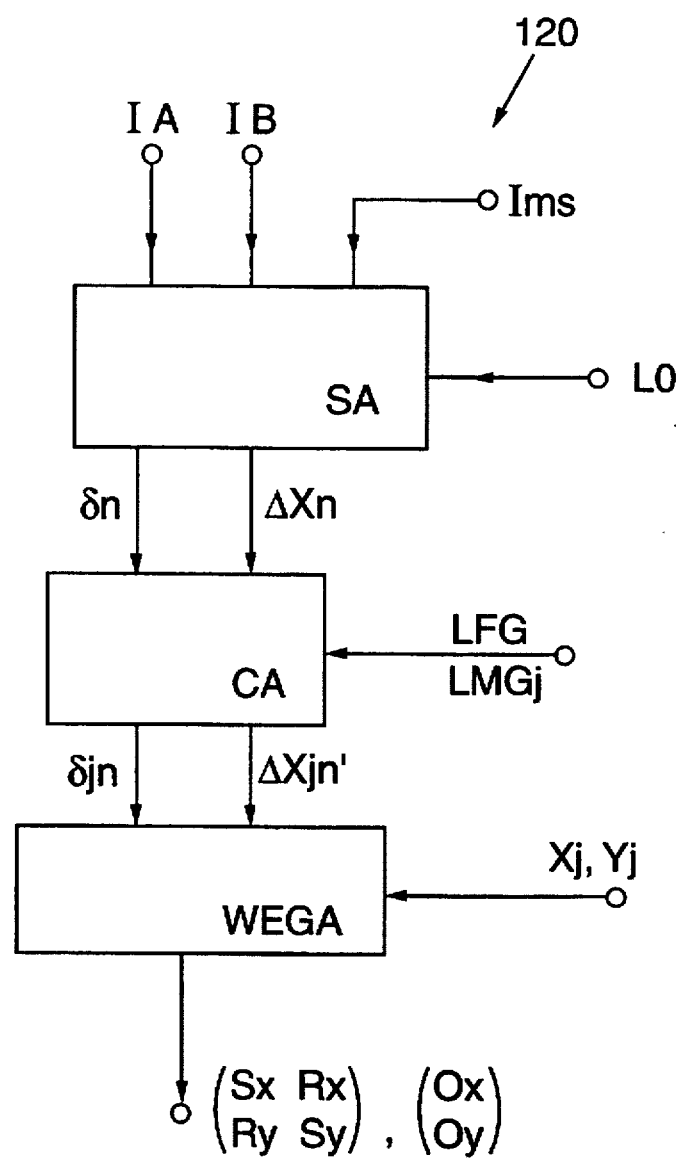
FIG. 16 is a block diagram showing certain features of an exemplary position-detection circuit (comprising a weighted EGA circuit WEGA) included in the position-detection apparatus of the fourth embodiment.

FIG. 16 depicts the position-detection circuit 120 of this embodiment. The position-detection circuit 120 comprises a phase difference detection circuit SA, a detected-position-correction circuit CA, and a weighted-EGA-processing circuit WEGA.

With use of the heterodyne method, as in this embodiment, when interference patterns irradiate the grating mark $MG_j$ or the reference mark FG, the respective photoelectric signals $I_A$, $I_B$, $I_{ms}$ all comprise sine waves of the same frequency as the beat frequency 2·Δf. FIG. 16 shows representative signals.

Figure 17:
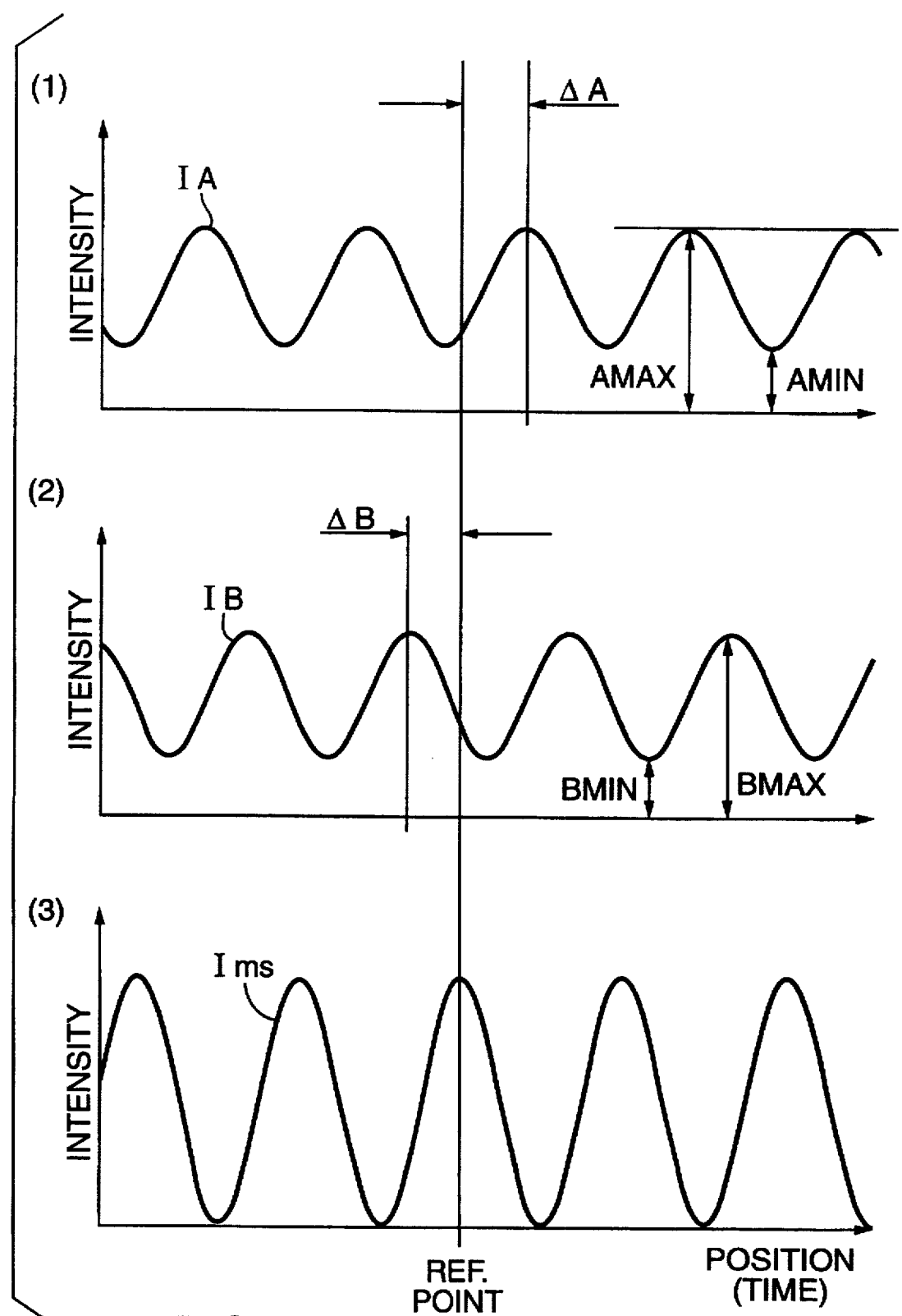
FIG. 17 provides three plots pertaining to the fourth embodiment and photoelectric signals produced thereby. The first (top) plot is of the light-quantity signal $I_A$ output from the detector 115a of FIG. 15; the second (middle) plot is of the light-quantity signal $I_B$ output from the detector 115b of FIG. 15; and the third (bottom) plot is of the light-quantity signal $I_{ms}$ output from the detector 15 of FIG. 15.

The first plot of FIG. 17 shows the light-quantity signal $I_A$ output from the detector 115a, the second plot shows the light-quantity signal $I_B$ output from the detector 115b, and the third plot shows the reference signal $I_{ms}$ output from the detector 15. Phase differences of ΔA and ΔB exist between these signals relative to the reference signal $I_{ms}$. The amount of phase difference corresponds to the location and the level difference on the grating mark $MG_j$. When the lasers LS1, LS2 produce multiple wavelengths, the phase relationships (ΔA, ΔB) of these signals and the amplitudes of the signals (maxima AMAX, BMAX; minima AMIN, BMIN) are different for each light-source wavelength.

Returning to FIG. 16, the phase-difference-detection circuit SA initially detects the phase differences ΔA, ΔB. These phase differences may be multiplied by $N \cdot P_{mg}/(2\pi)$ (where N is a multiple of the ratio of the period $P_{mg}$ of the grating mark $MG_j$ to the amplitude period of the interference patterns formed on the grating mark $MG_j$) in order to convert the phase differences into positions of the grating mark $MG_j$. The average value of the detected positions obtained from these two phase differences represents the detected position of the grating mark $MG_j$ for each wavelength. The phase-difference detection circuit SA outputs an average value $\Delta X_n$ according to Equation (3), above. Specifically, the detected position calculated from the signals $I_A$, $I_B$, and $I_{ms}$ obtained when LS1 is illuminated is $\Delta X_1$, while the detected position calculated from the signals $I_A$, $I_B$, and $I_{ms}$ obtained when LS2 is illuminated is $\Delta X_2$.

The phase-difference detection circuit SA calculates relative level differences $\delta_n$ for the grating mark $MG_j$, based on the respective widths a and b of the concavities and convexities on the grating mark $MG_j$ as input from the $I_A$, $I_B$, and a data-entry appliance usable by the operator. These data are encoded in the signals $I_A$, $I_B$ in the form of light-phase magnitude, wherein the light-phase magnitude is determined by dividing the true level difference by $\lambda_m/2$. $\lambda_m$ is the wavelength of the detected light beam proximate to the surface of the grating mark $MG_j$. The wavelength $\lambda_m$ proximate to the surface of the grating mark $MG_j$ refers to the wavelength within a transparent medium when, e.g., the grating mark $MG_j$ is covered with resist, glass (PSG), or other transparent material. If the surface of the grating mark is bare, $\lambda_m$ refers to the ambient wavelength, i.e., $\lambda_n$.

The detected position $\Delta X_n$ reflects the amount of position offset (phase deviation) in relation to the reference signal $I_{ms}$ as in the first embodiment. Consequently, a position reference is required on the wafer W or wafer stage WST, as in the first embodiment. The reference mark FG serves as this positional reference, and is the subject of an initial detection, as described in the first embodiment. During such detection, the wafer stage WST is initially moved by the main controller 106 via the wafer-stage driver 21 while monitoring an output LFG from the laser interferometer 22, so that the reference mark FG is situated at the irradiation position for the transport-light beams ±LF. Then, position detection is performed by the phase-difference detection circuit SA as described above in relation to the reference mark FG, yielding a position $\Delta FX_n$ of the reference mark FG in relation to the reference signal $I_{ms}$. The detected-position-correction circuit CA stores in a memory the detected position $\Delta FX_n$ for each wavelength along with output LFG from the laser interferometer 22. If the optical system is adjusted so that positions of the interference patterns for each wavelength coincide completely on the wafer W (and the reference mark FG), then $\Delta FX_n$ is identical to the respective wavelengths $\lambda_n$.

Next, the wafer stage WST is moved by the main controller 106 based on design-coordinate values $(X_j, Y_j)$ for the grating mark $MG_j$, and position detection of a quantity M of grating marks $MG_j$ on the wafer W is sequentially performed. The position-detection-correction circuit CA takes the difference of the output $LMG_j$ of the laser interferometer 117 at the stage position and the output LFG representing the detected position of the reference mark FG previously stored in memory. The circuit then adds to this difference the value $\Delta X_n$, representing the detection results for each wavelength, and subtracts $\Delta FX_n$ to yield a value $X_{jn}'$, which represents the detected position at each wavelength $\lambda_n$ for the j'th grating mark $MG_j$. The relative level difference $\delta_n$ is also output as the detected relative level difference $\delta_{jn}$, at each wavelength $\lambda_n$ on the grating mark $MG_j$, representing the j'th grating mark among all the marks on the wafer.

Based on the detected positions $\Delta X_{jn}'$ and the relative level differences $\delta_{jn}$ obtained in the manner described above, the weighted EGA processing circuit WEGA calculates the final detected position of the grating mark MG, represented as an "array-coordinate system" of M grating marks $MG_j$ on the wafer W. This array-coordinate system is a coordinate-conversion system represented by six parameters $S_x$, $S_y$, $R_x$, $R_y$, $O_x$, and $O_y$, similar to conventional EGA. The calculation method will be described in detail later.

For the sake of simplicity, the description up to this point has assumed position detection just in the X direction on grating marks MG. However, exposure apparatus generally must carry out position detection in two dimensions; in fact, the exposure apparatus 200 is equipped with a position-detection apparatus (not shown) similar to that described above to carry out position detection in the Y direction. The "Y" position-detection apparatus is operable to perform position detection of Y-direction positions on Y-direction grating marks as well.

Next, the principles and method of detecting level differences on the grating marks $MG_j$ are described.

The grating mark $MG_j$ has a profile as shown in FIG. 3. Concavity widths are expressed as a; convexity widths are expressed as b; and the level difference between the concavities and convexities is expressed as h. The amplitude reflectance for the concavities and convexities, $\phi_a$, $\phi_b$, and relationships concerning the same are discussed above in the first embodiment.

The amplitude distributions of diffracted light from the concavities and the convexities, $\psi_a$, $\psi_b$, are as described above in the first embodiment (see also Equations (7), (8), (9). Reference is also made to the description of the first embodiment for the amplitude distribution for diffraction light from a pattern consisting of a periodic array of concavities and convexities with pitch P as in FIG. 3 (see Equations (10), (11) and discussion in the first embodiment concerning the same). Reference is also made to Equations (12)–(15), and accompanying discussion, in the first embodiment that are also applicable in this fourth embodiment.

Reference is also made to FIG. 8 and accompanying discussion in the first embodiment which is applicable to this fourth embodiment. The phase difference $\Delta$ between $\psi 0$ and $\psi 1$ in FIG. 8 (i.e., the phase difference between zero-order diffraction light and primary diffraction light) is equal to half of the phase difference between the signals $I_A$ and $I_B$ (i.e., $\Delta B$ minus $\Delta A$) from the combined light beams A and B shown in FIG. Q. This is true not only for N=1 but for any value of N ($\psi N$).

Determination of the magnitude ratio of $\psi N$ to $\psi 0$, and manipulations involving the maximum values AMAX, BMAX and minimum values AMIN, BMIN of the two signals $I_A$ and $I_B$ are as described above in the first embodiment (see also Equations (16) and (17), above). Also, Equations (18)–(26) with accompanying discussion in the first embodiment are applicable in this fourth embodiment.

The foregoing relationships permit a determination of the final level difference h. However, because of the above method of determining $\omega$, the level difference h here falls between the range of 0 to $\lambda/2$. In other words, the value in relation to the true level difference is the half wavelength of the detected light beam with no remainder (represented as h').

The foregoing explanation refers to a mark that is not coated with resist, as in FIG. C. However, the same reasoning applies essentially unchanged to marks that are coated with a resist, as discussed in the first embodiment.

In this implementation, the level difference on the grating mark $MG_j$ is measured, based on the principles discussed above. In other words, the phase-difference-detection circuit SA in FIG. 16 first calculates $\Delta$, half of the difference between the phase differences $\Delta A$ and $\Delta B$ of the light quantity signals $I_A$, $I_B$ with respect to the reference signal $I_{ms}$, the values of which are obtained at position detection time. Next, the phase-difference-detection circuit SA employs a peak-hold circuit and a bottom-hold circuit (not shown) to detect the maximum values AMAX and BMAX and the minimum values AMIN and BMIN for both signals in order to calculate the contrast $\gamma$ for each signal. The contrast $\gamma$ is equal for both signals unless there is significant asymmetry in the level-difference pattern. But, if the values differ, the average value is used.

The phase-difference-detection circuit SA then calculates the ratio $\beta$ of the magnitude $\psi N$ to $\psi 0$ from Equation (20), and calculates the correct relationship (as a complex number) between $\psi N$ and $\psi 0$ from $\beta$, the phase difference $\Delta$, and Equation (21).

In addition, the phase-difference-detection circuit SA is provided with concavity and convexity widths a and b of the grating mark $MG_j$, which are supplied by operator input from a suitable data-entry appliance, and the period P to calculate the values a' and b' by using Equations (14) and (15). These values are substituted into Equations (22) and (23), and the (complex) values of $\phi_a$ and $\phi_b$ are calculated. Then the circuits calculate the phases $\omega_a$ and $\omega_b$ for $\phi_a$ and $\phi_b$ using Equations (24) and (25), with the difference $\omega$ calculated as described previously.

It is also possible, as in the first embodiment, to calculate the level difference h' from the phase difference $\omega$ by using Equation (26). Actually, the weighted EGA circuit WEGA assigns weights to the detected positions $\Delta X_{jn}$' of the respective grating marks $MG_j$ (or those of each respective wavelength) according to the phase magnitude of respective wavelengths relative to the level difference, rather than the level difference itself. Thus, it is preferable to treat the output values from the phase-difference-detection circuit SA as representing a phase magnitude rather than a level difference h'. This phase magnitude $\delta$ is half of the round-trip phase magnitude $\omega$ for the level difference h ($\delta=\omega/2$). This phase magnitude $\delta$ is also the result of dividing the true phase magnitude by the phase difference ($\pi$), which corresponds to half of the wavelength of the detected light.

The weighted EGA circuit WEGA may base the weight assignment on the level difference. In such an instance, the output values from the phase-difference-detection circuit SA may be construed as the level difference h'. However, the level difference h' calculated according to Equation (26) is affected by the refractive index of the resist and other factors (the refractive index proximate to the surface of the grating mark), when grating mark $MG_j$ is coated with resist or the like. But, since the relationship $\delta=\omega/2$ is unaffected by the refractive index of the resist, it is preferable to use the phase magnitude $\delta$ for such a selection.

When the level difference h' is calculated according to Equation (26), if the vacuum wavelength is used as the wavelength $\lambda$, the value of h' does not accurately represent the level difference, although it does eliminate the effects of the refractive index of the resist, as well as the phase magnitude $\delta$.

In the description above, an example of the grating mark $MG_j$ as provided in FIG. 3 is provided for detection of relative level differences of such a mark with vertical sidewalls of concavities and convexities. In fact, high-precision position detection is possible with marks that possess tapered sidewalls. In such a case, the various widths a, b for the input concavities and convexities no longer abide by a+b=P; nevertheless, mark-level differences may be calculated in the same manner as described above, based on these values a and b.

The weighted EGA processing circuit WEGA calculates an "array coordinate system" for M grating marks $MG_j$ on the wafer W based on the detected positions $\Delta X_{jn}$' and the relative level differences $\delta_{jn}$ as described above. Much the same as conventional EGA, generally the array precision of the respective shot regions is quite good for the fine patterns formed by exposure using steppers, etc., on the wafer. Thus, the array coordinate system for M grating marks, i.e., the array coordinate system for M shots comprising M grating marks $MG_j$ (j=1, 2, . . . , M), is virtually equivalent to the array coordinate systems for all shots.

In the course of statistical processing of the respective detected positions $\Delta X_{jn}$' and respective design coordinate values ($X_j$, $Y_j$) for respective grating marks $MG_j$, the weighted EGA processing circuit WEGA in this embodiment assigns weights that are inversely proportional to the detection error inferred to be contained in the respective detected positions $\Delta X_{jn}$'. The inference of detection error is based on the previously described principle that detection error is extremely small when the mark-level difference is (2m+1)/4 times the mid-resist wavelength of the detection light beam. The magnitudes of weight for the grating marks $MG_j$ are assigned according to whether or not the relative level difference $\delta_{jn}$ at various wavelengths $\lambda_n$ on the grating marks $MG_j$ are close to $\pi/2$ [rad] (corresponding to one-fourth of the detection light beam wavelengths $\lambda_n$ [m=0: since the relative level difference $\delta_{jn}$ is the result of halving the wavelength, a value of m>0 need not be considered]).

As a result, the detected positions for marks (and at respective wavelengths) with small detection error are reflected in larger proportion in the array coordinate system, while marks (and at respective wavelengths) with large detection error have less effect on the coordinate system. The resulting final array coordinate system therefore offers a higher degree of precision than conventional array coordinate systems derived from methods that do not employ weighting.

Either of the following equations can be used to calculate the weight $W_{jn}$ (the weight assigned to the detected position $\Delta X_{jn}$' of the j'th mark at the wavelength $\lambda_n$):

$$W_{jn}=\cos(\delta_{jn}-\pi/2) \tag{28}$$

$$W_{jn}=[1+\cos(2(\delta_{jn}-\pi/2))]/2 \tag{29}$$

Actually, the weight $W_{jn}$ may be any quantity that is large for $\delta_n$ proximate to $\pi/2$, and that becomes smaller as $\delta_n$ departs from $\pi/2$.

In general, EGA applies a linear relationship between the design position ($X_j$, $Y_j$) used for X-direction measurement of the grating mark $MG_j$ as described above, and the detected position $X_{jn}$' in that X direction, as in the following equation:

$$X_{jn}=S_x \cdot X_j + R_x \cdot Y_j + O_x + \Delta X_{jn} \tag{30}$$

The values of the parameters $S_x$, $R_x$, and $O_x$ are determined in order to minimize the sum of squares (the sums of j and n) of the residual difference $\Delta X_{jn}$ at this time (least squares method). In the same fashion, if the design position for the k'th Y-direction measurement grating mark $MG_k$ is represented as ($X_k$, $Y_k$) and the detected position in the Y direction is represented as $Y_{kn}$', then the relationship between the two is described as follows:

$$Y_{kn}=R_y \cdot X_k + S_y \cdot Y_k + O_y + \Delta Y_{kn} \tag{31}$$

The parameters $S_y$, $R_y$, and $O_y$ are determined in order to minimize the sum of squares of the residual difference $\Delta Y_{kn}$. Here, $S_x$ and $S_y$ represent the expansion or contraction in mark position (in other words, the wafer) in the X and Y directions, respectively, while $R_x$ and $R_y$ represent the rotation of the mark position (in other words, the wafer). These rotation quantities $R_x$ and $R_y$, strictly speaking, are a function of residual rotation at the time of global alignment (rotational alignment) of the reticle R with the wafer W, a process carried out upstream from EGA, along with the orthogonal deviation in the wafer-array coordinate system and $S_x$ and $S_y$, above. To simplify the explanation, they are simply referred to as rotation quantities $R_x$ and $R_y$ (in the end, there is no ultimate difference in concept).

The patterning (exposure transfer) in the upstream exposure process follows the design values for both the circuit patterns and the marks. Nonetheless, the heating process and so forth after exposure causes expansion or contraction of the wafer, and linear errors occur as a consequence of precision in global alignment described above.

The sum of the squares of residual differences $\Delta X_{jn}$ is represented as follows:

$$\Sigma \Delta X_{jn}{}^2 = \Sigma (X_{jn}' - S_x \cdot X_j - R_x \cdot Y_j - O_x)^2 \quad (32)$$

The parameter values that minimize this value may be derived from the following:

$$\partial \Sigma \Delta X_{jn}{}^2 / \partial S_x = 0 \quad (33)$$

$$\partial \Sigma \Delta X_{jn}{}^2 / \partial R_x = 0 \quad (34)$$

$$\partial \Sigma \Delta X_{jn}{}^2 / \partial O_x = 0 \quad (35)$$

(i.e., a partial differential of 0 which is an extremely small value). The Y parameters $S_y$, $R_y$ and $O_y$ in Equation (31) may be derived in the same manner.

Conventional EGA did not take into account detection errors on the marks in determining the values of these parameters. However, this implementation does take into account respective mark-detection errors (through weighting) by using the weights $W_{jn}$, which are determined based on the previously described relative level differences $\delta_{jn}$ of the marks, in order to set the values of these parameters. Specifically, this embodiment uses the following equation in place of Equation (32) to calculate the weighted sum of squares of the residual differences $\Delta X_{jn}$:

$$\Sigma \Delta X_{jn}{}^2 = \Sigma [W_{jn}(X_{jn}' - S_x \cdot X_j - R_x \cdot Y_j - O_x)^2] \quad (36)$$

As a result, the detection values $X_{jn}'$ with large weights $W_{jn}$ acquire a large "weight" upon setting of the partial differentials $S_x$, $R_x$, and $O_x$. These parameters $S_x$, $R_x$, and $O_x$ can be derived based on this new value from Equations (33) to (35) using the same method as conventional EGA.

In addition, Equations (33) to (35) above are equivalent to the following determinant:

$$\begin{bmatrix} \Sigma W_{jn} \cdot X_j^2 & \Sigma W_{jn} \cdot X_j \cdot Y_j & \Sigma W_{jn} \cdot X_j \\ \Sigma W_{jn} \cdot X_j \cdot Y_j & \Sigma W_{jn} \cdot Y_j^2 & \Sigma_{jn} \cdot Y_j \\ \Sigma W_{jn} \cdot X_j & \Sigma W_{jn} \cdot Y_j & \Sigma W_{jn} \end{bmatrix} \begin{bmatrix} S_x \\ R_x \\ O_x \end{bmatrix} = \begin{bmatrix} \Sigma W_{jn} \cdot X_j \cdot X_{jn}' \\ \Sigma W_{jn} \cdot Y_j \cdot X_{jn}' \\ \Sigma W_{jn} \cdot X_j \end{bmatrix} \quad (37)$$

By solving the foregoing determinant, it is possible to derive the parameters $S_x$, $R_x$, and $O_x$ in the same manner as conventional EGA. However, the inclusion of the weight $W_{jn}$ in the determinant differs from conventional EGA.

Similarly, the Y parameters $S_y$, $R_y$, and $O_y$ can be assigned by solving partial differentials for the weighted sum of squares for each parameter, as follows:

$$\Sigma \Delta Y_{kn}{}^2 = \Sigma [W_{kn}(X_{kn}' - R_y \cdot X_k - S_y \cdot Y_k - O_y)^2] \quad (38)$$

In the manner described above, the values of the parameters $S_x$, $S_y$, $R_x$, $R_y$, $O_x$, and $O_y$ are established, and with these parameters the array of exposure shots on the wafer W can be inferred. I.e., if the design positions for the various shot regions are represented as $(X_e, Y_e)$, then, according to Equation (30) and Equation (31), the actual shot region positions $(X_e', Y_e')$ may be calculated (detected) as follows:

$$X_e' = S_x \cdot X_e + R_x \cdot Y_e + O_x \quad (39)$$

$$Y_e' = R_y \cdot X_e + S_y \cdot Y_e + O_y \quad (40)$$

Next, the process flow at registration and exposure times according to the exposure apparatus 200 is described. As a prologue, it is assumed that grating marks for position measurement in the X direction and grating marks for position measurement in the Y direction attached to prescribed shot regions during exposure of prior layers and attached to respective shot regions are already formed. It is also assumed that a wafer W is mounted on the wafer stage WST after processing such as developing and so forth, and that the previously described global alignment is complete.

The process begins with the previously described baseline measurement. Here, the baseline magnitude is none other than the positional relationship in directions X and Y between the projection point of the center CCr of the reticle R onto the wafer W (nearly coincides with the optical axis AX) and the projection point of the detection centerpoint Rf4 of the position-detection mechanism 110 onto the wafer as shown in FIG. 14. This positional relationship can be determined by detecting the position offset between the mark FG, which corresponds to the reference-mark plate FP, and the projection point of the detection centerpoint Rf4 via the position-detection apparatus 100, and by detecting the coordinate positions at that time of the wafer stage WST using the laser interferometer 117.

Next, position-detection apparatus 100 for the X and Y dimensions detect, at each respective wavelength as described earlier, the positions and relative level differences of the alignment marks used for position detection in the respective X and Y directions. The alignment marks comprise grating marks located adjacent to particular shot regions, say, eight to fifteen shot regions among the multiple shot regions on the wafer W.

Next, the position-detection circuit 120 carries out the previously discussed weighted EGA processing based on this detected position data, detected relative level difference, mark design value data, and shot array design value data, etc. This yields an array-coordinate system for all shot regions on the wafer, which is then stored in memory.

In addition, at time for actual exposure, stepping and exposure are carried out repeatedly according to the step-and-repeat method. When stepping is performed, the main control apparatus 106 moves the wafer stage WST in two dimensions using the wafer-stage driver 21 while output from the laser interferometer 17 is monitored, in accordance with the shot-array coordinates stored in memory. The shot regions on the wafer W are positioned sequentially within the image field of the projection-optical system PL.

Simply by moving the wafer stage WST in two dimensions in accordance with the calculated array coordinates, it is possible to align all the shots with the reticle R. When the reticle R is illuminated by exposure light from an exposure-light source (not shown) where the shot region is positioned, the circuit pattern on the reticle R is registered and exposed onto that shot region.

As is clear from the discussion above, this embodiment comprises a level-difference-detection system based on a phase-difference-detection circuit SA. This embodiment also comprises a position-detection system based on the detected-position-correction circuits CA and the phase-difference-detection circuit SA; and a calculation system based on the weighted EGA circuit WEGA.

As described above, according to this embodiment, EGA calculates shot arrays by inferring the magnitude of the position-detection error for respective alignment marks (grating marks) based on the relative level differences for each mark. EGA then performs statistical processing by assigning weights in proportion to the magnitude of error and using the least squares method to calculate the shot-array-coordinate system. Thus, the two-dimensional movement of wafer stage WST in accordance with this calculated-array-coordinate system provides a registration with higher precision than before.

This embodiment also performs both grating-mark-position detection and relative level-difference detection on each of multiple frequencies. Thus, position-detection results and relative level-difference-detection results at the respective frequencies are used to perform the weighted EGA processing. During this process the weights are assigned in relation to the quality (relationship of level difference to wavelength) of each wavelength for each grating mark, thereby providing even higher registration precision.

This embodiment is not limited to the use of a multiple-wavelength laser light source. It is also acceptable to use a single-wavelength light source. To use detection results from a single-wavelength light source, weight assignment is performed in relation to the detection results themselves for each grating mark, that is to say, in relation to the level difference of respective grating marks on the wafer surface caused by processing precision irregularities and resist application unevenness.

In this embodiment, position detection was performed by irradiating the grating marks alternately with light beams of multiple wavelengths. However, the invention is not so limited. For example, the grating mark MG can be irradiated simultaneously with light beams of multiple wavelengths, while dichroic mirrors can be used at the light-receiving system to split first and second combined light beams into each wavelength whose light is received by separately installed detectors for each respective wavelength. In such a scheme, the light-receiving optical system and the signal-processing system become somewhat more complex, but the capacity to simultaneously detect respective wavelengths provides the benefit of short measurement times being sufficient.

In the scheme for level-difference detection as described above, the ratio of the magnitude of $\psi N$ to $\psi 0$ is calculated from the contrast in the light-quantity signals $I_A$ and $I_B$. However, this invention is not so limited. For example, it is also acceptable to calculate the light-quantity ratio of Nth-order diffraction light to zero-order diffraction light and take the square root.

As a method for detecting the light-quantity ratio of Nth-order diffraction light to zero-order diffraction light, it would be acceptable, for example, to place a shutter in the vicinity of the light-beam selector 6 in FIG. 15 that is capable of shutting off light from at least one of the transport light beams ±LF. After the position detection ends or before it begins, the shutter shuts off either +LF or −LF, at which time the intensity ratios of the light-quantity signals $I_A$ and $I_B$ obtained from the detectors 115a, 115b can be calculated. When so done, the beams incident on the grating mark MG have no beat in the respective light-quantity signals $I_A$ and $I_B$, since there is only one beam for each wavelength. The signals $I_A$, $I_B$ thus would comprise DC signals. If the shutter shuts off light from transport light beam −LF, for example, only zero-order diffraction light from the transport light beam +LF derived from the grating mark MG would be incident on the detector 115a. In such an instance, the light-quantity signal $I_A$ would indicate the light quantity for zero-order diffraction light at each wavelength. Also, only primary diffraction light from the transport light beam +LF derived from the grating mark MG would be incident on the detector 115b, with the light-quantity signal $I_B$ indicating the light quantity for the primary diffraction light at each wavelength.

If either one of the two transport light beams were to be shut off in such a manner, position detection and level-difference detection would be disabled. And, since shutter opening and closing generally requires a fair amount of time, it is satisfactory to measure light quantity for zero- and Nth-order diffraction light at each respective wavelength not by opening and closing the shutter while the lasers LS1 and LS2 remain illuminated. Rather, it is preferable to open the shutter, alternately illuminate the lasers LS1 and LS2, receive the light-quantity signals $I_A$ and $I_B$, close the shutter, and alternately illuminate the lasers.

With respect to directly measuring the light quantities of zero-order diffraction light and Nth-order diffraction light, it is possible to calculate the magnitude ratio of $\psi N$ to $\psi 0$ more accurately than the previously described calculation method based on contrast, which retains uncertainty with regard to sign determination in Equation (20).

In this embodiment, in order to simplify description a rotating radial grating RRG was employed as a frequency shifter. However, the invention is not so limited. It is also acceptable to use as a frequency shifter two audio-optical modulators (AOMs), and to use as a light source a first Zeeman laser light source oscillating at a central frequency of $\lambda_1$ and a second Zeeman laser light source oscillating at a central frequency of $\lambda_2$. In addition, the various dichroic mirrors may be exchanged for prisms or other dispersion elements.

In addition, in this embodiment, a detection light with two wavelengths was used. However, it is also acceptable to use a detection light with an arbitrary number of wavelengths.

This embodiment utilized the heterodyne method whereby frequencies were varied in the incident beams ±LF for position detection. I.e., relative scanning was conducted of grating marks and interference patterns in the period direction. A relative scanning system (i.e., a rotating radial grating) was provided for taking multiple pairs of coherent light beams with different frequencies and varying the frequencies of the first and second light beams slightly. Then, the interference patterns formed thereby were passed across the grating mark in the period direction at the same speed. However, the invention is not so limited. For example, it is acceptable to use the same frequencies for the incident beam ±LF (using the homodyne method), and to employ a relative-scanning system for performing relative scanning of the grating marks and the interference patterns in the period direction. In a suitable method, the wafer stage WST is scanned at position-detection time in the detection direction instead. Various signals form sine waves with equal beat frequencies proportional to the scanning speed of the wafer stage WST, making it possible to carry out the same detection as discussed previously. Such a homodyne method eliminates the frequency shifter (rotating radial grating RRG or the like), thereby simplifying the transport-light optical system.

On the other hand, the heterodyne method allows the wafer stage WST to stop during detection, and provides high signal-to-noise ratios. The heterodyne method also eliminates a control mechanism for scanning wafer stage WST at the same speed. In addition, the heterodyne method can beneficially average flutter (mainly air flutter) in the output of the laser interferometer 22 that monitors the wafer-stage position during detection.

The functions of the position-detection circuit 120 and the main controller 106 as described above for this embodiment can actually be implemented in software. Therefore, it is possible to use a single computer to perform all the respective tasks.

In this embodiment, the position-detection apparatus was described as an off-axis alignment-detection system. However, it is also possible to apply the position-detection method and apparatus in this embodiment to through-the-lens (TTL) alignment-detection systems and through-the-reticle (TTR) alignment-detection systems.

This embodiment enables not only grating mark positions but also their relative level differences to be detected in "interference type alignment." Based on relative level differences of a grating mark, the detection error accompanying the detected position of the grating mark can be estimated. In addition, by detecting multiple marks and assigning weights in inverse proportion to the detection error in the detected positions of the marks, the embodiment performs statistical processing (weighted EGA) using detected mark positions and design data for array coordinates of marks and fine patterns, thereby enabling the positions (array coordinates) of all fine patterns on the substrate to be detected with higher precision than before.

This application is based on Japanese patent application nos. H8-048116, H8-055458, H8-058487, and H8-079565, which are incorporated herein by reference.

Whereas the invention has been described in connection with multiple preferred embodiments and various alternative embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A method for determining the position, in a period direction, of a grating mark formed as a repeating pattern of concavities and convexities on a substrate, the pattern having a period P in the period direction, the method comprising the steps:

(a) illuminating the grating mark with a pair of incident coherent light beams in multiple groups with different wavelengths such that interference patterns having an amplitude-distribution period of $2P/N$ (where N is a natural number) are formed in the period direction;

(b) scanning the interference patterns and the grating mark relative to the period direction by separately receiving, for each of the multiple wavelengths and among reflection and diffraction light produced from the grating mark from the incident light beam, a first combined light beam comprising regular reflection light from the first light beam and Nth-order diffraction light from the second light beam, and a second combined light beam comprising regular reflection light from the second light beam and Nth-order diffraction light from the first light beam;

(c) based on changes in the light-quantity signals for the first and second combined light beams at the respective wavelengths occurring during the relative scanning, detecting a preliminary position of the grating mark for the respective wavelengths;

(d) based on changes in the light-quantity signals for the first and second combined light beams at the respective wavelengths occurring during the relative scanning, and on design data for the grating mark, calculating relative level differences on the grating mark for each respective wavelength; and (e) according to the difference between the relative level differences calculated for each wavelength and the equivalent of one-fourth of a respective wavelength of the incident light beam, weighting the preliminary grating-mark positions detected for each wavelength so as to obtain weighted averages of the position of the grating mark for each wavelength, the weighted-average values representing the final detected position of the grating mark.

2. The method of claim 1, wherein:

step (a) comprises illuminating the grating mark with multiple pairs of coherent light beams with different wavelengths in time-division sequence such that an interference pattern having an amplitude-distribution period of $2P/N$ (where N is a natural number) is formed in the period direction for each wavelength; and step (b) comprises scanning relative to the period direction of the interference pattern for each respective wavelength.

3. The method of claim 1, wherein step (c) further comprises averaging the detected positions obtained for each wavelength based on the phases of the light-quantity signal changes in the first combined light beam and the second combined light beam occurring during the relative scanning of the interference patterns.

4. The method of claim 1, wherein the calculating in step (d) is performed based on a ratio of respective widths of the concavities and convexities of the grating mark, and on differences in phase and contrast in the respective light-intensity signal changes for the first and second combined light beams occurring during the relative scanning of the interference patterns.

5. The method of claim 1, further comprising the step of measuring, for each respective wavelength of the incident light beam, a light-intensity ratio between zero-order diffracted light and Nth-order diffracted light that are reflected and diffracted from the grating mark; and the calculation of relative level differences in step (d) is based on (i) a ratio of respective widths of said concavities and convexities on the grating mark, (ii) phase differences in the respective light-quantity signals for the first and second combined light beams during the relative scanning, and (iii) on the measured light-intensity ratio.

6. The method of claim 1, wherein, in step (d), the step of calculating relative differences on the grating mark for each wavelength is performed by dividing the grating-mark level difference by half of each respective wavelength in the incident light beam in a medium proximal to the surface of the grating mark.

7. An exposure process for a photosensitive substrate in which prescribed shot positions are sequentially positioned for exposure, the shot regions including fine patterns formed thereon at the respective shot position, the process comprising:

(a) before starting exposure of the shot regions, calculating array coordinates of the shot regions according to the method of claim 1; and (b) sequentially positioning the shot regions at the exposure position in accordance with the calculated array coordinates.

8. A method for determining the position, in a period direction, of a grating mark formed as a repeating pattern of concavities and convexities on a substrate, the pattern having a period P in the period direction, the method comprising the steps:

(a) illuminating the grating mark with a pair of coherent light beams in multiple groups with different wavelengths such that interference patterns having an amplitude-distribution period of $2P/N$ (where N is a natural number) are formed in the period direction;

(b) scanning the interference patterns and the grating mark relative to the period direction by separately receiving, for each of the multiple wavelengths and among reflection and diffraction light produced from the grating mark from the incident light beam, a first combined light beam comprising regular reflection light from the first light beam and Nth-order diffraction light from the second light beam, and a second combined light beam comprising regular reflection light from the second light beam and Nth-order diffraction light from the first light beam;

(c) based on changes in the light-quantity signals for the first and second combined light beams at the respective wavelengths occurring during the relative scanning, detecting a preliminary position of the grating mark for the respective wavelengths;

(d) based on changes in the light-quantity signals for the first and second combined light beams at the respective wavelengths occurring during relative scanning, and on design data for the grating mark, calculating relative level differences on the grating mark for each respective wavelength by dividing the grating-mark level difference by half of each respective wavelength in the incident light beam in a medium proximal to the surface of the grating mark; and (e) based on the relationship between the preliminary position of the grating mark detected for each respective wavelength and the relative level difference calculated for each respective wavelength, determining the final grating-mark position by a virtual detection wavelength in which the relative level difference is represented by multiplying the respective wavelengths of the incident light beam in the medium proximal to the surface of the grating mark by $(2m+1)/4$, where m is an integer greater than or equal to zero.

9. The method of claim 8, wherein:

step (a) comprises illuminating the grating mark with multiple pairs of coherent light beams with different wavelengths in time-division sequence such that an interference pattern having an amplitude-distribution period of $2P/N$ (where N is a natural number) is formed in the period direction for each wavelength; and step (b) comprises scanning relative to the period direction of the interference pattern for each respective wavelength.

10. The method of claim 9, wherein the calculating in step (d) is performed based on a ratio of respective widths of the concavities and convexities of the grating mark, and on differences in phase and contrast in the respective light-quantity signal changes for the first and second combined light beams occurring during the relative scanning of the interference patterns.

11. The method of claim 8, further comprising the step of measuring, for each respective wavelength of the incident light beam, a light-intensity ratio between zero-order diffracted light and Nth-order diffracted light that are reflected and diffracted from the grating mark; and the calculation of relative level differences in step (d) is based on (i) a ratio of respective widths of said concavities and convexities on the grating mark, (ii) on phase differences in the respective light-quantity signals for the first and second combined light beams during the relative scanning, and (iii) on the measured light-intensity ratio.

12. The method of claim 9, wherein step (c) further comprises averaging the detected positions obtained for each wavelength based on the phases of the light-quantity signal changes in the first combined light beam and the second combined light beam occurring during relative scanning of the interference patterns.

13. A method for determining the position, in a period direction, of a grating mark formed as a repeating pattern of concavities and convexities on a substrate, the pattern having a period P in the period direction, the method comprising the steps:

(a) illuminating the grating mark with an incident light beam comprising a pair of coherent light beams in multiple groups with different wavelengths such that interference patterns having an amplitude-distribution period of $2P/N$ (where N is a natural number) are formed in the period direction;

(b) scanning the interference patterns and the grating mark relative to the period direction by separately receiving, for each of the multiple wavelengths and among reflection and diffraction light produced from the grating mark from the incident light beam, a first combined light beam comprising regular reflection light from the first light beam and Nth-order diffraction light from the second light beam, and a second combined light beam comprising regular reflection light from the second light beam and Nth-order diffraction light from the first light beam;

(c) based on changes in the light-quantity signals for the first and second combined light beams at the respective wavelengths occurring during the relative scanning, and on design data for the grating mark, calculating relative level differences on the grating mark for each respective wavelength by dividing the grating-mark level difference by half of each respective wavelength in the incident light beam in a medium proximal to the surface of the grating mark; and (d) of each wavelength proximal to the surface of the grating mark of the incident light beam, selecting the wavelength closest to one-fourth of the proximal wavelength; and (e) based on light-quantity signal changes in the first and second combined light beams accompanying the relative scanning for at least the wavelengths selected in step (d), determining a position of the grating mark.

14. The method of claim 13, wherein:

step (a) comprises illuminating the grating mark with multiple pairs of coherent light beams with different wavelengths in time-division sequence such that an interference pattern having an amplitude-distribution period of $2P/N$ (where N is a natural number) is formed in the period direction for each wavelength; and step (b) comprises scanning relative to the period direction of the interference pattern for each respective wavelength.

15. The method of claim 13, wherein determining the position of the grating mark is performed by averaging the detected positions obtained for each wavelength based on phases of the light-quantity signal changes in the first combined light beam and the second combined light beam occurring during relative scanning of the interference patterns.

16. The method of claim 13, wherein the calculation of the relative level difference performed in step (c) is further based on the ratio of the respective widths of the concavities and convexities on the grating mark and on the phase differences and contrast in the respective light-quantity signal changes for the first and second combined light beams occurring during the relative scanning.

17. The method of claim 13, wherein
the light-quantity ratio between zero-order diffracted light and Nth-order diffracted light reflected and diffracted from the grating mark is measured for each of the respective wavelengths of the incident light beam, and detection of the relative level difference is based on (i) the ratio of the widths of the concavities and convexities of the grating mark, (ii) phase differences in the respective light-quantity signal variations for the first and second combined light beams during the relative scanning, and (iii) the measured light-quantity ratio.

18. The method of claim 13, wherein step (e) is performed on the basis of position-detection results of the grating mark detected for each respective wavelength as determined by light-quantity signal changes in the first and second combined light beams accompanying the relative scanning prior to step (d).

19. A method for detecting the position of multiple grating marks over the surface of a substrate, each grating mark comprising a fine pattern of repeated concavities and convexities having a periodicity with period P in a particular period direction, the method comprising the steps:

(a) directing first and second coherent light beams to be variously incident on the grating marks such that interference patterns with an amplitude-distribution period of 2P/N (wherein N is a natural number) are variously formed in the period direction;

(b) scanning the interference patterns and the grating marks relative to the period direction so as to sequentially and severally receive, from among reflection and diffraction light from the incident light beams on the grating marks, a first combined light beam comprising a combination of regular reflection light from the first incident light beam and Nth-order diffraction light from the second incident light beam, and a second combined light beam comprising a combination of regular reflection light from the second incident light beam and Nth-order diffraction light from the first incident light beam, and converting the sequentially and severally received first and second combined light beams into light-quantity signals;

(c) sequentially detecting, based on changes accompanying the relative scanning of the light-quantity signals of the first and second combined light beams obtained in step (b), positions of the multiple grating marks;

(d) based on changes accompanying the relative scanning of the light-quantity signals of the first and second combined light beams obtained in step (b) and based on design data for the grating marks, sequentially calculating relative level differences on the grating marks by dividing the grating-mark level differences by half the respective wavelengths in the incident light beams in a medium proximal to the surface of the grating marks; and (e) assigning a relatively large weight to the detected position of the j'th grating mark ($1 \leq j \leq M$, where M is the number of grating-mark locations on the substrate) among multiple locations when the relative level difference of the grating mark is about ¼ of the wavelength of the incident light beam proximal to the surface of the j'th grating mark, wherein a relatively small weight is assigned to the detected position of the j'th grating mark when the relative level difference is substantially different from ¼ of the wavelength, such that the detected positions of the grating marks are subjected to statistical processing in order to calculate the positions of the fine patterns over the surface of the substrate.

20. The method of claim 19, wherein:

in step (a), multiple pairs of coherent light beams are variously incident on the grating marks such that interference patterns with an amplitude-distribution period of 2P/N are variously formed in the same period direction as the grating marks, step (a) further comprising scanning the interference patterns and the grating marks relative to the period direction;

during steps (b)–(d) performed at respective wavelengths, positions and relative level differences of the grating marks are detected for each respective wavelength; and during step (e), the grating-mark detection results and relative level difference detection results for each wavelength are used to perform a weighted statistical analysis on the detected positions of the grating marks for each respective wavelength, and the positions of the fine patterns over the surface of the substrate are calculated.

21. An apparatus for detecting the position, in a period direction, of a grating mark relative to a reference, the grating mark being formed as a repeating pattern of concavities and convexities on a substrate, the pattern having a period P in the period direction, the apparatus comprising:

(a) a transport-light optical system operable to direct multiple groups of paired coherent transport light beams having multiple wavelengths to be incident on the grating mark so as to form an interference pattern, the interference pattern having an amplitude-distribution period of 2P/N (where N is a natural number) and a period direction similar to the period direction of the grating mark;

(b) a relative-scanning system operable to cause the interference pattern to move in the period direction across the grating mark;

(c) a light-detection system situated so as to receive, separately for each of the multiple wavelengths and among reflection and diffraction light generated by the incident light on the grating mark, a first combined light beam comprising a combination of a regular reflection light from the first light beam and Nth-order diffraction light from the second light beam, and a second combined light beam comprising a combination of regular reflection light from the second light beam and Nth-order diffraction light from the first light beam, the light-detection system being operable to photoelectrically produce respective light-quantity signals from the first and second combined light beams;

(d) a position-detection system connected to the light-detection system, the position-detection system being operable to determine the position of the grating mark, relative to the reference, for each respective wavelength based on changes accompanying the relative scanning of light-quantity signals from the first and second combined light beams of each respective wavelength obtained from the light-detection system;

(e) a level-difference-detection system connected to the position-detection system, the level-difference-detection system being operable to determine level differences on the grating mark for each respective wavelength, the level differences being determined by dividing the actual grating-mark level difference by half of the respective wavelengths in the incident light beam in a medium proximal to the surface of the grating mark, and from changes accompanying the relative scanning of the light-quantity signals of the first and second combined light beams at each respective wavelength by the light detector; and (f) a processor operable to apply a greater arithmetic weight to grating-mark positions detected for each said wavelength according to the difference between the relative level differences calculated for each wavelength and the equivalent of one-fourth of each wavelength of the incident light beam, thereby providing a weighted average of such grating-mark positions, the weighted-average value being the final detected position of the grating mark relative to the reference.

22. The apparatus of claim 21, wherein the position-detection system is operable to determine an average value for detected positions obtained respectively based on the phases of the light-quantity signal changes in the first and second combined light beams accompanying the relative scanning.

23. The apparatus of claim 21, wherein the level-difference-detection system is operable to calculate the relative level difference, based on the ratio of the respective widths of the concavities and convexities on the grating mark, and on phase differences and contrast in light-quantity signal changes in the first and second combined light beams accompanying the relative scanning.

24. The apparatus of claim 21, further comprising a light-quantity-ratio detection system for measuring a light-quantity ratio between the zero-order diffraction light and Nth-order diffraction light reflected and diffracted from the grating mark for each respective wavelength of incident light beam, the level-difference-detection system being operable to calculate the relative level difference based on a ratio of the respective widths of the concavities and convexities on the grating mark, on phase differences in light-quantity signal changes between the first and second combined light beams accompanying the relative scanning, and on the light-quantity ratio determined by the light-quantity-ratio-detection system.

25. The apparatus of claim 21, wherein the relative-scanning system is operable to vary the frequency of the first light beam slightly relative to the frequency of the second light beam, thereby causing interference patterns formed by the first and second light beams to move across the grating mark at the same velocity in the period direction.

26. The apparatus of claim 21, further comprising a stage adapted to hold an object on which the grating mark is formed, the stage being operable to move the object, responsive to a signal from the processor corresponding to the final detected position of the grating mark, so as to achieve a desired placement of the object relative to the reference.

27. An exposure apparatus comprising the position-detection apparatus of claim 26.

28. An apparatus for detecting the position, in a period direction, of a grating mark relative to a reference, the grating mark being formed as a repeating pattern of concavities and convexities on a substrate, the pattern having a period P in the period direction, the apparatus comprising:

(a) a transport-light optical system operable to cause multiple pairs of coherent transport light beams in multiple groups and at multiple wavelengths to be incident on the grating mark in a manner whereby the transport light beams reflect from the grating mark and form interference patterns in the period direction;

(b) a relative scanner operable to cause the interference patterns to move in the period direction across the grating mark;

(c) light detectors placed so as to separately receive a first and a second respective combined light beam generated by the incident transport light beams on the grating mark, the first combined light beam comprising a combination of a regular reflection light from the first transport light beam and Nth-order diffraction light from the second transport light beam, and a second combined light beam comprising a combination of regular reflection light from the second transport light beam and Nth-order diffraction light from the first transport light beam, the light detectors being operable to photoelectrically produce respective light-quantity signals from the first and second combined light beams;

(d) a phase-difference detection circuit connected to each light detector, the phase-difference detection circuits being operable to: (i) detect phase differences from the respective light-quantity signals relative to a reference signal; (ii) convert the phase differences not corresponding detected positions of the grating mark for each wavelength; (iii) calculate average values of the detected positions for each wavelength to yield a mean detected position value ($\Delta X_n$) for the wavelengths; and (iv) determine relative level differences for the grating mark based on widths of concavities and convexities of the grating mark;

(e) a detected-position-correction circuit corresponding to and connected to a respective phase-difference-detection circuits, the detected-position-correction circuits being operable to determine a positional difference of the grating mark relative to a reference mark, add $\Delta X_n$ to the difference, and subtract from the result the position of the reference mark in relation to a reference-mark signal ($\Delta F X_n$), thereby yielding a value of $\Delta X_n'$, a corrected detected position of the grating mark at each wavelength; and (f) an averaging circuit connected to the position-correction-detection circuits, the averaging circuit being operable to calculate a final position ($\Delta X$) of the grating mark as a weighted average, by applying a relatively large weight to data obtained with wavelengths close to the level differences of the grating mark at multiples of $(2m+1)/4$, where m is an integer $\geq 0$.

29. The apparatus of claim 28, wherein the phase-difference-detection circuits determine the mean detected position value ($\Delta X_n$) for the wavelengths by calculating:

$$\Delta X_n = [\Delta A_n \cdot N \cdot P_{mg}/(2\pi) + \Delta B_n \cdot N \cdot P_{mg}/(2\pi)]/2$$

wherein $\Delta A_n$ and $\Delta B_n$ are phase differences for input signals to the phase-difference-detection circuits from the respective light detectors, and N is a multiple of a ratio of the grating-mark period $P_{mg}$ to the amplitude period of interference patterns formed on the grating mark.

30. The apparatus of claim 28, wherein the averaging circuit determines the weighted-average position of the grating mark by calculating:

$$\Delta X = (\Sigma W_n \cdot \Delta X_n')/\Sigma W_n$$

wherein $W_n = \cos[(\delta_n - \pi/2)]$ or $W_n = [1 + \cos[2(\delta_n - \pi/2)]]$ and $\delta_n$ is a level difference of the grating mark at wavelength $\lambda_n$ as detected by the phase-difference detection circuits.

31. An apparatus for detecting the position, in a period direction, of a grating mark formed as a repeating pattern of concavities and convexities on a substrate, the pattern having a period P in the period direction, the apparatus comprising:

(a) a transport-light optical system operable to direct multiple groups of paired coherent transport light beams having multiple wavelengths to be incident on the grating mark so as to form an interference pattern, the interference pattern having an amplitude-distribution period of 2P/N (where N is a natural number) and a period direction equal to the period direction of the grating mark;

(b) a relative-scanning system operable to cause the interference pattern to move in the period direction across the grating mark;

(c) a light-receiving system situated so as to receive, separately for each of the multiple wavelengths and among reflection and diffraction light generated by the incident light on the grating mark, a first combined light beam comprising a combination of a regular reflection light from the first light beam and Nth-order diffraction light from the second light beam, and a second combined light beam comprising a combination of regular reflection light from the second light beam and Nth-order diffraction light from the first light beam, the light-receiving system being operable to photoelectrically produce respective light-quantity signals from the first and second combined light beams;

(d) a position-detection system connected to the light-receiving system, the position-detection system being operable to detect the position of the grating mark for each respective wavelength based on changes accompanying the relative scanning of light-quantity signals from the first and second combined light beams of each respective wavelength obtained from the light-receiving system;

(e) a level-difference-detection system connected to the position-detection system, the level-difference-detection system being operable to determine level differences on the grating mark for each respective wavelength, the level differences being determined by dividing the actual grating-mark level difference by half of the respective wavelengths in the incident light beam in a medium proximal to the surface of the grating mark, and from changes accompanying the relative scanning of the light-quantity signals of the first and second combined light beams at each respective wavelength by the light-receiving system; and (f) a processor operable to determine a virtual detection position of the grating mark at virtual wavelengths where the relative level difference is represented by $(2m+1)/4$ (m is an integer $\geq 0$) of the relative wavelength, from the relationship of the grating mark detected for each respective wavelength and the relative level difference calculated for each respective wavelength.

32. The apparatus of claim 31, wherein the position-detection system is operable to determine an average value for detected positions obtained respectively based on the phases of the light-quantity signal changes in the first and second combined light beams accompanying the relative scanning.

33. The apparatus of claim 31, wherein the level-difference-detection system is operable to calculate the relative level difference, based on the ratio of the respective widths of the concavities and convexities on the grating mark, and on phase differences and contrast in light-quantity signal changes in the first and second combined light beams accompanying the relative scanning.

34. The apparatus of claim 31, further comprising a light-quantity-ratio detection system operable to measure a light-quantity ratio between the zero-order diffraction light and Nth-order diffraction light reflected and diffracted from the grating mark for each respective wavelength of incident light beam, the level-difference detection system being operable to calculate the relative level difference based on a ratio of the respective widths of the concavities and convexities on the grating mark, on phase differences in light-quantity signal changes between the first and second combined light beams accompanying the relative scanning, and on the light-quantity ratio determined by the light-quantity-ratio detection system.

35. The apparatus of claim 31, wherein the relative-scanning system is operable to vary the frequency of the first light beam slightly relative to the frequency of the second light beam, thereby causing interference patterns formed by the first and second light beams to move across the grating mark at the same velocity in the period direction.

36. The apparatus of claim 31, further comprising a stage adapted to hold an object on which the grating mark is formed, the stage being operable to move the object, responsive to a signal from the processor corresponding to the virtual detection position of the grating mark, so as to achieve a desired relative placement of the object.

37. An apparatus for detecting the position, in a period direction, of a grating mark relative to a reference, the grating mark being formed as a repeating pattern of concavities and convexities on a substrate, the pattern having a period P in the period direction, the apparatus comprising:

(a) a transport-light optical system operable to cause multiple pairs of coherent transport light beams in multiple groups and at multiple wavelengths to be incident on the grating mark in a manner whereby the transport light beams reflect from the grating mark and form interference patterns in the period direction;

(b) a relative scanner operable to cause the interference patterns to move in the period direction across the grating mark;

(c) a light-detector system placed so as to separately receive a first and a second respective combined light beam generated by the incident transport light beams on the grating mark, the first combined light beam comprising a combination of a regular reflection light from the first transport light beam and Nth-order diffraction light from the second transport light beam, and a second combined light beam comprising a combination of regular reflection light from the second transport light beam and Nth-order diffraction light from the first transport light beam, the light-detector system being operable to photoelectrically produce respective light-quantity signals from the first and second combined light beams;

(d) a phase-difference detection circuit connected to the light-detector system, the phase-difference detection circuits being operable to: (i) detect phase differences from the respective light-quantity signals relative to a reference signal; (ii) convert the phase differences not corresponding detected positions of the grating mark for each wavelength; (iii) calculate average values of the detected positions for each wavelength to yield a mean detected position value for the wavelengths $(\Delta N_n)$; and (iv) determine relative level differences for the grating mark based on widths of concavities and convexities of the grating mark;

(e) a detected-position-correction circuit corresponding to and connected to respective phase-difference-detection circuits, the detected-position-correction circuits being operable to determine a positional difference of the grating mark relative to a reference mark, add $\Delta X_n$ to the difference, and subtract from the result the position of the reference mark in relation to a reference-mark signal ($\Delta FX_n$), thereby yielding a corrected detected position ($\Delta X_n'$) of the grating mark at each wavelength; and (f) a detected-position-estimation circuit connected to the position-correction-detection circuits, the detected-position-estimation circuit being operable to calculate, from a phase-magnitude ($\delta$) of the level difference ($\delta_n$) of the grating mark with respect to each detected wavelength, a final position ($\Delta X$) of the grating mark.

38. The apparatus of claim 37, wherein the phase magnitude ($\delta$) used by the detected-position-estimation circuit is half of the round-trip phase magnitude $\omega$ for a level difference h' of the grating mark.

39. The apparatus of claim 37, wherein the detected-position-correction circuit determines the corrected detected position ($\Delta X_n'$) of the grating mark at each wavelength according to the following:

$$\Delta X_n' = \alpha \cdot \tan(\delta_n - \pi/2) + X_t$$

wherein $\alpha$ is a parameter that is a function of the degree of asymmetry of the grating mark, and $X_t$ is a true position of the grating mark with which $\Delta X_n'$ coincides when $\delta_n$ is $\pi/2$.

40. An apparatus for detecting the position, in a period direction, of a grating mark formed as a repeating pattern of concavities and convexities on a substrate, the pattern having a period P in the period direction, the apparatus comprising:

(a) a transport-light optical system for directing multiple groups of paired coherent transport light beams having multiple wavelengths to be incident on the grating mark so as to form an interference pattern, the interference pattern having an amplitude-distribution period of 2P/N (where N is a natural number) and a period direction equal to the period direction of the grating mark;

(b) a relative-scanning system for causing the interference pattern to move in the period direction across the grating mark;

(c) a light-receiving system situated so as to receive, separately for each of the multiple wavelengths and among reflection and diffraction light generated by the incident light on the grating mark, a first combined light beam comprising a combination of a regular reflection light from the first light beam and Nth-order diffraction light from the second light beam, and a second combined light beam comprising a combination of regular reflection light from the second light beam and Nth-order diffraction light from the first light beam, the light-receiving system being operable to photoelectrically produce respective light-quantity signals from the first and second combined light beams;

(d) a level-difference detection system connected to the light-receiving system, the level-difference detection system being operable to determine level differences on the grating mark for each respective wavelength by dividing the actual grating-mark level difference by half of the respective wavelengths in the incident light beam in a medium proximal to the surface of the grating mark, the grating-mark level difference being determined from changes accompanying the relative scanning of the light-quantity signals of the first and second combined light beams at each respective wavelength obtained from the light-receiving system; and (e) a position-detection system connected to the level-difference detection system, the position-detection system being operable to determine the position of the grating mark based on light-quantity signal changes in the first and second combined light beams accompanying the relative scanning at detection wavelengths closest to relative ¼ wavelengths of the incident light beam at each wavelength proximal to the surface of the grating mark.

41. The apparatus of claim 40, wherein the position-detection system is operable to determine an average value for detected positions obtained respectively based on the phases of the light-quantity signal changes in the first and second combined light beams accompanying the relative scanning.

42. The apparatus of claim 40, wherein the level-difference-detection system is operable to calculate the relative level difference, based on the ratio of the respective widths of the concavities and convexities on the grating mark, and on phase differences and contrast in light-quantity signal changes in the first and second combined light beams accompanying the relative scanning.

43. The apparatus of claim 40, further comprising a light-quantity-ratio detection system for measuring a light-quantity ratio between the zero-order diffraction light and Nth-order diffraction light reflected and diffracted from the grating mark for each respective wavelength of incident light beam, the level-difference detection system being operable to calculate the relative level difference based on a ratio of the respective widths of the concavities and convexities on the grating mark, on phase differences in light-quantity signal changes between the first and second combined light beams accompanying the relative scanning, and on the light-quantity ratio determined by the light-quantity-ratio detection system.

44. The apparatus of claim 40, wherein the relative-scanning system comprises a stage operable to scan the substrate in the period direction of the grating mark.

45. The apparatus of claim 40, wherein the relative-scanning system is operable to vary the frequency of the first light beam slightly relative to the frequency of the second light beam, thereby causing interference patterns formed by the first and second light beams to move across the grating mark at the same velocity in the period direction.

46. An apparatus for detecting the position of a substrate having a surface comprising multiple alignment marks individually placed at multiple (M) locations on the surface, each alignment mark comprising a grating mark comprising a pattern of repeated multiple concavities and convexities having a period (P) in a particular period direction, the apparatus comprising:

(a) a transport-light optical system for directing a pair of coherent light beams to be respectively incident upon each of the alignment marks so as cause each pair of incident light beams to reflect from the respective alignment mark and form an interference pattern in the same period direction as the period direction of the respective alignment mark, the interference pattern having an amplitude-distribution period of 2P/N (where N is a natural number);

(b) a light-receiving system situated so as to receive, among reflection and diffraction light generated by the incident light on the alignment marks, a first combined light beam comprising a combination of a regular reflection light from the first light beam and Nth-order diffraction light from the second light beam, and a second combined light beam comprising a combination of regular reflection light from the second light beam and Nth-order diffraction light from the first light beam, the light-receiving system being operable to photoelectrically produce respective light-quantity signals from the first and second combined light beams;

(c) a relative-scanning system for causing the interference patterns to move in the period direction across the respective alignment marks;

(d) a position-detection system connected to the light-receiving system, the position-detection system being operable to detect the positions of the alignment marks, based on changes accompanying the relative scanning of the light-quantity signals of the first and second combined light beams produced by the light-receiving system;

(e) a level-difference detection system connected to the position-detection system, the level-difference detection system being operable to respectively calculate relative level differences on the various alignment marks, the calculation being based on (i) dividing the actual alignment-mark level differences by half of the respective wavelengths in the incident light beams in a medium proximate to the surface of the alignment marks, and (ii) changes accompanying the relative scanning of the light-quantity signals of the first and second combined light beams obtained at the light-receiving system; and (f) an arithmetical processing system operable to determine the position of the substrate based on the determined positions of the various alignment marks, the processing system assigning a large weight to the detected position of a j'th grating mark (wherein $1 \leq j \leq M$) whenever the relative level difference of the grating mark is substantially at one-fourth of the wavelength of the incident light beam proximal to the surface of the j'th grating mark, and assigning a small weight to the detected position of the j'th grating mark whenever the relative level difference of the grating mark is not substantially at one-fourth of the wavelength, the processing system subjecting the detected positions of the alignment marks to a statistical processing in order to calculate the positions of the alignment marks over the surface of the substrate.

47. The apparatus of claim 46, wherein the position-detecting system is operable to detect average values of the respective detected positions as the positions of the alignment marks, based on respective phases of changes in the light-quantity signals from the first and second combined light beams accompanying the relative scanning.

48. The apparatus of claim 46, wherein the level-difference detection system is operable to calculate the relative level differences on the alignment marks based on the ratio of the respective widths of the concavities and convexities on the grating marks and on phase differences in the light-quantity signals generated from the first and second combined light beams accompanying the relative scanning.

49. The apparatus of claim 46, further comprising a light-quantity-ratio measurement system operable to measure the light-quantity ratios of zero-order diffraction light to the Nth-order diffraction light reflected and diffracted from the grating marks, and wherein the level-difference detection system is operable to calculate the relative level differences based on (i) the ratios of the respective widths of the concavities and convexities on the grating marks, (ii) phase differences in light-quantity signal changes between the first and second combined light beams accompanying the relative scanning, and (iii) the light-quantity ratios obtained by the light-quantity-ratio measurement system.

50. The apparatus of claim 46, wherein the transport-light optical system is operable to place multiple pairs of coherent light beams incident upon the multiple alignment marks so as to form an interference pattern in the same period direction as the period direction of each of the grating marks with an amplitude-distribution period of 2P/N (where N is a natural number), and wherein the light-receiving system, the position-detection system, and the level-difference detection system are executed for each of the said multiple different wavelengths, and wherein the calculation system uses the position detection results and level difference detection results from the grating marks at the respective wavelengths to perform the statistical processing.

51. The apparatus of claim 50, wherein the transport-light optical system directs the multiple pairs of coherent light beams to be incident upon the multiple-location grating marks in time-division sequence for each wavelength.

52. The apparatus of claim 46, further comprising a stage adapted to hold an object on which the alignment marks are formed, the stage being operable to move the object, responsive to a signal from the processing system corresponding to the detected positions of the grating mark, so as to achieve a desired relative placement of the object.

53. An exposure apparatus comprising the apparatus of claim 46 for detecting the position of a substrate having a surface comprising multiple alignment marks individually placed at multiple array-coordinate locations on the surface of the substrate.

54. An apparatus for detecting the position, relative to a reference, of a substrate comprising an array of multiple grating marks $MG_j$ on a surface of the substrate, each grating mark comprising, in a period direction, a pattern of concavities and convexities having a period P, the apparatus comprising:

(a) a transport-light optical system operable to cause multiple pairs of coherent transport light beams in multiple groups and at multiple wavelengths to be incident on the grating marks in a sequential manner whereby the transport light beams reflect from the grating marks and form corresponding interference patterns in the period direction;

(b) a relative scanner operable to cause the interference patterns to move in the period direction across each grating mark;

(c) light detectors placed so as to separately receive from each grating mark a first and a second respective combined light beam generated by the incident transport light beams on the grating mark, the first combined light beam comprising a combination of a regular reflection light from the first transport light beam and Nth-order diffraction light from the second transport light beam, and a second combined light beam comprising a combination of regular reflection light from the second transport light beam and Nth-order diffraction light from the first transport light beam, the light detectors being operable to photoelectrically produce respective light-quantity signals from the first and second combined light beams;

(d) a phase-difference detection circuit connected to each light detector, the phase-difference detection circuit being operable to, with respect to each grating mark: (i) detect phase differences from the respective light-quantity signals relative to a reference signal; (ii) convert the phase differences into corresponding detected positions of the grating mark for each wavelength; (iii) calculate average values of the detected positions for each wavelength to yield a mean detected position value ($\Delta X_n$) for the wavelengths; (iv) determine relative level differences $\delta_n$ for the grating mark based on widths of concavities and convexities of the grating mark; and (v) calculate a position $\Delta FX_n$ of a reference mark in relation to a reference signal;

(e) a detected-position-correction circuit corresponding to and connected to the phase-difference-detection circuit, the detected-position-correction circuit being operable to determine a positional difference of each grating mark relative to the reference mark, add $\Delta X_n$ to the difference, and subtract from the result the position ($\Delta FX_n$) of the reference mark in relation to a reference-mark signal, thereby yielding a value of $X_{jn}'$, a corrected detected position of the grating mark at each wavelength $\lambda_n$;

(f) a substrate stage operable to hold the substrate and controllably move the substrate based on coordinates $X_j$, $Y_j$ for each grating mark $MG_j$ so as to allow sequential position detection of each grating mark on the substrate by the phase-difference detection circuit and the detected-position-detection circuit; and (g) a weighted EGA processing circuit connected to the position-correction-detection circuits, the weighted EGA processing circuit being operable to determine, based on the detected positions $\Delta X_{jn}'$, final detected positions of each grating mark represented as coordinate-conversion system represented by EGA parameter $S_x$, $S_y$, $R_x$, $S_x$, $O_x$, and $O_y$.

55. The apparatus of claim 54, wherein the weighted EGA circuit is operable to assign weights to the detected positions of the grating marks, the weights being inversely proportional to respective detection errors associated with the respective detected positions.

56. A method for determining the position, in a period direction, of a grating mark formed as a repeating pattern of concavities and convexities on a substrate, the pattern having a period P in the period direction, the method comprising the steps:

(a) illuminating the grating mark with a pair of incident coherent light beams in multiple groups with different wavelengths;

(b) scanning the interference patterns and the grating mark relative to the period direction by separately receiving a first combined light beam and a second combined light beam;

(c) calculating relative level differences on the grating mark based on changes in the light-quantity signals for the first and second combined light beams; and (d) determining the position of the grating mark based on the light-quantity signals for the first and second combined light beams and the relative level differences on the grating mark and each wavelength.

57. A method for determining the position, in a period direction, of a grating mark formed as a repeating pattern of concavities and convexities on a substrate, the pattern having a period P in the period direction, the method comprising the steps:

(a) illuminating the grating mark with a pair of incident coherent light beams in multiple groups with different wavelengths to produce interference patterns;

(b) scanning the interference patterns and the grating mark relative to the period direction by separately receiving, for each of the multiple wavelengths and among reflection and diffraction light produced from the grating mark from the incident light beam, a first combined light beam comprising regular reflection light from the first light beam and Nth-order diffraction light from the second light beam, and a second combined light beam comprising regular reflection light from the second light beam and Nth-order diffraction light from the first light beam;

(c) based on changes in the light-quantity signals for the first and second combined light beams at the respective wavelengths occurring during the relative scanning, detecting a preliminary position of the grating mark for the respective wavelengths;

(d) based on changes in the light-quantity signals for the first and second combined light beams at the respective wavelengths occurring during the relative scanning, and on design data for the grating mark, calculating relative level differences on the grating mark for each respective wavelength; and (e) weighting the preliminary grating-mark positions detected for each wavelength greater so as to obtain weighted averages of the position of the grating mark for each wavelength, the weighted-average values representing the final detected position of the grating mark.

* * * * *

UNITED STATES PATENT AND TRADEMARK OFFICE
CERTIFICATE OF CORRECTION

PATENT NO. : 5,801,390

DATED : September 1, 1998

INVENTOR(S) : NAOMASA SHIRAISHI

It is certified that error appears in the above-indentified patent and that said Letters Patent is hereby corrected as shown below:

Column 2, line 55, delete "result" after --above-- and before --can--.

Column 8, line 21, "employ" should be --employs--.

Column 18, line 55, "λ1" should be --$\lambda_1$--.

Column 20, line 37, "lens S" should be --lens 5--.

Column 22, line 38, delete the comma "," after --made-- and before --of--.

Column 24, line 64, expression (5), "$W_n = [1 + \cos[2(\delta_n - \pi/2)]/2$" should be --$W_n = [1 + \cos[2(\delta_n - \pi/2)]]/2$--.

Column 25, line 2, "δn" should be --$\delta_n$--.

Column 25, lines 60 and 67, column 26, lines 2 and 7, "l" should be --$l$--.

Column 26, line 45, "I$^{Bn}$" should be --$I_{8n}$--.

Column 26, lines 56 and 57, each occurrence of "≈" should be --≑--.

UNITED STATES PATENT AND TRADEMARK OFFICE
CERTIFICATE OF CORRECTION

PATENT NO. : 5,801,390

DATED : September 1, 1998

INVENTOR(S) : NAOMASA SHIRAISHI

It is certified that error appears in the above-indentified patent and that said Letters Patent is hereby corrected as shown below:

Column 27, line 11 "φb" should be --$\phi_b$--.

Column 28, line 59, "SAn" should be --$SA_n$--.

Column 30, line 38, "Ims" should be --$I_{ms}$--.

Column 31, line 16, "IAn" should be --$I_{An}$--.

Column 31, line 21, "IBn" should be --$I_{Bn}$--.

Column 32, line 40, "referable" should be --preferable--.

Column 32, line 56, delete the period "." after the comma --,-- and before --since--.

Column 33, line 62, "X$_1$" should be --$\lambda_1$--.

Column 33, line 64, "X$_2$" should be --$\lambda_2$--.

Column 33, line 64, "X$_3$" should be --$\lambda_3$--.

Column 38, line 12, "Lo" should be --$L_0$--.

UNITED STATES PATENT AND TRADEMARK OFFICE
CERTIFICATE OF CORRECTION

PATENT NO. : 5,801,390

DATED : September 1, 1998

INVENTOR(S) : NAOMASA SHIRAISHI

It is certified that error appears in the above-indentified patent and that said Letters Patent is hereby corrected as shown below:

Column 39, line 33, "optical" should be --optically--.

Column 45, lines 34-41, replace Equation (37) with the following:

$$-- \begin{bmatrix} \Sigma W_{jn} \cdot X_j^2 & \Sigma W_{jn} \cdot X_j \cdot Y_j & \Sigma W_{jn} \cdot X_j \\ \Sigma W_{jn} \cdot X_j \cdot Y_j & \Sigma W_{jn} \cdot Y_j^2 & \Sigma W_{jn} \cdot Y_j \\ \Sigma W_{jn} \cdot X_j & \Sigma W_{jn} \cdot Y_j & \Sigma W_{jn} \end{bmatrix} \begin{bmatrix} S_x \\ R_x \\ O_x \end{bmatrix} = \begin{bmatrix} \Sigma W_{jn} \cdot X_j \cdot X'_{jn} \\ \Sigma W_{jn} \cdot Y_j \cdot X'_{jn} \\ \Sigma W_{jn} \cdot X_j \end{bmatrix} --$$

Column 42, line 9, "(9)" should be --(9))--.

Column 45, line 52, replace Equation (38) with the following:

$$-- \Sigma \Delta Y_{kn}^2 = \Sigma \left[ W_{kn} (X'_{kn} - R_y \cdot X_k + S_y \cdot Y_k - O_y)^2 \right] --$$

UNITED STATES PATENT AND TRADEMARK OFFICE
CERTIFICATE OF CORRECTION

PATENT NO. : 5,801,390
DATED : September 1, 1998
INVENTOR(S) : NAOMASA SHIRAISHI It is certified that error appears in the above-indentified patent and that said Letters Patent is hereby corrected as shown below:

In the Claims:

Column 60, line 52, claim 46, insert --to-- after "as" and before "cause".

Signed and Sealed this

Second Day of November, 1999

Attest:

Q. TODD DICKINSON

*Attesting Officer*  *Acting Commissioner of Patents and Trademarks*